(12) United States Patent
Cho et al.

(10) Patent No.: US 10,153,728 B2
(45) Date of Patent: Dec. 11, 2018

(54) SEMICONDUCTOR DEVICE AND METHOD

(71) Applicant: Taiwan Semiconductor Manufacturing Company, Ltd., Hsinchu (TW)

(72) Inventors: Lan-Chou Cho, Hsinchu (TW); Huan-Neng Chen, Taichung (TW); Chewn-Pu Jou, Hsinchu (TW); Feng Wei Kuo, Zhudong Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/653,050

(22) Filed: Jul. 18, 2017

(65) Prior Publication Data

US 2017/0346444 A1 Nov. 30, 2017
US 2018/0241345 A9 Aug. 23, 2018

Related U.S. Application Data

(63) Continuation-in-part of application No. 15/599,694, filed on May 19, 2017, which is a continuation-in-part
(Continued)

(51) Int. Cl.
*H03K 3/36* (2006.01)
*H03K 3/86* (2006.01)
(Continued)

(52) U.S. Cl.
CPC ............. *H03B 5/1243* (2013.01); *H01F 5/04* (2013.01); *H01F 19/04* (2013.01);
(Continued)

(58) Field of Classification Search
CPC .. H03B 5/04; H03B 2200/0074; H03K 3/011; H03K 3/02; H03K 3/353; H03K 3/36;
(Continued)

(56) References Cited

U.S. PATENT DOCUMENTS 1,378,187 A 5/1921 Northrup
4,868,525 A * 9/1989 Dias .................. H03K 3/011
331/111

(Continued)

FOREIGN PATENT DOCUMENTS

| CN | 1950913 A | 4/2007 |
|---|---|---|
| CN | 102132362 A | 7/2011 |
| TW | I406306 B | 8/2013 |

OTHER PUBLICATIONS

Chen, M., "Understanding and Designing Differential Filters for Communications Systems," Analog Devices Technical Article, © 2016, 6 pages.

*Primary Examiner* — Levi Gannon
(74) *Attorney, Agent, or Firm* — Slater Matsil, LLP

(57) ABSTRACT

A circuit includes a first digital controlled oscillator and a second digital controlled oscillator coupled to the first digital controlled oscillator. A skew detector is connected to determine a skew between outputs of the first digital controlled oscillator and the second digital controlled oscillator, and a decoder is utilized to output a control signal, based on the skew, to modify a frequency of the first digital controlled oscillator using a switched capacitor array to reduce or eliminate the skew. A differential pulse injection oscillator circuit and a pulse injection signal generator circuit are also provided.

20 Claims, 37 Drawing Sheets

Related U.S. Application Data of application No. 15/295,298, filed on Oct. 17, 2016, now Pat. No. 9,866,173, which is a continuation of application No. 14/319,787, filed on Jun. 30, 2014, now Pat. No. 9,473,152, which is a continuation-in-part of application No. 14/075,021, filed on Nov. 8, 2013, now Pat. No. 9,191,014.

(60) Provisional application No. 62/518,991, filed on Jun. 13, 2017.

(51) Int. Cl.
| | | |
|---|---|---|
| *H03L 7/24* | (2006.01) | |
| *H03B 5/12* | (2006.01) | |
| *H01F 19/04* | (2006.01) | |
| *H03B 5/08* | (2006.01) | |
| *H01F 27/28* | (2006.01) | |
| *H01F 38/14* | (2006.01) | |
| *H03L 7/00* | (2006.01) | |
| *H01F 5/04* | (2006.01) | |

(52) U.S. Cl.
CPC ....... *H01F 27/2804* (2013.01); *H01F 27/288* (2013.01); *H01F 27/2871* (2013.01); *H01F 38/14* (2013.01); *H03B 5/08* (2013.01); *H03B 5/1212* (2013.01); *H03B 5/1228* (2013.01); *H03B 5/1256* (2013.01); *H03B 5/1296* (2013.01); *H03K 3/36* (2013.01); *H03K 3/86* (2013.01); *H03L 7/00* (2013.01); *H03L 7/24* (2013.01); *H03B 2200/0074* (2013.01); *H03J 2200/10* (2013.01)

(58) Field of Classification Search
CPC .. H03K 3/64; H03K 3/66; H03K 3/70; H03K 3/72; H03K 3/78; H03K 3/86; H03L 1/00; H03L 7/24
See application file for complete search history.

(56) References Cited

U.S. PATENT DOCUMENTS

| | | | |
|---|---|---|---|
| 5,357,217 A | | 10/1994 | Marchesi et al. |
| 5,717,343 A | * | 2/1998 | Kwong ............ H03K 19/00361 326/121 |
| 6,028,488 A | * | 2/2000 | Landman ................. H03K 3/03 327/156 |
| 6,346,837 B1 | * | 2/2002 | Shibayama ........... H03L 7/0814 327/156 |
| 6,639,481 B1 | | 10/2003 | Ravi et al. |
| 6,891,444 B2 | | 5/2005 | Jacobsson et al. |
| 7,151,430 B2 | | 12/2006 | Mattsson |
| 7,173,498 B2 | | 2/2007 | Ramaswamy et al. |
| 7,423,495 B2 | | 9/2008 | Bevilacqua et al. |
| 7,551,038 B2 | | 6/2009 | Jang et al. |
| 7,633,352 B2 | | 12/2009 | El Rai |
| 7,847,650 B2 | | 12/2010 | Yao et al. |
| 8,058,934 B2 | | 11/2011 | Rangarajan et al. |
| 8,138,845 B1 | | 3/2012 | Zhang et al. |
| 8,174,288 B2 | | 5/2012 | Dennard et al. |
| 8,258,907 B2 | | 9/2012 | Hansen |
| 8,305,151 B2 | | 11/2012 | Tanabe |
| 8,476,972 B2 | * | 7/2013 | Wang .................... G04F 10/005 327/112 |
| 8,531,250 B1 | | 9/2013 | Luschas |
| 8,570,107 B2 | | 10/2013 | Guo et al. |
| 8,593,232 B2 | | 11/2013 | Chataigner |
| 8,638,175 B2 | | 1/2014 | Dubey |
| 8,841,983 B2 | | 9/2014 | Newton et al. |
| 9,018,987 B1 | | 4/2015 | Lahiri |
| 9,281,826 B2 | | 3/2016 | Fujiwara et al. |
| 9,401,696 B1 | | 7/2016 | Ferriss et al. |
| 2002/0003452 A1 | | 1/2002 | Mizuno et al. |
| 2002/0040991 A1 | | 4/2002 | Embabi et al. |
| 2003/0001680 A1 | | 1/2003 | Knecht et al. |
| 2004/0227608 A1 | | 11/2004 | Nakatani et al. |
| 2006/0001496 A1 | | 1/2006 | Abrosimov et al. |
| 2007/0247237 A1 | | 10/2007 | Mohammadi |
| 2007/0268007 A1 | | 11/2007 | El Rai |
| 2008/0252387 A1 | | 10/2008 | Higashi |
| 2008/0309423 A1 | | 12/2008 | Itoh et al. |
| 2009/0261911 A1 | | 10/2009 | Watanabe et al. |
| 2009/0289727 A1 | | 11/2009 | El Rai |
| 2009/0302958 A1 | | 12/2009 | Sakurai et al. |
| 2010/0085123 A1 | | 4/2010 | Frans et al. |
| 2010/0176889 A1 | | 7/2010 | Nix et al. |
| 2010/0225407 A1 | | 9/2010 | Goyal et al. |
| 2010/0253382 A1 | * | 10/2010 | Wang ................. G01R 31/2884 324/762.09 |
| 2010/0295625 A1 | | 11/2010 | Tanabe |
| 2011/0050354 A1 | | 3/2011 | Hirashiki et al. |
| 2011/0076979 A1 | | 3/2011 | Wu et al. |
| 2011/0102093 A1 | | 5/2011 | El Rai et al. |
| 2011/0148535 A1 | | 6/2011 | Lee |
| 2011/0148536 A1 | | 6/2011 | Italia et al. |
| 2012/0039366 A1 | | 2/2012 | Wood et al. |
| 2012/0262238 A1 | | 10/2012 | Dong et al. |
| 2012/0286879 A1 | | 11/2012 | Nylen |
| 2013/0082790 A1 | | 4/2013 | Trivedi et al. |
| 2013/0194047 A1 | | 8/2013 | Tomita et al. |
| 2014/0218120 A1 | | 8/2014 | Hekmat et al. |
| 2015/0340872 A1 | | 11/2015 | Franzon et al. |
| 2016/0141092 A1 | | 5/2016 | Ellinger et al. |

* cited by examiner

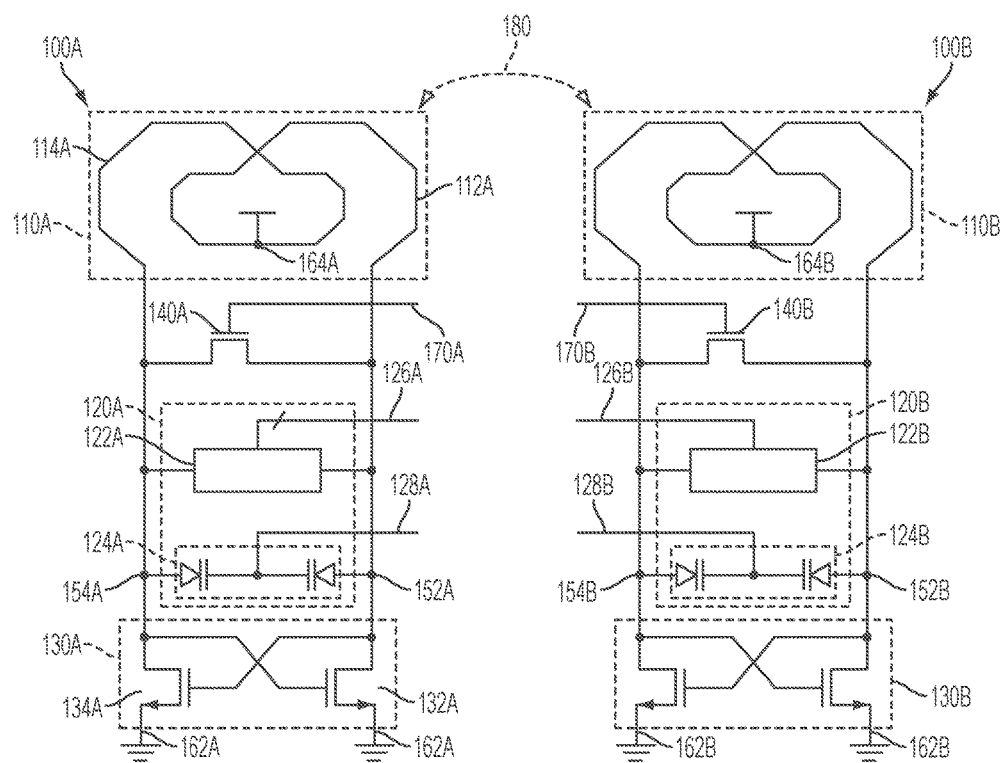
FIG. 1
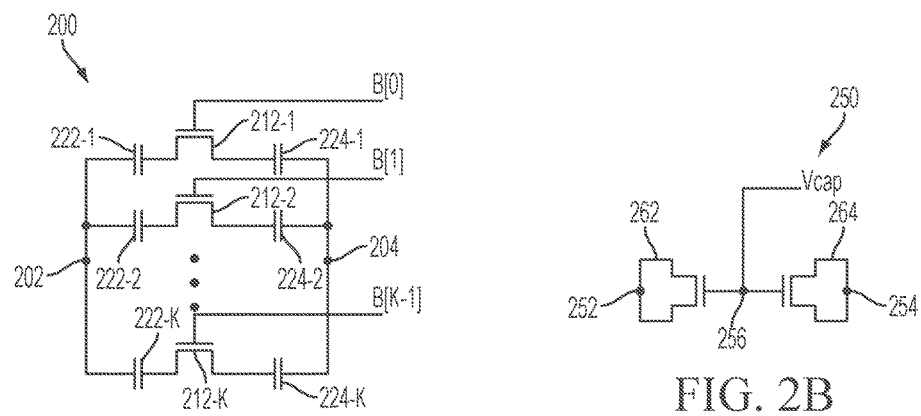
FIG. 2A
FIG. 2B

SEMICONDUCTOR DEVICE AND METHOD

PRIORITY CLAIM AND CROSS-REFERENCE

This application is a continuation-in-part of U.S. patent application Ser. No. 15/599,694, entitled "Semiconductor Device and Method," filed on May 19, 2017, which application is a continuation-in-part of U.S. application Ser. No. 15/295,298, entitled "Coupling Structure for Inductive Device, filed on Oct. 17, 2016, which application is a continuation of U.S. patent application Ser. No. 14/319,787, entitled "Coupling Structure for Inductive Device," filed on Jun. 30, 2014, now U.S. Pat. No. 9,473,152 issued on Oct. 18, 2016, which application is a continuation-in-part of U.S. patent application Ser. No. 14/075,021, entitled "Method and Apparatus of Synchronizing Oscillators," filed on Nov. 8, 2013, now U.S. Pat. No. 9,191,014 issued on Nov. 17, 2015. This application also claims priority to U.S. Provisional Application No. 62/518,991, filed Jun. 13, 2017. Each of these applications are incorporated herein by reference.

BACKGROUND

In an integrated circuit, a clock tree is generally used for distributing a common clock signal to various components in order to synchronize the operation thereof. Differences in the arrival time of the clock signals at two or more clocked components of the integrated circuit can result in errors in the operation of the integrated circuit. In some applications, the clock tree for the distribution of the common clock signal includes structures such as H-tree meshes or balanced buffer trees. In many cases, mismatch of the arrival of the distributed clock signals is minimized at the cost of sufficient driving current for distributing the common clock signal along the clock tree. With the increase of the frequency of the clock signal, power consumption for driving the clock tree increases. Also, clock buffers at various stages of the clock trees usually draw huge currents from a power supply grid, and thus affect the performance of nearby components by causing voltage drops of the supply voltage. In some applications, clock trees use 20% to 40% of total power consumption of the integrated circuits.

BRIEF DESCRIPTION OF THE DRAWINGS

One or more embodiments are illustrated by way of example, and not by limitation, in the figures of the accompanying drawings, wherein elements having the same reference numeral designations represent like elements throughout.

FIG. 1 is a schematic diagram of two oscillators in accordance with one or more embodiments.

FIG. 2A is a schematic diagram of a capacitor array usable in one or both of the oscillators in FIG. 1 in accordance with one or more embodiments.

FIG. 2B is a schematic diagram of a varactor usable in one or both of the oscillators in FIG. 1 in accordance with one or more embodiments.

DETAILED DESCRIPTION

Figure 3:
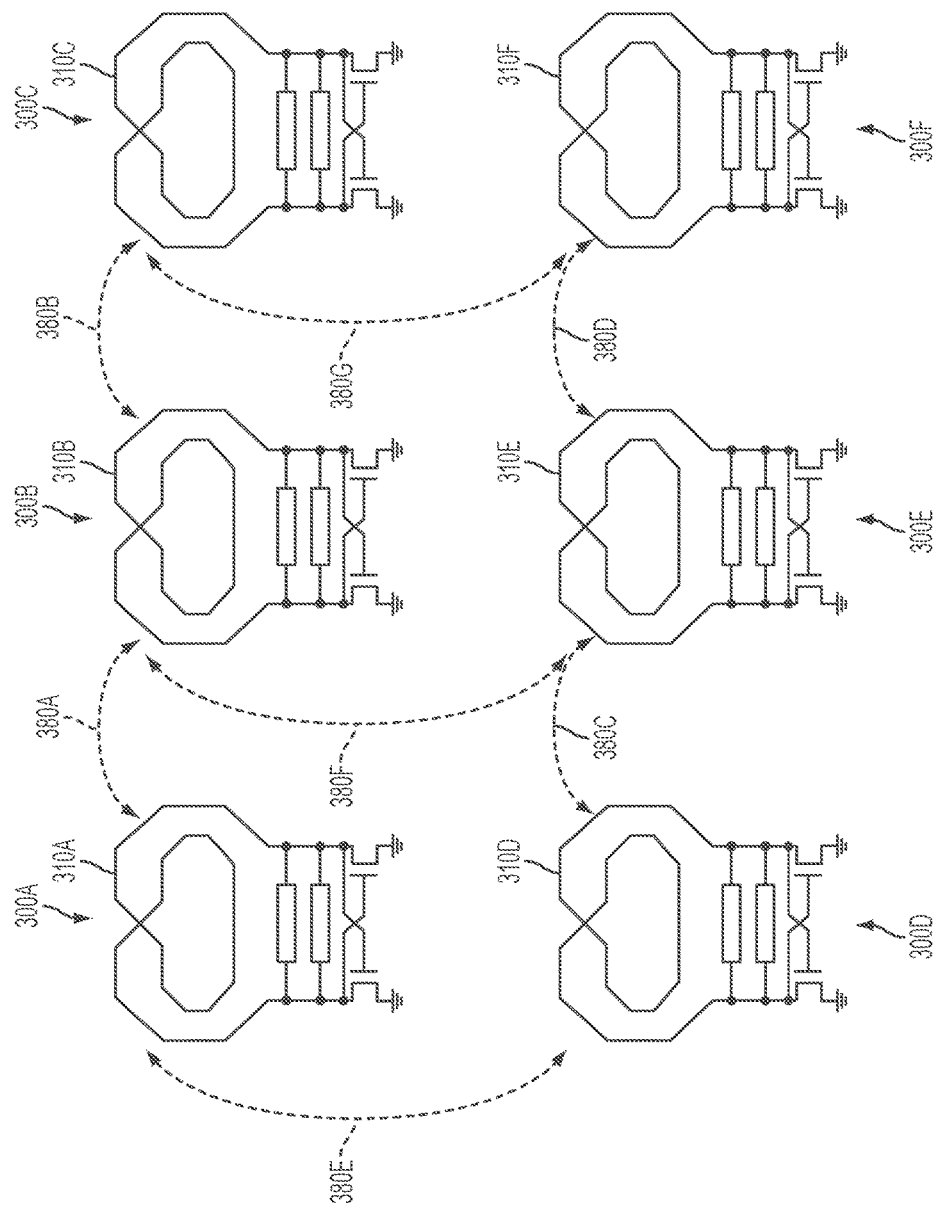
FIG. 3 is a schematic diagram of six oscillators in accordance with one or more embodiments.

It is understood that the following disclosure provides one or more different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

In some embodiments, two or more oscillators configured to generated output oscillating signals having a predetermined frequency, instead of using a clock tree, is utilized to distribute a clock signals to various clocked components in an integrated circuit. Furthermore, one or more synchronization mechanisms are implemented to minimize frequency or phase differences among the oscillating signals generated by the two or more oscillators. In some embodiments, the one or more synchronization mechanisms include magnetic coupling, master-slave fine-tuning, and pulse injection.

FIG. 1 is a schematic diagram of two oscillators 100A and 100B in accordance with one or more embodiments. In some embodiments, oscillators 100A and 100B are configured to generate oscillating signals having a predetermined frequency. In some embodiments, frequencies of oscillating signals from oscillators 100A and 100B are approximately the same but not exactly equal to the predetermined frequency. Also, in some embodiments, phases of oscillating signals from oscillators 100A and 100B are not exactly synchronized. In some embodiments, synchronizing oscillators 100A and 100B refers to minimizing the frequency or phase differences between the oscillating signals from oscillators 100A and 100B. Although only two oscillators 100A and 100B are illustrated in conjunction with FIG. 1, the synchronization mechanisms illustrated in this disclosure are applicable to two or more similarly configured oscillators of a same integrated circuit.

Oscillator 100A includes an inductive device 110A, a capacitive device 120A, an active feedback device 130A, a switch device 140A, an output node 152A, and a complementary output node 154A. Inductive device 110A, capacitive device 120A, active feedback device 130A, and switch device 140A are coupled between output node 152A and complementary output node 154A.

Active feedback device 130A includes two N-type transistors 132A and 134A. Source terminals of transistors 132A and 134A are coupled with ground reference node 162A. A drain terminal of transistor 132A is coupled with node 152A and a gate terminal of transistor 134A, and a drain terminal of transistor 134A is coupled with node 154A and a gate terminal of transistor 132A. Active feedback device 130A is configured to output a first output oscillating signal at node 152A and a first complementary output oscillating signal at node 154A. The first output oscillating signal and the first complementary output oscillating signal have the predetermined frequency determined according to electrical characteristics of inductive device 110A and electrical characteristics of the capacitive device 120A. In some embodiments, if inductive device 110A has a inductance of $L_{TOTAL}$ and capacitive device 120A has a capacitance of $C_{TOTAL}$, the predetermined frequency $F_{OSC}$ (in Hz) is determinable according to the following equation:

$$F_{OSC} = \frac{1}{2\pi\sqrt{L_{TOTAL}C_{TOTAL}}}$$

In some applications, oscillators having configurations similar to oscillator 100A are also known as "LC tank oscillators." In some embodiments, transistors 132A and 134A are P-type transistors. In some embodiments, other types of active feedback devices are also usable as active feedback device 130A.

Inductive device 110A includes inductor 112A and inductor 114A integratedly formed as a conductive coil. Inductor 112A is coupled between node 152A and a supply reference node 164A, and inductor 114A is coupled between node 154A and supply reference node 164A.

Capacitive device 120A includes a coarse-tuning capacitor 122A and a fine-tuning capacitor 124A. In some embodiments, capacitance of coarse-tuning capacitor 122A is set according to a set of digital signals from bus 126A. In some embodiments, a coarse-tuning capacitor 122A is replaced by a set of hard-wired capacitors, and thus capacitance of coarse-tuning capacitor 122A is fixed and bus 126A is thus omitted. In some embodiments, capacitance of fine-tuning capacitor 124A is set according to an analog signal from path 128A. In some embodiments, a resonant frequency of oscillator 100A is adjustable by controlling coarse-tuning capacitor 122A or fine-tuning capacitor 124A.

Switch device 140A is configured to set signals at nodes 152A and 154A at corresponding predetermined voltage levels when switch device 140A is turned on. For example, when switch device 140A is turned on, node 152A and 154A are electrically coupled together. Under this circumstance, transistors 132A and 134A and inductors 112A and 114A function as a voltage divider, and signals at node 152A and 154A are set at a voltage level determinable according to impedance of transistors 132A and 134A and inductors 112A and 114A. In some embodiments, when switch device 140A is turned on, signals at node 152A and 154A are set at about the middle of voltage levels of the supply reference node 164A and ground reference node 162A.

Switches device 140A is controlled by a signal on path 170A. In some embodiments, the control signal on path 170A is a pulse signal used to force the crossing-over of oscillating signals at node 152A and 154A. Therefore, in the present application, switch device 140A is also referred to as a reset device or a pulse-injection device. In some embodiments, switch device 140A is a transistor. In some embodiments, switch device 140A is a P-type transistor, an N-type transistor, or a transmission gate. In some embodiments, switch device 140A is omitted.

Oscillator 100B includes an inductive device 110B, a capacitive device 120B, an active feedback device 130B, a switch device 140B, an output node 152B, and a complementary output node 154B. Oscillator 100B and Oscillator 100A have substantially the same configuration. Components of oscillator 100B similar to those of oscillator 100A are given similar reference numbers, except the corresponding suffixes are changed from 'A' to 'B'. Features and functions of oscillator 100B are substantially similar to those advanced above with regard to oscillator 100A, and detailed description regarding oscillator 100B is thus not repeated.

In some embodiments, oscillator 100A and oscillator 100B are on a same substrate, different substrates on a same package substrate, different substrates of a stack of substrates, or different substrates of a stack of dies. In some embodiments, a power distribution network is implemented to cause supply reference nodes 164A and 164B to have substantially a same supply voltage level, and to cause ground reference nodes 162A and 162B to have substantially a same ground reference level. In some embodiments, digital signals on buses 126A and 126B have the same logic values.

In some embodiments, signals on path 170A and path 170B are provided by a signal distribution network based on a common signal. In some embodiments, signals on path 170A and path 170B are synchronized signals. In some embodiments, signals on path 170A and path 170B are pulse signals. In some embodiments, the predetermined frequency of output oscillating signals of oscillators 100A and 100B is an integer multiple of a frequency of signals on path 170A and path 170B.

Furthermore, inductive device 110A of oscillator 100A and inductive device 110B of oscillator 100B are magnetically coupled (as depicted by dotted arrow 180). Magnetic coupling between inductive device 110A and inductive device 110B refers to that magnetic flux generated by operating inductive device 110A affects operation of inductive device 110B, and vice versa. Similar to the location where oscillators 100A and 100B are disposed, in some embodiments, inductive device 110A and inductive device 110B are on a same substrate, different substrates on a same package substrate, different substrates of a stack of substrates, or different substrates of a stack of dies. Inductive device 110A and inductive device 110B are configured to attenuate out-of-phase components and enhance in-phase component of oscillating signals at node 152A of oscillator 100A and node 152B of oscillator 100B. As a result, after oscillator 100A and oscillator 100B are enabled, output oscillating signals at nodes 152A and 152B are eventually stabilized to be in-phase oscillating signals. In other words, inductive device 110A and inductive device 110B are configured to synchronize oscillating signals generated by oscillator 100A and oscillator 100B.

In some embodiments, inductive device 110A of oscillator 100A and inductive device 110B of oscillator 100B have a distance equal to or less than a predetermined distance in order to cause mutual-inductance sufficient to synchronize oscillator 100A and oscillator 100B within a predetermined period of time. In some embodiments, the predetermined distance is one half of a wavelength of an electromagnetic wave having the predetermined frequency of oscillating signals. In some embodiments, the predetermined frequency of output oscillating signals ranges from 100 MHz to 20 GHz.

FIG. 2A is a schematic diagram of a capacitor array 200 usable as coarse-tuning capacitor 122A or coarse-tuning capacitor 122B in accordance with one or more embodiments. Capacitor array 200 includes a first node 202, a second node 204, K transistors 212-1 to 212-K, and 2K capacitors 222-1 to 222-K and 224-1 to 224-K, where K is a positive integer. First node 202 and second node 204 are usable to be connected with the corresponding node 152A or node 154A, or to be connected with the corresponding node 152B or node 154B. Capacitors 222-1 to 222-K are coupled to first node 202, capacitors 224-1 to 224-K are coupled to second node 204, and transistors 212-1 to 212-K are coupled between corresponding pairs of capacitors 222-1 to 222-K and 224-1 to 224-K. Transistors 212-1 to 212-K function as switches and controlled by control signals B[0], B[1], to B[K-1].

In some embodiments, transistors 212-1 to 212-K are P-type transistors or N-type transistors. In some embodiments, transistors 212-1 to 212-K are replaced by transmission gates or other types of switches. In some embodiments, capacitors 222-1 to 222-K and 224-1 to 224-K are metal-oxide-metal capacitors or metal-insulator-metal capacitors.

In some embodiments, total capacitance of each path, including one of transistors 212-1 to 212-K, a corresponding capacitor of capacitors 222-1 to 222-K, and a corresponding capacitor of capacitors 224-1 to 224-K, has a same value. Under these circumstances, control signals B[0:K-1] are coded in a unary coding format. In some embodiments, total capacitance of each path as defined above corresponds to one of $2^0, 2^1, \ldots 2^{K-1}$ times of a predetermined unit capacitance value. Under these alternative circumstances, control signals B[0:K-1] are coded in a binary coding format.

FIG. 2B is a schematic diagram of a varactor 250 usable as fine-tuning capacitor 124A or fine-tuning capacitor 124B in FIG. 1 in accordance with one or more embodiments. Varactor 250 includes a first node 252, a second node 254, a control node 256, and transistors 262 and 264. First node 252 and second node 254 are usable to be coupled with a corresponding node 152A or node 154A, or to be coupled with a corresponding node 152B or node 154B. Transistor 262 has a drain terminal and a source terminal coupled together with first node 252. Transistor 262 has a gate terminal coupled to the control node 256. Transistor 264 has a drain terminal and a source terminal coupled together with second node 254. Transistor 264 has a gate terminal coupled to the control node 256. Control node 256 is configured to receive an analog control signal $V_{CAP}$, such as a control signal on path 128A or 128B. A total capacitance between nodes 252 and 254 is adjustable responsive to a voltage level of control signal $V_{CAP}$. In some embodiments, transistors 262 and 264 are P-type transistors or N-type transistors.

In FIG. 1, only two oscillators 100A and 100B are depicted. However, in some embodiments, there are more than two oscillators for generating clocks in an integrated circuit. Also, the inductive device 110A or 110B of an oscillator 100A or 100B is capable of magnetically coupled with more than two inductive devices of two or more oscillators.

For example, FIG. 3 is a schematic diagram of six oscillators 300A to 300F in accordance with one or more embodiments. Oscillators 300A to 300F have a configuration similar to oscillator 100A described above. Among other things, oscillators 300A to 300F have corresponding inductive devices 310A to 310F. Other details of oscillators 300A to 300F are omitted.

As depicted in FIG. 3, inductive devices 310A and 310B are magnetically coupled (dotted arrow 380A); inductive devices 310B and 310C are magnetically coupled (dotted arrow 380B); inductive devices 310D and 310E are magnetically coupled (dotted arrow 380C); inductive devices 310E and 310F are magnetically coupled (dotted arrow 380D); inductive devices 310A and 310D are magnetically coupled (dotted arrow 380E); inductive devices 310B and 310E are magnetically coupled (dotted arrow 380F); and inductive devices 310C and 310F are magnetically coupled (dotted arrow 380G). In this embodiment, mutual-inductive coupling 380A to 380G are configured to cause oscillators 300A to 300F to generate oscillating signals having approximately a same predetermined frequency and approximately the same phase.

In some embodiments, inductive devices 310A to 310F are formed on a same substrate, different substrates on a same package substrate, different substrates of a stack of substrates, or different substrates of a stack of dies. In some embodiments, distances between two of inductive devices 310A to 310F that corresponds to one of magnetic coupling 380A to 380G is equal to or less than one half of a wavelength of an electromagnetic wave having the predetermined frequency. In some embodiments, the predetermined frequency of output oscillating signals ranges from 100 MHz to 20 GHz.

Figure 4:
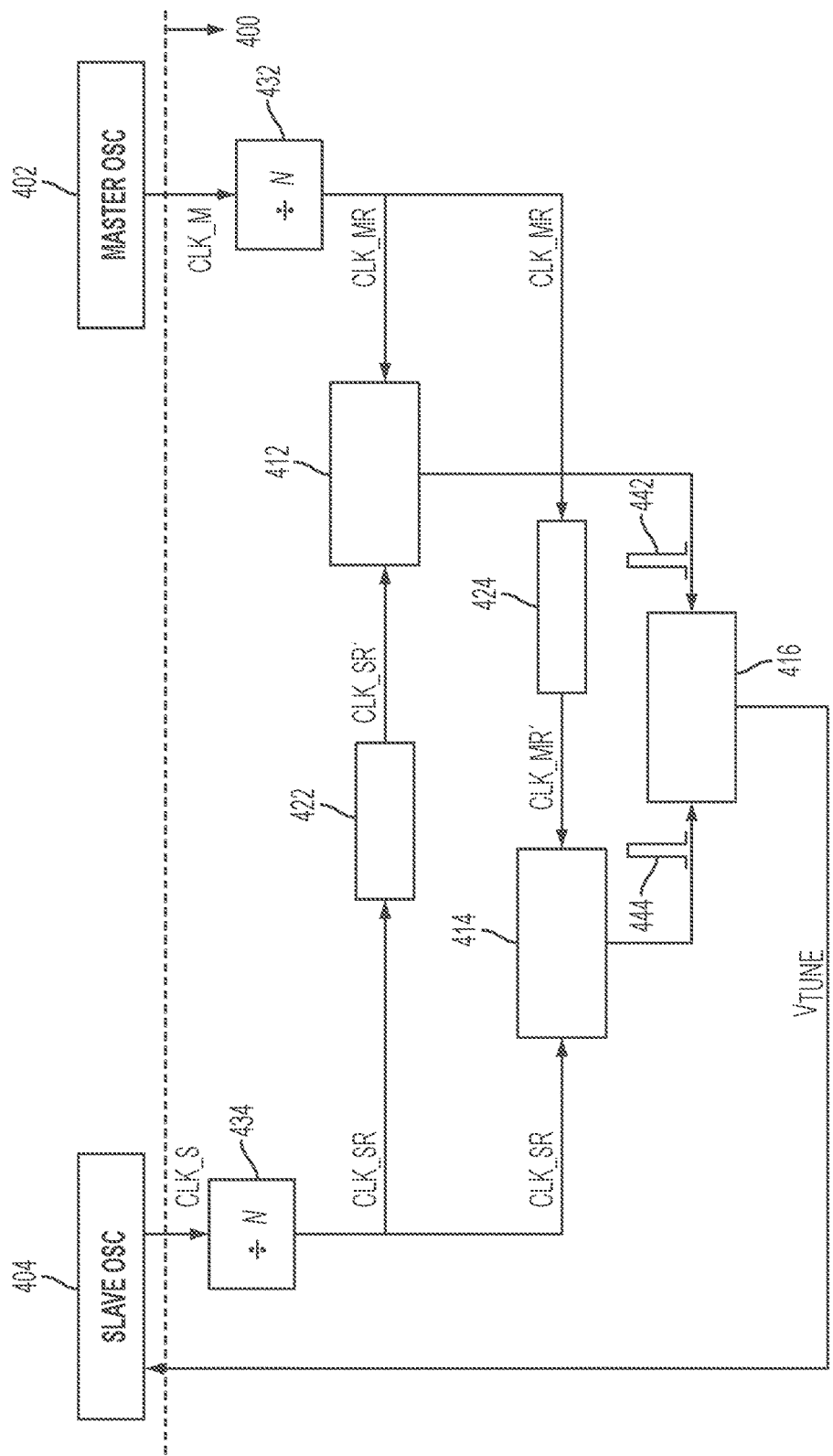
FIG. 4 is a functional block diagram of a set of master-slave fine-tuning unit in accordance with one or more embodiments.

FIG. 4 is a functional block diagram of a set of master-slave fine-tuning unit 400 in accordance with one or more embodiments. The set of master-slave fine-tuning unit 400 is coupled to a mater oscillator 402 and a slave oscillator 404 and is capable of controlling a resonant frequency of slave oscillator 404 based on comparing output oscillating signals of master oscillator 402 and the slave oscillator 404. In some embodiments, master oscillator 402 corresponds to oscillator 100B in FIG. 1, slave oscillator 404 corresponds to oscillator 100A, and resonant frequency of slave oscillator 404 is adjustable by controlling fine-tuning capacitor 124A.

The set of master-slave fine-tuning unit 400 includes a first phase comparator 412, a second phase comparator 414, a control unit 416, a first conductive path 422, a second conductive path 424, a first frequency divider 432, and a second frequency divider 434.

First frequency divider 432 is disposed adjacent to and electrically coupled to master oscillator 402. First frequency divider 432 is configured to receive an output oscillating signal CLK_M from master oscillator 402 and to generate a reference signal CLK_MR by frequency-dividing the output oscillating signal CLK_M by a predetermined ratio N. In some embodiments, N is a positive integer. In some embodiments, N ranges from 4 to 16. Second frequency divider 434 is disposed adjacent to and electrically coupled to slave oscillator 402. Second frequency divider 434 is configured to receive an output oscillating signal CLK_S from slave oscillator 404 and to generate a reference signal CLK_SR by frequency-dividing the output oscillating signal CLK_S by the predetermined ratio N.

In some embodiments, first frequency divider 432 and second frequency divider 434 are omitted, and oscillating signals CLK_M and CLK_S are used as reference signal CLK_MR and reference signal CLK_SR.

First phase comparator 412 is disposed adjacent to the master oscillator 402. Second phase comparator 414 is disposed adjacent to the slave oscillator 404. First conductive path 422 and second conductive path 424 are disposed between master oscillator 402 and slave oscillator 404. First phase comparator 412 is configured to generate a first phase error signal 442 according to reference signal CLK_MR from master oscillator 402 and a delayed version CLK_SR' of reference signal CLK_SR from the slave oscillator 404 transmitted through first conductive path 422. Second phase comparator 422 is configured to generate a second phase error signal 444 according to reference signal CLK_SR from slave oscillator 404 and a delayed version CLK_MR' of reference signal CLK_MR from the master oscillator 402 transmitted through the second conductive path 424.

Control unit 416 is configured to generate a tuning signal $V_{TUNE}$ to slave oscillator 404 according to first phase error signal 442 and second phase error signal 444. In some embodiments, tuning signal $V_{TUNE}$ is usable as analog control signal $V_{CAP}$ of FIG. 2B or as analog control signal for adjusting fine-tuning capacitor 124A carried by path 128A of FIG. 1.

Figure 5:
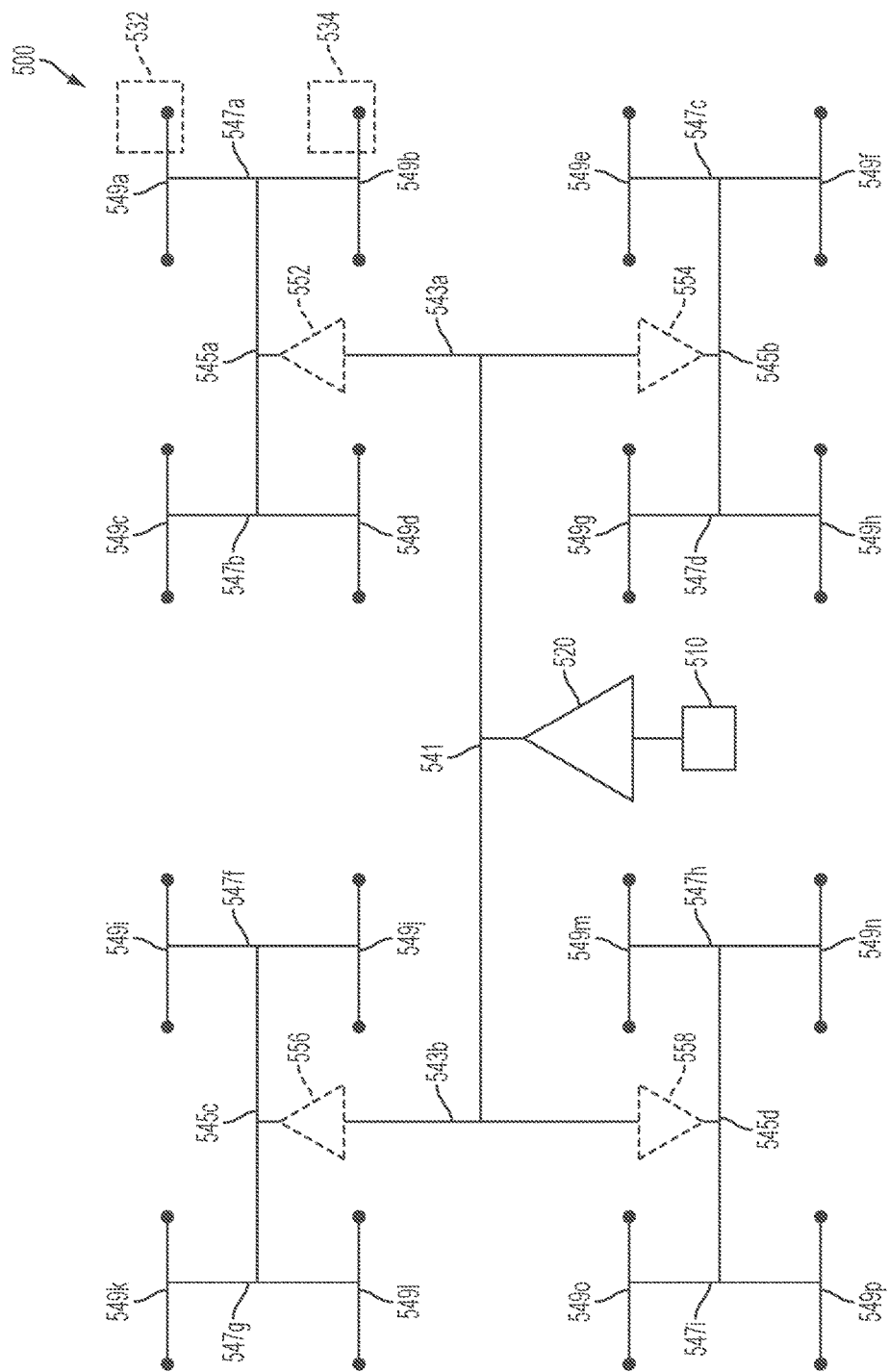
FIG. 5 is a schematic diagram of a pulse distribution network in accordance with one or more embodiments.

FIG. 5 is a schematic diagram of a pulse distribution network 500 in accordance with one or more embodiments. In some embodiments, pulse distribution network 500 is usable to provide a control signal to switch device 140A of oscillator 100A through path 170A and a control signal to switch device 140B of oscillator 100B through path 170B.

Pulse distribution network 500 includes a pulse generator 510, a driver 520, and one or more conductive paths arranged to have an H-tree configuration. Two or more oscillators 532 and 534 are coupled to two of ends of the H-tree. In some embodiments, oscillator 532 corresponds to oscillator 100A in FIG. 1, and oscillator 532 corresponds to oscillator 100B.

Pulse generator 510 is configured to generate a pulse signal usable as control signals for switch devices or reset devices of corresponding oscillators. In some embodiments, the pulse signal has a pulse frequency, and the predetermined frequency of output oscillating signals of oscillators 532 and 534 is an integer multiple of the pulse frequency. The pulse signal is transmitted to oscillators 532 and 534 in order to set output oscillating signals at predetermined voltage levels by corresponding switch devices of the oscillators responsive to the pulse signal. Thus, a timing of rising edges or falling edges of output oscillating signals of oscillators 532 and 534 are synchronized according to the pulse signal.

The H-tree depicted in FIG. 5 is a five-level H-tree including one ($2^0$) first level conductive path 541, two ($2^1$) second level conductive paths 543a and 543b coupled to corresponding ends of path 541, four ($2^3$) third level conductive paths 545a, 545b, 545c, and 545d coupled to corresponding ends of paths 543a or 543b, eight ($2^3$) fourth level conductive paths 547a to 547i coupled to corresponding ends of paths 545a to 545d, and 16 ($2^4$) fifth level conductive paths 549a to 549p coupled to corresponding ends of paths 547a to 547i. Fifth level conductive paths 549a to 549p have ends connected to corresponding switch devices of various oscillators. For example, one end of path 549a is coupled to oscillator 532, and one end of path 549b is coupled to oscillator 534. In some embodiments, each ends of fifth level conductive paths 539a to 539p has a same routing distance. Therefore, conductive paths from driver 520 to corresponding ends of fifth level conductive paths 549a to 549p are configured to impose substantially the same delay to the pulse signal during the transmission and distribution thereof.

Driver 520 is configured to provide sufficient current driving capability to transmit the pulse signal generated by pulse generator 510 to various ends of the fifth level conductive paths 549a to 549p. In some embodiments, additional drivers 552, 554, 556, and 558 are at ends of second level conductive paths 543a and 543b. In some embodiments, additional drivers 552, 554, 556, and 558 are omitted. In some embodiments, additional drivers 552, 554, 556, and 558 are disposed at corresponding ends of a different level of conductive paths in the H-tree.

Therefore, at least three different ways to synchronize output oscillating signals of two or more oscillators, such as oscillators 100A and 100B in FIG. 1, are described above: magnetic coupling (illustrated with reference to FIGS. 1 and 3); master-slave fine-tuning (illustrated with reference to FIG. 4); and pulse injection (illustrated with reference to FIG. 5). In some embodiments, two or more oscillators 100A and 100B are synchronized using magnetic coupling and master-slave fine-tuning mechanisms. In some embodiments, two or more oscillators 100A and 100B are synchronized using magnetic coupling and pulse injection mechanisms. In some embodiments, two or more oscillators 100A and 100B are synchronized using magnetic coupling, master-slave fine-tuning, and pulse injection mechanisms.

Figure 6:
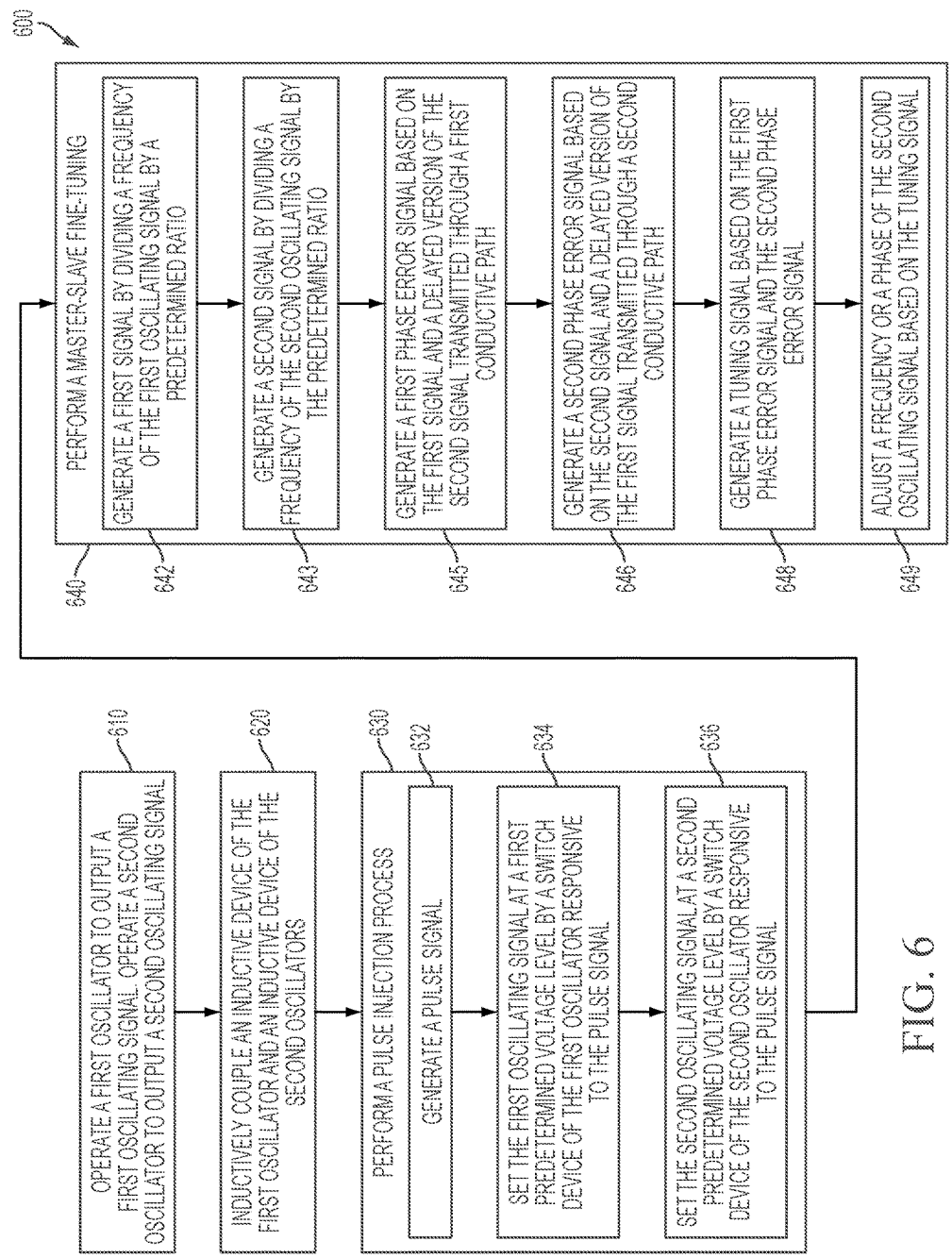
FIG. 6 is a flowchart of a method of synchronizing oscillators in accordance with one or more embodiments.

FIG. 6 is a flowchart of a method 600 of synchronizing oscillators, such as oscillators 100A and 100B depicted in FIG. 1, in accordance with one or more embodiments. It is understood that additional operations may be performed before, during, and/or after the method 600 depicted in FIG. 6, and that some other processes may only be briefly described herein.

In operation 610, oscillators are operated to output oscillating signals. For example, in some embodiments, oscillator 100A is operated to output a first oscillating signal at node 152A, and oscillator 100B is operated to output a second oscillating signal at node 152B.

In operation 620, inductive devices of oscillators are magnetically coupled. For example, in some embodiments, inductive device 110A of oscillator 100A and inductive device 110B of oscillator 100B are magnetically coupled in order to reduce a frequency difference or phase difference between output oscillating signals of oscillator 100A and oscillator 100B.

In operation 630, a pulse injection process is performed on various oscillators. For example, in some embodiments, a pulse injection process is performed on oscillator 100A and oscillator 100B. In some embodiments, operation 630 includes generating a pulse signal (operation 632), transmitting the pulse signal to switch device 140A of oscillator 100A through a first conductive path, and transmitting the pulse signal to switch device 140B of oscillator 100B through a second conductive path. In some embodiments, the first conductive path and the second conductive path are configured to impose substantially a same delay to the pulse signal.

In some embodiments, operation 630 further includes setting the first oscillating signal of oscillator 100A at a first predetermined voltage level by switch device 140A responsive to the pulse signal (operation 634), and setting the second oscillating signal of oscillator 100B at a first predetermined voltage level by switch device 140B responsive to the pulse signal (operation 636).

The method proceeds to operation 640, where a master-slave fine-tuning process is performed on two or more oscillators. For example, in some embodiments, a master-slave fine-tuning process is performed on oscillator 100A and oscillator 100B. As depicted in FIGS. 6 and 4, operation 640 includes generating reference signal CLK_MR by frequency-dividing oscillating signal from oscillator 402 or 100B by a predetermined ratio (operation 642); and generating reference signal CLK_SR by frequency-dividing oscillating signal from oscillator 404 or 100A by the predetermined ratio (operation 643).

Furthermore, in operation 645, a first phase error signal 442 is generated based on reference signal CLK_MR and delayed version CLK_SR' of reference signal CLK_SR transmitted through conductive path 422. In operation 646, a second phase error signal 444 is generated based on reference signal CLK_SR and a delayed version CLK_MR' of reference signal CLK_MR transmitted through conductive path 424. In operation 648, a tuning signal $V_{TUNE}$ is generated based on the first phase error signal 422 and the second phase error signal 424.

As depicted in FIGS. 6 and 1, in operation 649, a frequency or a phase of oscillating signal generated by oscillator 404 or 100A is adjusted based on the tuning signal $V_{TUNE}$.

In some embodiments when synchronizing oscillators 100A and 100B of FIG. 1, either or both of operation 630 or operation 640 is/are omitted.

Moreover, the pulse distribution network 500 in FIG. 5 and pulse-injection process (operation 630) are applicable to other type of oscillators and not limited to LC tank oscillators. In some embodiments, pulse-injection process or pulse-injection mechanism described above is also applicable to a particular type of oscillator known as ring oscillators.

Figure 7:
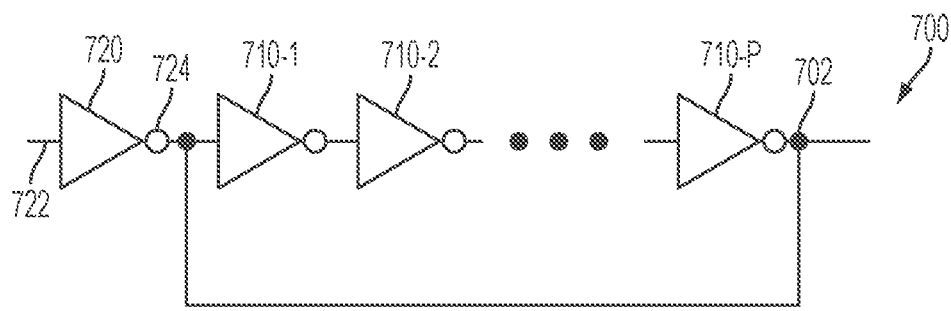
FIG. 7 is a schematic diagram of a ring oscillator in accordance with one or more embodiments.

For example, FIG. 7 is a schematic diagram of a ring oscillator 700 in accordance with one or more embodiments. Oscillator 700 has an output node 702 and P inverters 710-1 to 710-P, where P is an odd integer. Inverters 710-1 to 710-P are connected in series. Furthermore, output terminal of the last stage inverter 710-P is coupled with output node 702, and input terminal of the first stage inverter 710-1 is coupled with output terminal of inverter 710-P. Inverters 710-1 to 710-P are configured to be an active feedback device and to generate an oscillating signal at output node 702. Another inverter 720 has an input terminal configured to receive a pulse signal and an output terminal coupled with first node 702. Inverter 720 functions as a reset device configured to set output oscillating signal at node 704 at a predetermined voltage level responsive to the pulse signal. In some embodiments, two or more ring oscillators similar to oscillator 700 (e.g., oscillators 532 and 534 in FIG. 5) are connected to various ends of a pulse distribution network similar to pulse distribution network 500 in order to synchronizing output oscillating signals of the two or more ring oscillators.

Figure 8:
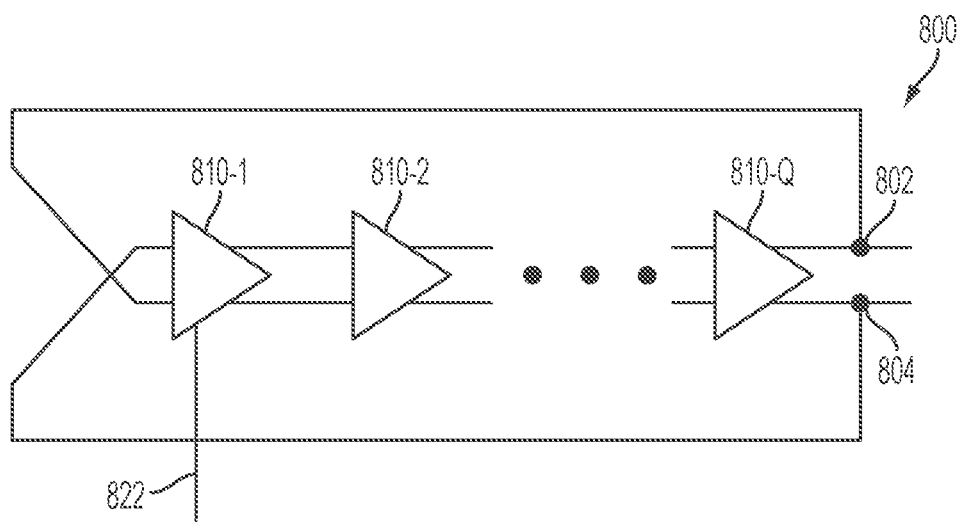
FIG. 8 is a schematic diagram of another ring oscillator in accordance with one or more embodiments.

FIG. 8 is a schematic diagram of another ring oscillator 800 in accordance with one or more embodiments. Oscillator 800 has a pair of output nodes 802 and 804 and Q differential amplifiers 810-1 to 810-Q, where Q is an odd integer. Amplifiers 810-1 to 810-Q are connected in series. Output terminals of the last stage amplifier 810-Q are coupled with output nodes 802 and 804, and input terminals of the first stage amplifier 810-1 are coupled with output terminals of amplifier 810-Q. Amplifiers 810-1 to 810-Q are configured as an active feedback device and to generate a pair of differential oscillating signals at output nodes 802 and 804. One of the amplifiers, such as amplifier 810-1, further includes a switch device or a reset device configured to set output terminals of that amplifier 810-1 at a predetermined voltage level responsive to a pulse signal. In some embodiments, any differential amplifier among amplifiers 810-1 to 810-Q is usable for pulse signal injection. In some embodiments, two or more ring oscillators similar to oscillator 800 (e.g., oscillators 532 and 534 in FIG. 5) are connected to various ends of a pulse distribution network similar to pulse distribution network 500 in order to synchronizing output oscillating signals of the two or more ring oscillators.

Figure 9:
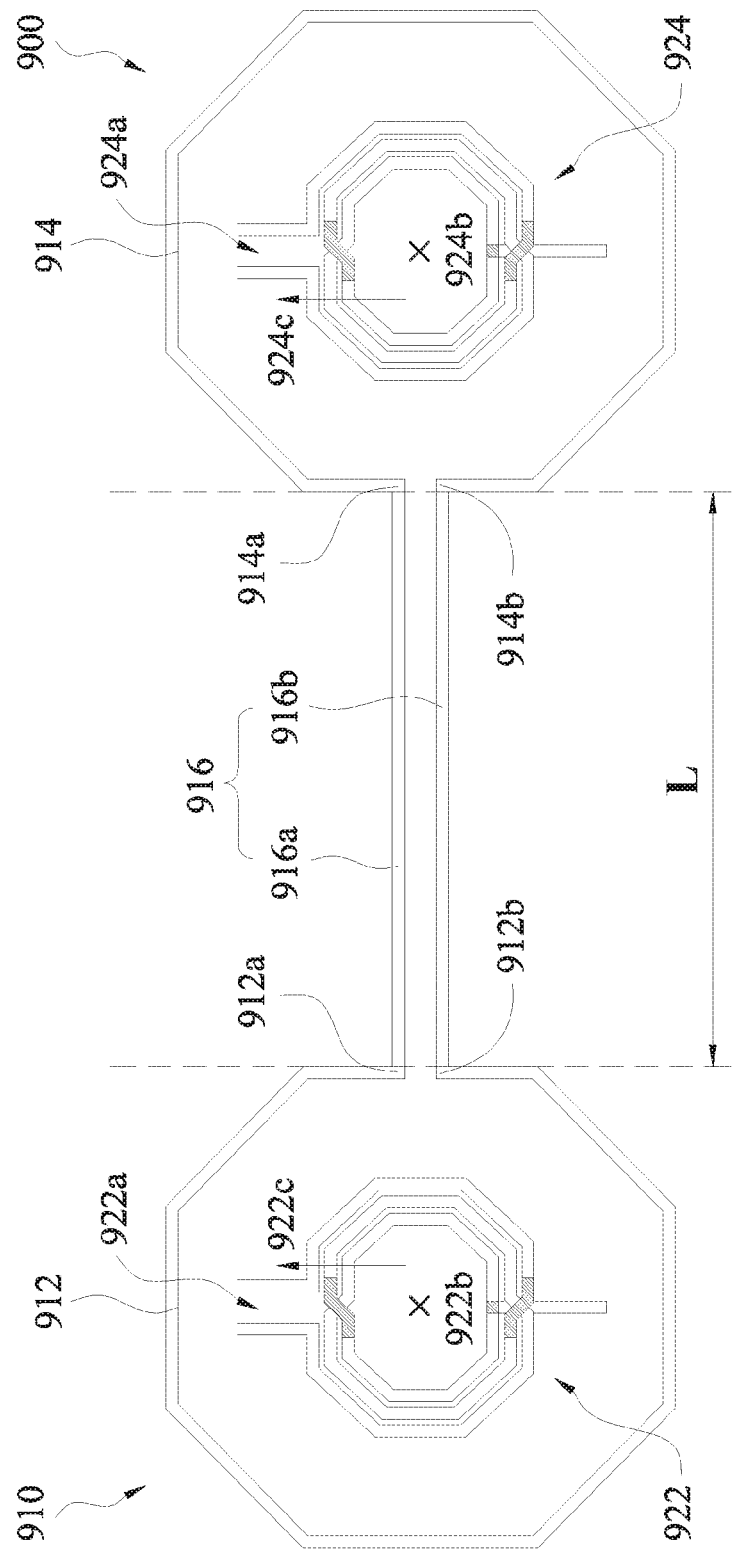
FIG. 9 is a top view of a coupling structure and corresponding inductive devices in accordance with one or more embodiments.

FIG. 9 is a top view of a portion of a circuit 900 including a coupling structure 910 and corresponding first and second inductive devices 922 and 924 in accordance with one or more embodiments. In some embodiments, inductive devices 922 and 924 correspond to inductive devices 110A and 110B in FIG. 1 or inductive devices 310A to 310F in FIG. 3. In some embodiments, coupling structure 910 is configured to facilitate the magnetic coupling 180 in FIG. 1 or magnetic coupling 308A to 380G in FIG. 3.

Coupling structure 910 includes a first conductive loop 912, a second conductive loop 914, and a set of conductive paths 916 electrically connecting first conductive loop 912 and second conductive loop 914. First conductive loop 912 and second conductive loop 914 have a shape of an octagon loop. In some embodiments, first conductive loop 912 and second conductive loop 914 have a shape of a polygon loop or a circular loop. First conductive loop 912, second conductive loop 914, and the set of conductive paths 916 are formed in various interconnection layers of one or more chips. First conductive loop 912 surrounds the first inductive device 922 as observed from a top view perspective. Second conductive loop 914 surrounds the second inductive device 924 as observed from the top view perspective.

Figure 10:
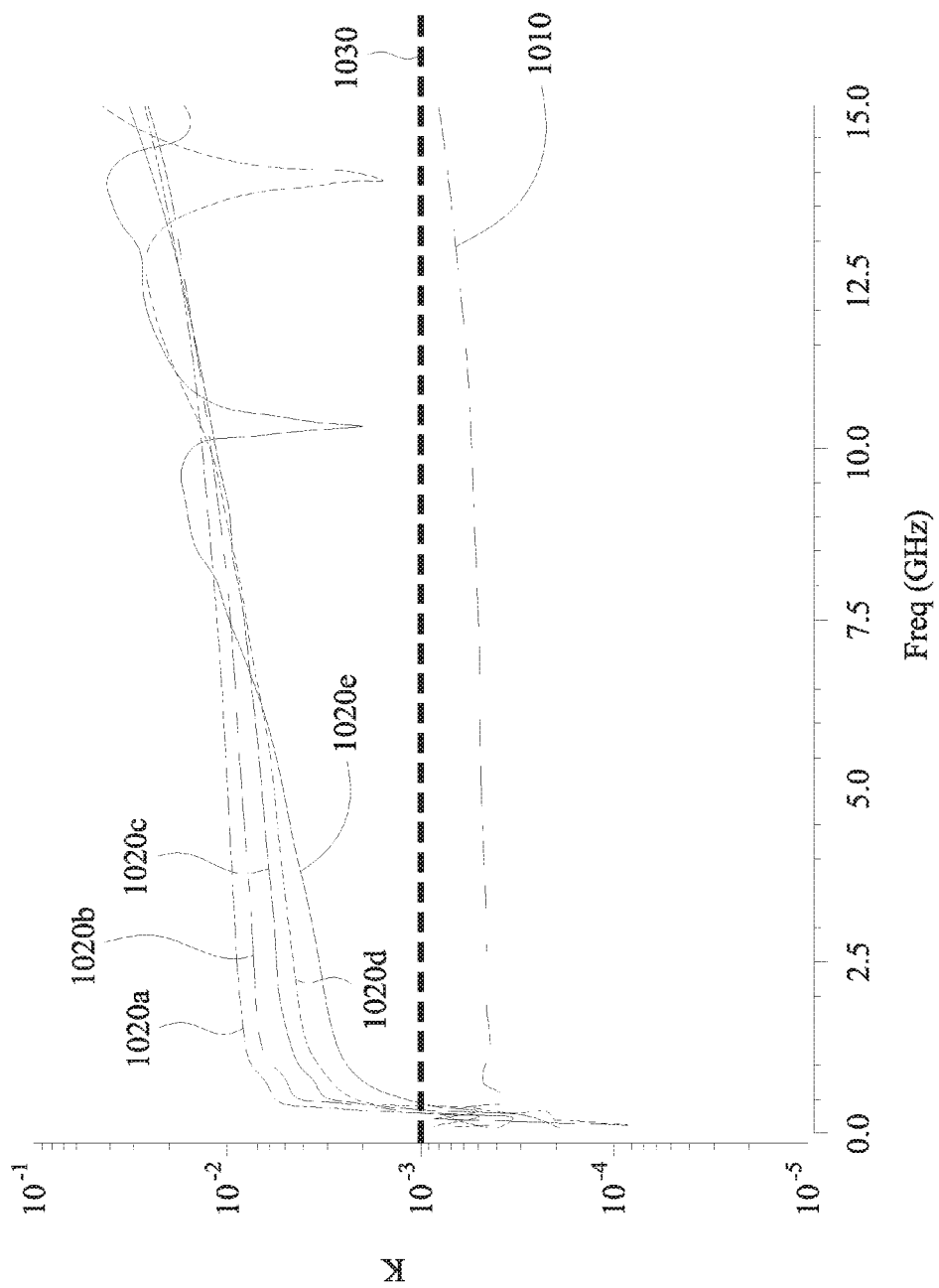
FIG. 10 is a diagram of coupling factor versus frequency between two inductive devices, with or without a coupling structure, in accordance with one or more embodiments.

First inductive device 922 has a signal port 922a corresponding to an opening of a coil of inductive device 922, a center of the coil 922b, and a port direction 922c. Second inductive device 924 has a signal port 924a corresponding to an opening of a coil of inductive device 924, a center of the coil 924b, and a port direction 924c. In FIG. 10, port directions 922c and 924c point to the same direction. In some embodiments, port directions 922c and 924c point to different directions.

First conductive loop 912 includes a first end 912a and a second end 912b. Second conductive loop 914 includes a first end 914a and a second end 914b. The set of conductive paths 916 includes a first conductive path 916a and a second conductive path 916b. First conductive path 916a electrically connects first end 912a of first conductive loop 912 and first end 914a of second conductive loop 914. Second conductive path 916b electrically connects second end 912b of first conductive loop 912 and second end 914b of second conductive loop 914. A length L is defined as the length of a space between first conductive loop 912 and second conductive loop 914. In some embodiments, length L is equal to or greater than 100 μm.

In some embodiments, an induced current is generated at first conductive loop 912 responsive to a first magnetic field generated by first inductive device 922. The induced current is transmitted to second conductive loop 914 through the set of conductive paths 916 and generates a second magnetic field within the second conductive loop 914. Accordingly, a mutual inductance between the first and second inductive devices 922 and 924 is less dependent from the field distribution of first magnetic field and more dependent from the second magnetic field reproduced by the induced current. As a result, a mutual inductance between the first and second inductive devices 922 and 924 is independent of a distance between inductive devices 922 and 924, such as when the length L is equal to or greater than 100 μm.

FIG. 10 is a diagram of coupling factor K versus frequency Freq between two inductive devices, such as inductive devices 922 and 924, with or without a coupling structure, in accordance with one or more embodiments. Curve 1010 represents a coupling factor K between inductive devices 922 and 924 when there is no coupling structure 910 and a distance therebetween is set to be 1000 μm. Curve 1020a represents a coupling factor K between inductive devices 922 and 924, with coupling structure 910 and a length L set to be 500 μm; curve 1020b represents a coupling factor K if length L is 1000 μm; curve 1020c represents a coupling factor K if length L is 2000 μm; curve 1020d represents a coupling factor K if length L is 3000 μm; and curve 1020e represents a coupling factor K if length L is 5000 μm. Reference line 1030 represents a K value of 0.001 ($10^{-3}$).

Coupling factor K is defined as:

$$K = \frac{M}{\sqrt{L_1 L_2}}$$

M is the mutual conductance between inductive devices 922 and 924, $L_1$ is the self-inductance of first inductive device 922, and $L_2$ is the self-inductance of first inductive device 924. If the K value is greater than 0.001 (reference line 1030), oscillators corresponding to inductive devices 922 and 924 have meaningful magnetic coupling sufficient to maintain a stable phase difference therebetween.

As shown by curve 1010 in FIG. 10, at a distance of 1000 μm, a configuration without coupling structure 910 no longer ensures sufficient magnetic coupling between inductive devices 922 and 924. In contrast, curves 1020a-1020e demonstrate that an embodiment with coupling structure 910 renders the magnetic coupling between inductive devices 922 and 924 independent of the distance therebetween. As shown in FIG. 10, after 500 MHz, curves 1020a-1020e are all above reference line 1030 for length L set to 500, 1000, 2000, 3000, or 5000 μm.

Some possible variations along the embodiment of FIG. 9 are further illustrated in conjunction with FIGS. 11A-15. In some embodiments, variations as illustrated in FIGS. 11A-15 are combinable to form yet a different variation consistent with the ideas as demonstrated in conjunction with FIG. 9 and FIGS. 11A-15.

Figure 11A:
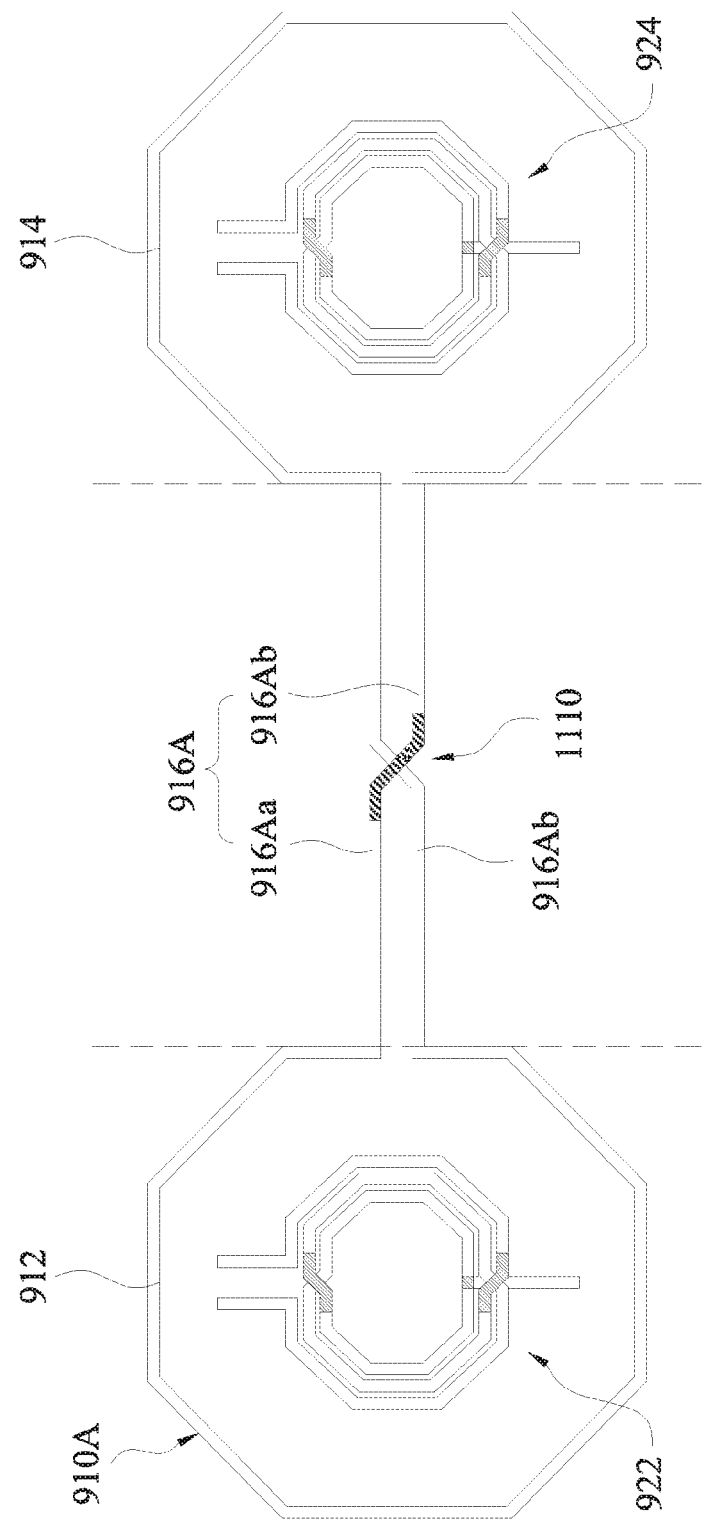
FIGS. 11A-C are top views of coupling structures and corresponding inductive devices in accordance with one or more embodiments.

FIG. 11A is a top view of a coupling structure 910A and corresponding inductive devices 922 and 924 in accordance with one or more embodiments. The components the same or similar to those in FIG. 9 are given the same reference numbers, and detailed description thereof is omitted.

Compared with coupling structure 910, coupling structure 910A includes a set of conductive paths 916A in place of the set of conductive paths 916. The set of conductive paths 916A includes a first conductive path 916Aa and a second conductive path 916Ab. First conductive path 916Aa and second conductive path 916Ab are routed such that first conductive path 916Aa crosses over second conductive path 916Ab at location 1110 as observed from a top view perspective.

Figure 11B:
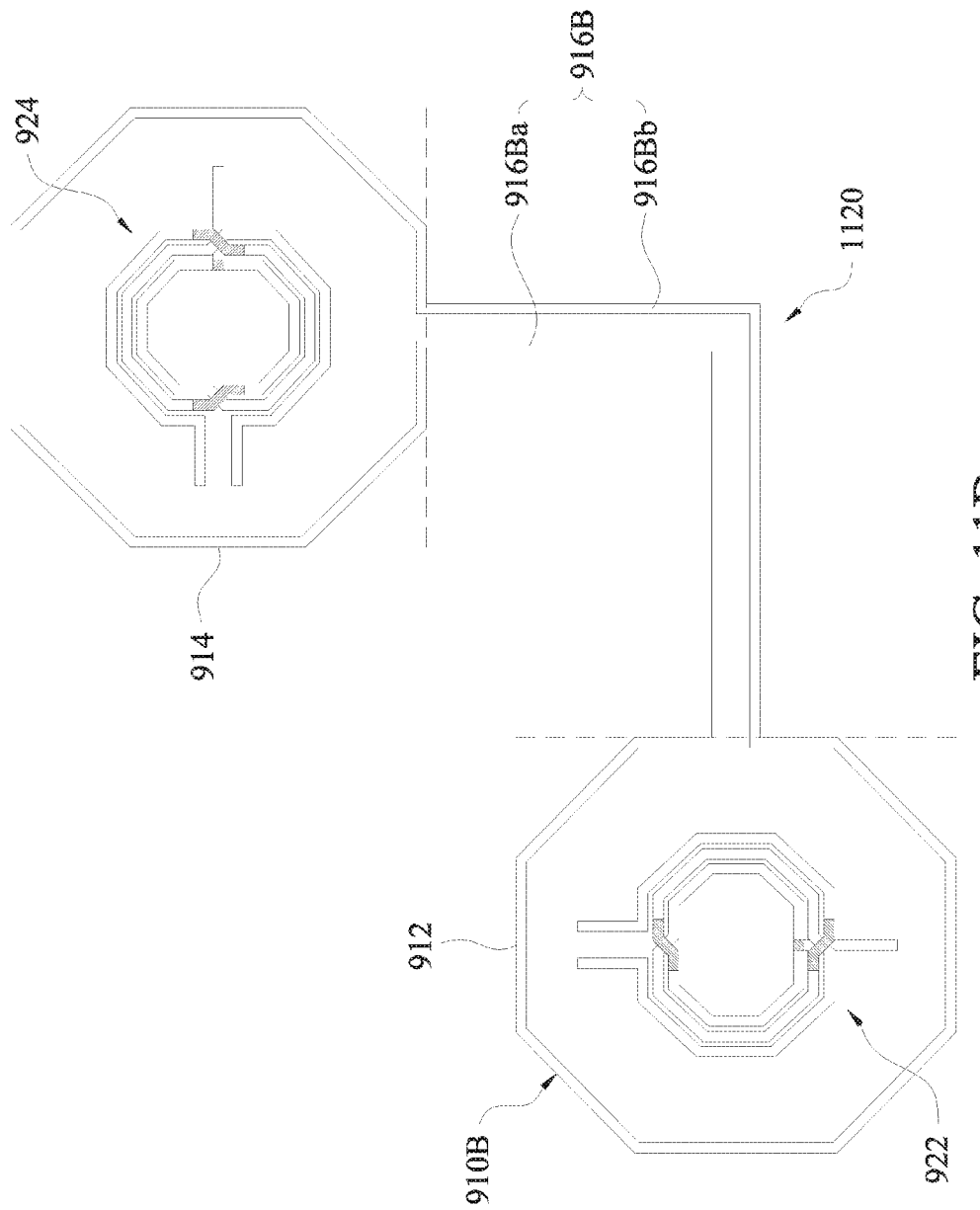

FIG. 11B is a top view of a coupling structure 910B and corresponding inductive devices 922 and 924 in accordance with one or more embodiments. The components the same or similar to those in FIG. 9 are given the same reference numbers, and detailed description thereof is omitted.

Compared with coupling structure 910, coupling structure 910B includes a set of conductive paths 916B in place of the set of conductive paths 916. The set of conductive paths 916B includes a first conductive path 916Ba and a second conductive path 916Bb. First conductive path 916Ba and second conductive path 916Bb are routed such that each one of first conductive path 916Ba and second conductive path 916Bb has an angled corner at location 1120 as observed from a top view perspective.

Figure 11C:
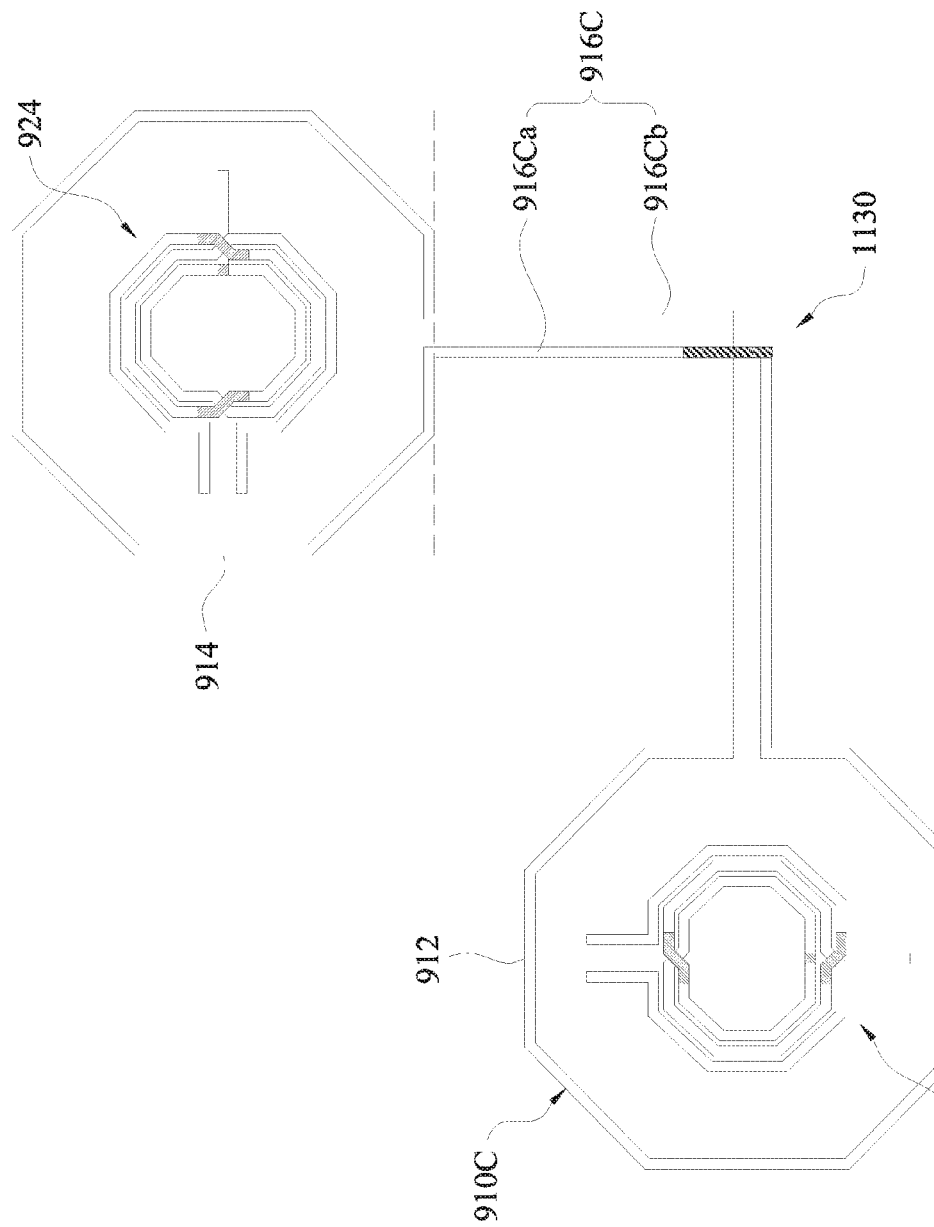

FIG. 11C is a top view of a coupling structure 910C and corresponding inductive devices 922 and 924 in accordance with one or more embodiments. The components the same or similar to those in FIG. 9 are given the same reference numbers, and detailed description thereof is omitted.

Compared with coupling structure 910, coupling structure 910C includes a set of conductive paths 916C in place of the set of conductive paths 916. The set of conductive paths 916C includes a first conductive path 916Ca and a second conductive path 916Cb. First conductive path 916Ca and second conductive path 916Cb are routed such that each one of first conductive path 916Ca and second conductive path 916Cb has an angled corner at location 1130 as observed from a top view perspective. Also, first conductive path 916Ca crosses over second conductive path 916Cb at location 1130 as observed from the top view perspective.

Figure 12A:
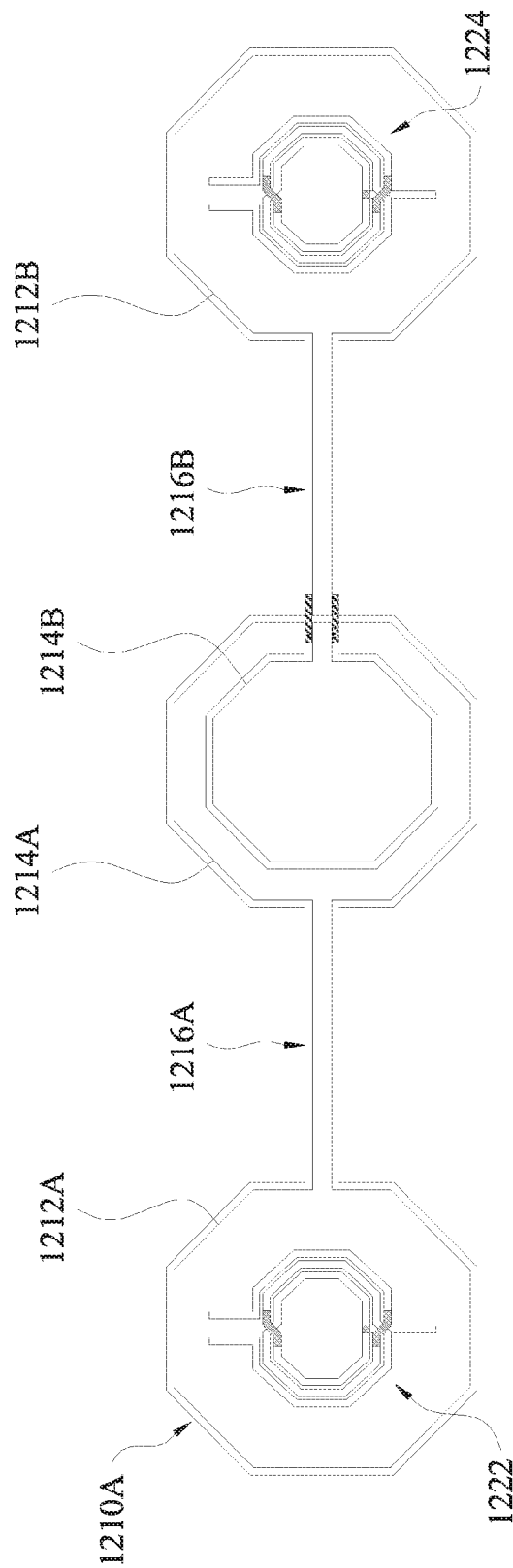
FIGS. 12A-E are top views of coupling structures and corresponding inductive devices in accordance with one or more embodiments.

FIG. 12A is a top view of a coupling structure 1210A and corresponding inductive devices 1222 and 1224 in accordance with one or more embodiments. Coupling structure 1210A includes a first conductive loop 1212A, a second conductive loop 1214A, a first set of conductive paths 1216A electrically connecting conductive loops 1212A and 1214A, a third conductive loop 1212B, a fourth conductive loop 1214B, and a second set of conductive paths 1216B electrically connecting conductive loops 1212B and 1214B. A first inductive device 1222 is magnetically coupled with first conductive loop 1212A. A second inductive device 1224 is magnetically coupled with third conductive loop 1212B. Second conductive loop 1214A is magnetically coupled with fourth conductive loop 1214B. Second conductive loop 1214A surrounds fourth conductive loop 1214B as observed from a top view perspective.

In some embodiments, a first induced current is generated at first conductive loop 1212A responsive to a first magnetic field generated by first inductive device 1222. The first induced current is transmitted to second conductive loop 1214A through the first set of conductive paths 1216A and generates a second magnetic field within second conductive loop 1214A. A second induced current is generated at fourth conductive loop 1214B responsive to the second magnetic field. The second induced current is transmitted to third conductive loop 1214B through the second set of conductive paths 1216B and generates a third magnetic field within third conductive loop 1214B. Accordingly, second inductive device 1224 is magnetically coupled with first inductive device 1222 through the third magnetic field reproduced by the second induced current within third conductive loop 1214B.

Figure 12B:
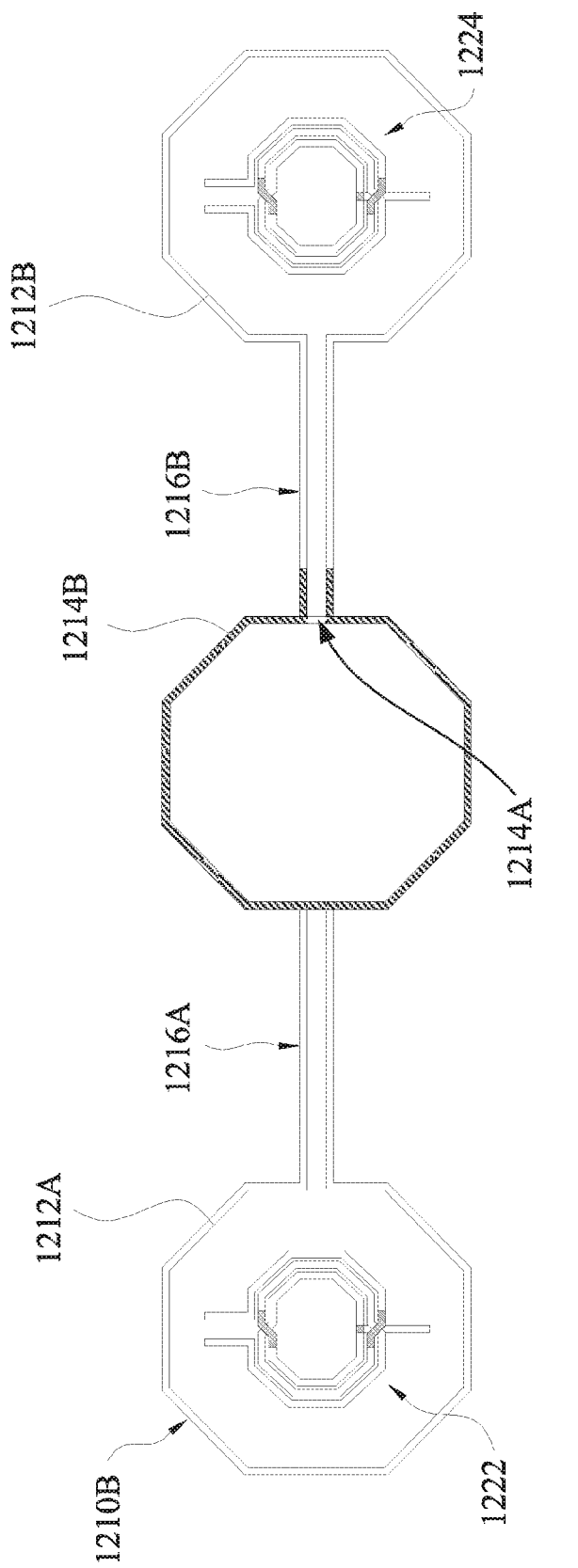

FIG. 12B is a top view of a coupling structure 1210B and corresponding inductive devices 1222 and 1224 in accordance with one or more embodiments. Components that are the same or similar to those in FIG. 12A are given the same reference numbers, and detailed description thereof is omitted. Compared with coupling structure 1210A, second conductive loop 1214A and fourth conductive loop 1214B overlap as observed from a top view perspective. In other words, second conductive loop 1214A and fourth conductive loop 1214B have the same size and shape but formed on different interconnection layers.

Figure 12C:
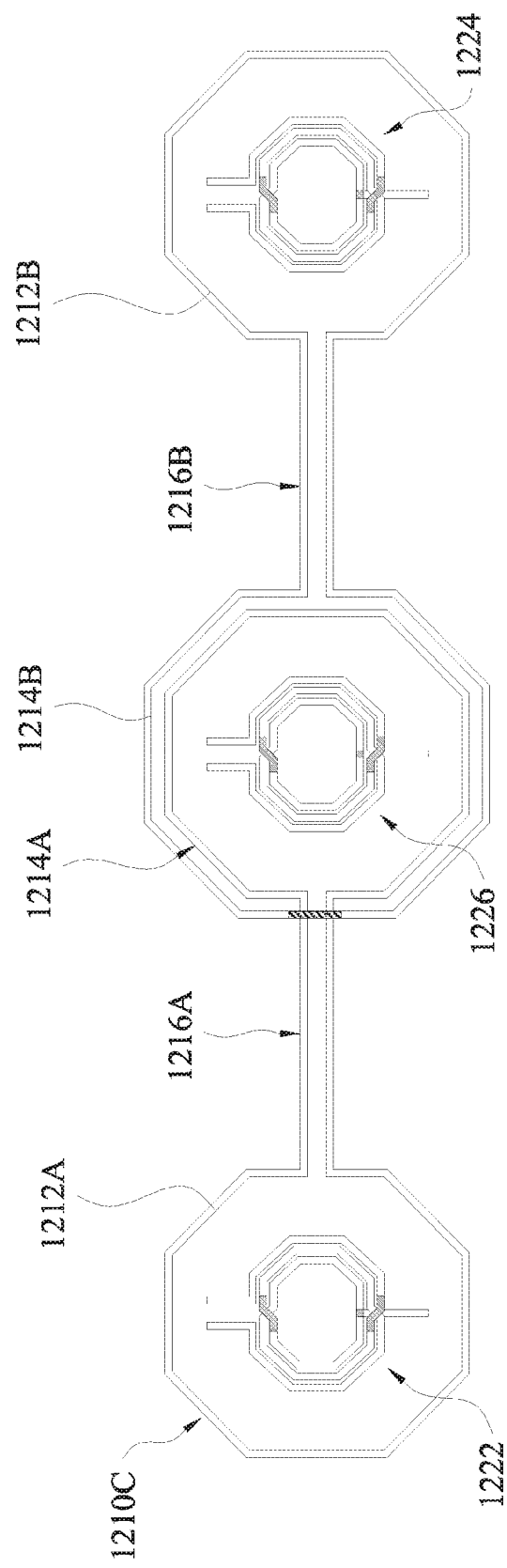

FIG. 12C is a top view of a coupling structure 1210C and corresponding inductive devices 1222, 1224, and 1226 in accordance with one or more embodiments. Components that are the same or similar to those in FIG. 12A are given the same reference numbers, and detailed description thereof is omitted. Compared with coupling structure 1210A, second conductive loop 1214A and fourth conductive loop 1214B are arranged to magnetically couple with an additional inductive device 1226. Also, fourth conductive loop 1214B surrounds second conductive loop 1214A as observed from a top view perspective.

Figure 12D:
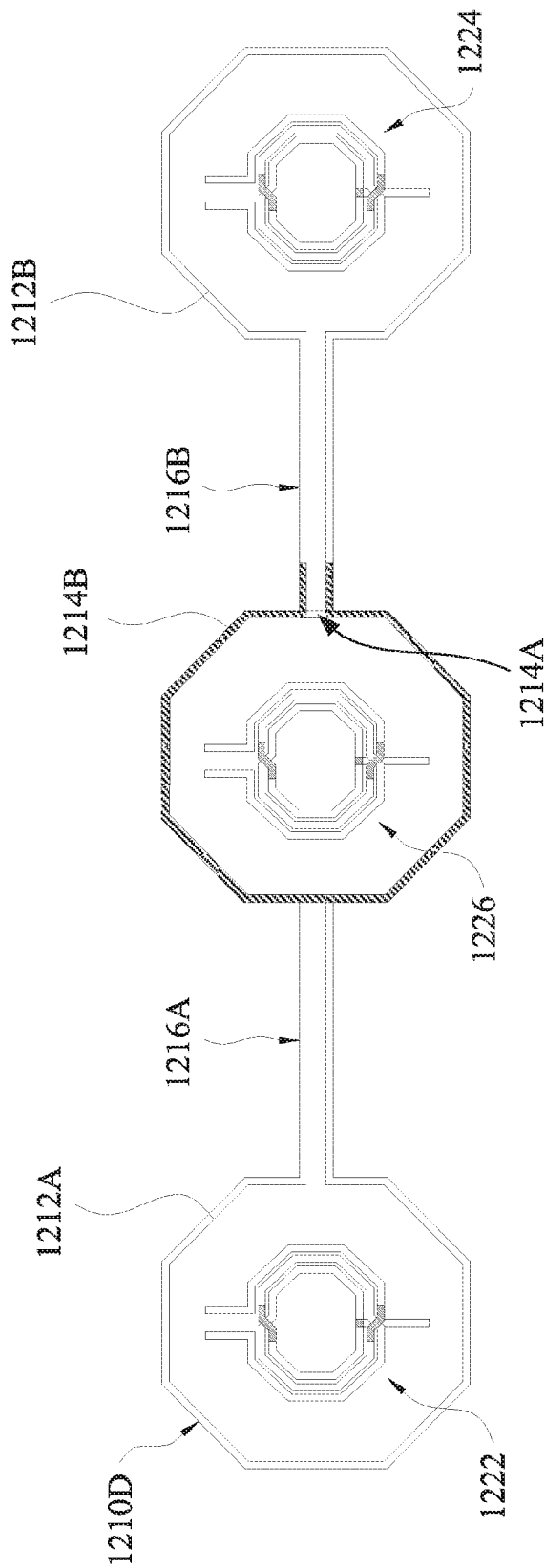

FIG. 12D is a top view of a coupling structure 1210D and corresponding inductive devices 1222, 1224, and 1226 in accordance with one or more embodiments. Components that are the same or similar to those in FIG. 12B are given the same reference numbers, and detailed description thereof is omitted. Compared with coupling structure 1210B, second conductive loop 1214A and fourth conductive loop 1214B are arranged to magnetically couple with an additional inductive device 1226.

Figure 12E:
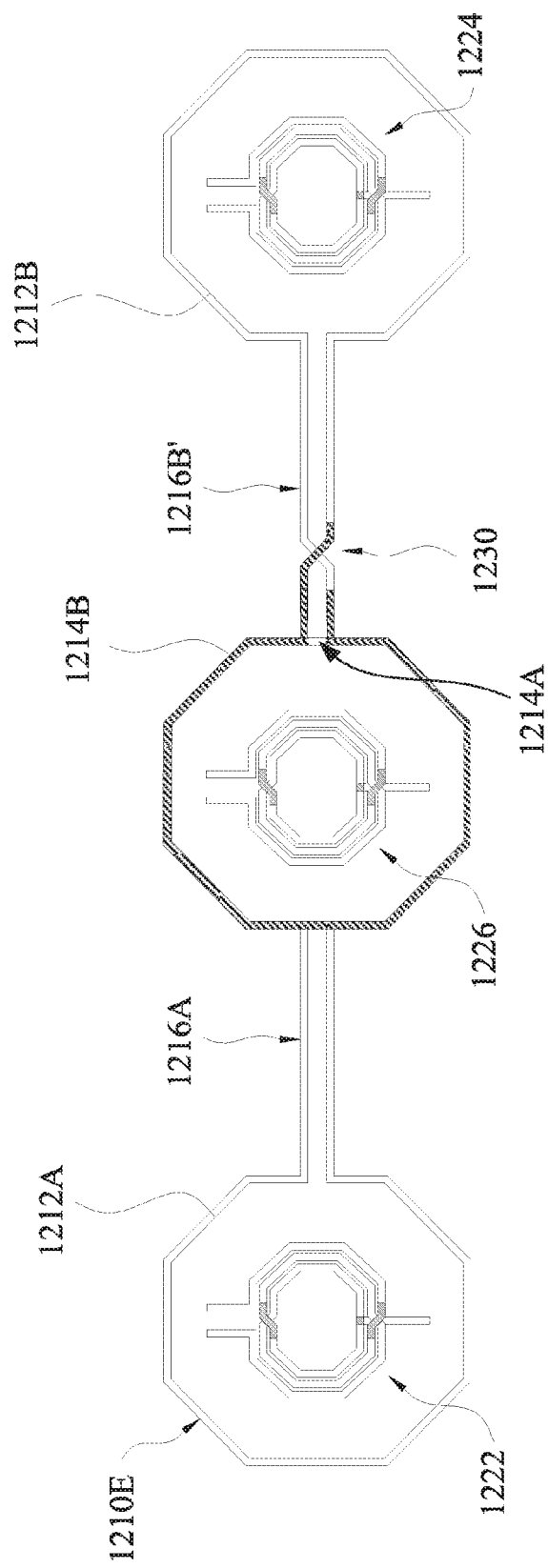

FIG. 12E is a top view of a coupling structure 1210E and corresponding inductive devices 1222, 1224, and 1226 in accordance with one or more embodiments. Components that are the same or similar to those in FIG. 12D are given the same reference numbers, and detailed description thereof is omitted. Compared with coupling structure 1210D, a set of conductive paths 1216B' is used in place of second set of conductive paths 1216B, where one conductive path of the set of conductive paths 1216B' crosses over another conductive path of the set of conductive paths 1216B' at location 1230.

Figure 13A:
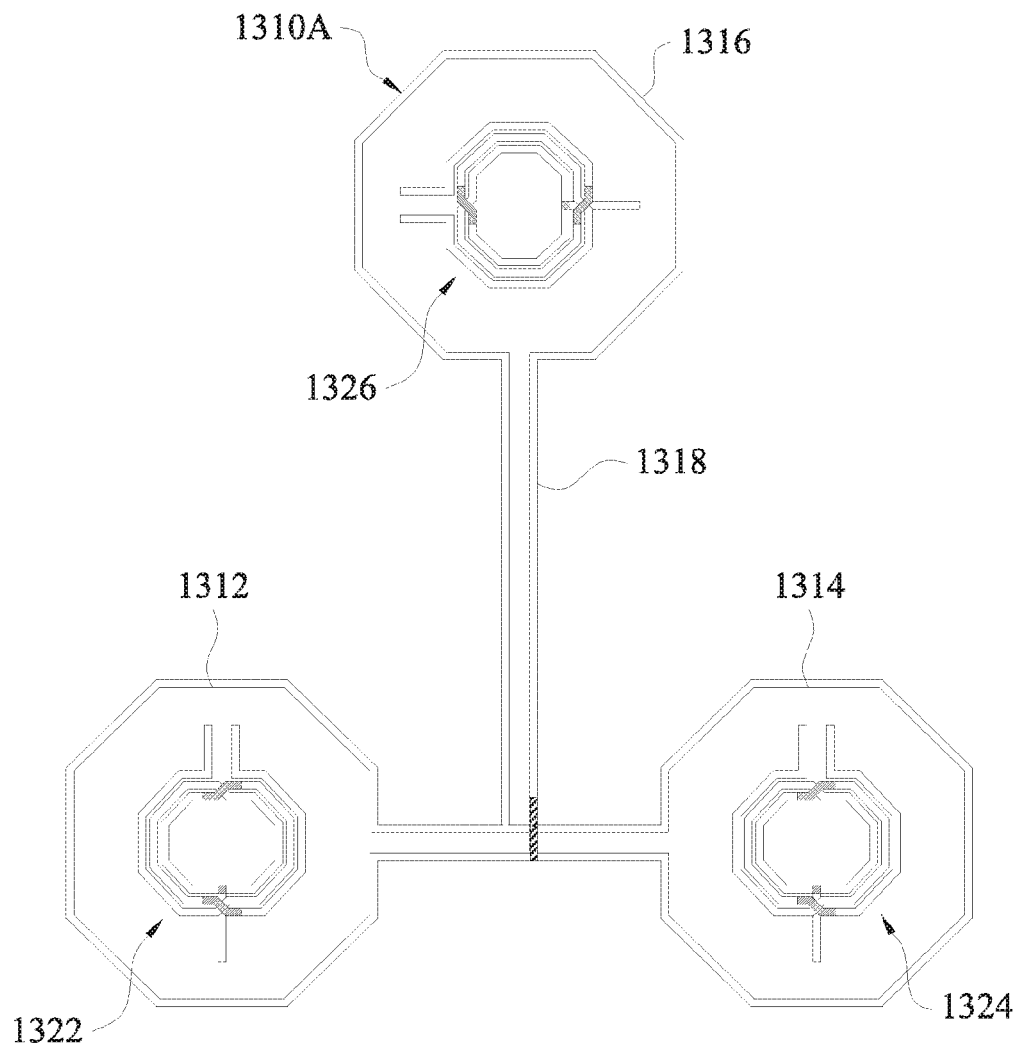
FIGS. 13A-B are top views of coupling structures and corresponding inductive devices in accordance with one or more embodiments.

FIG. 13A is a top view of a coupling structure 1310A and corresponding inductive devices 1322, 1324, and 1326 in accordance with one or more embodiments. Coupling structure 1310A includes three conductive loops 1312, 1314, and 1316 electrically coupled together through a set of conductive paths 1318. Each one of conductive loops 1312, 1314, and 1316 is magnetically coupled with a corresponding one of inductive devices 1322, 1324, and 1326.

Figure 13B:
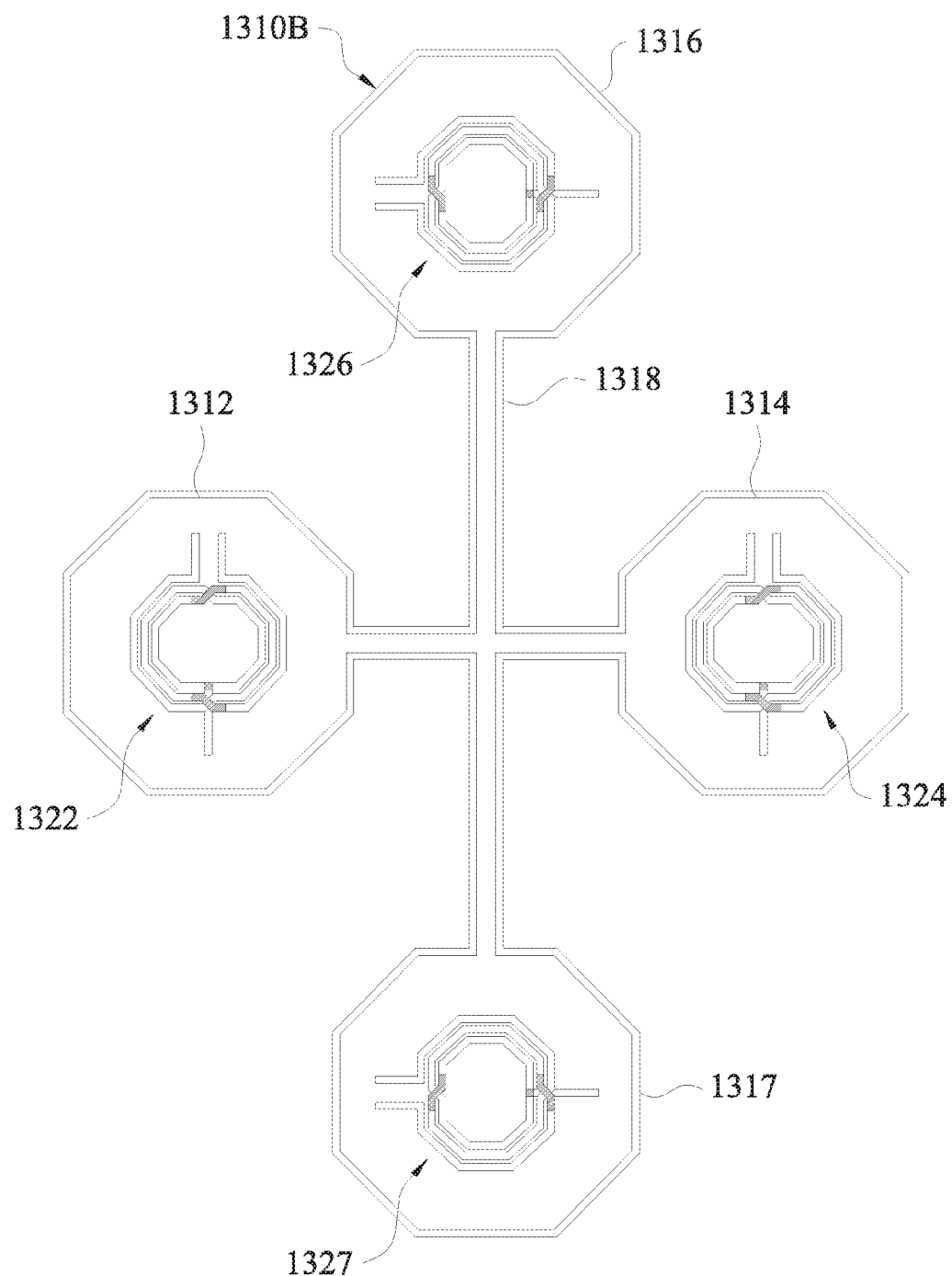

FIG. 13B is a top view of a coupling structure 1310B and corresponding inductive devices 1322, 1324, 1326, and 1327 in accordance with one or more embodiments. Components that are the same or similar to those in FIG. 13A are given the same reference numbers, and detailed description thereof is omitted. Coupling structure 1310B includes four conductive loops 1312, 1314, 1316, and 1317 electrically coupled together through a set of conductive paths 1318. Each one of conductive loops 1312, 1314, 1316, and 1317 is magnetically coupled with a corresponding one of inductive devices 1322, 1324, 1326, and 1327.

Figure 14:
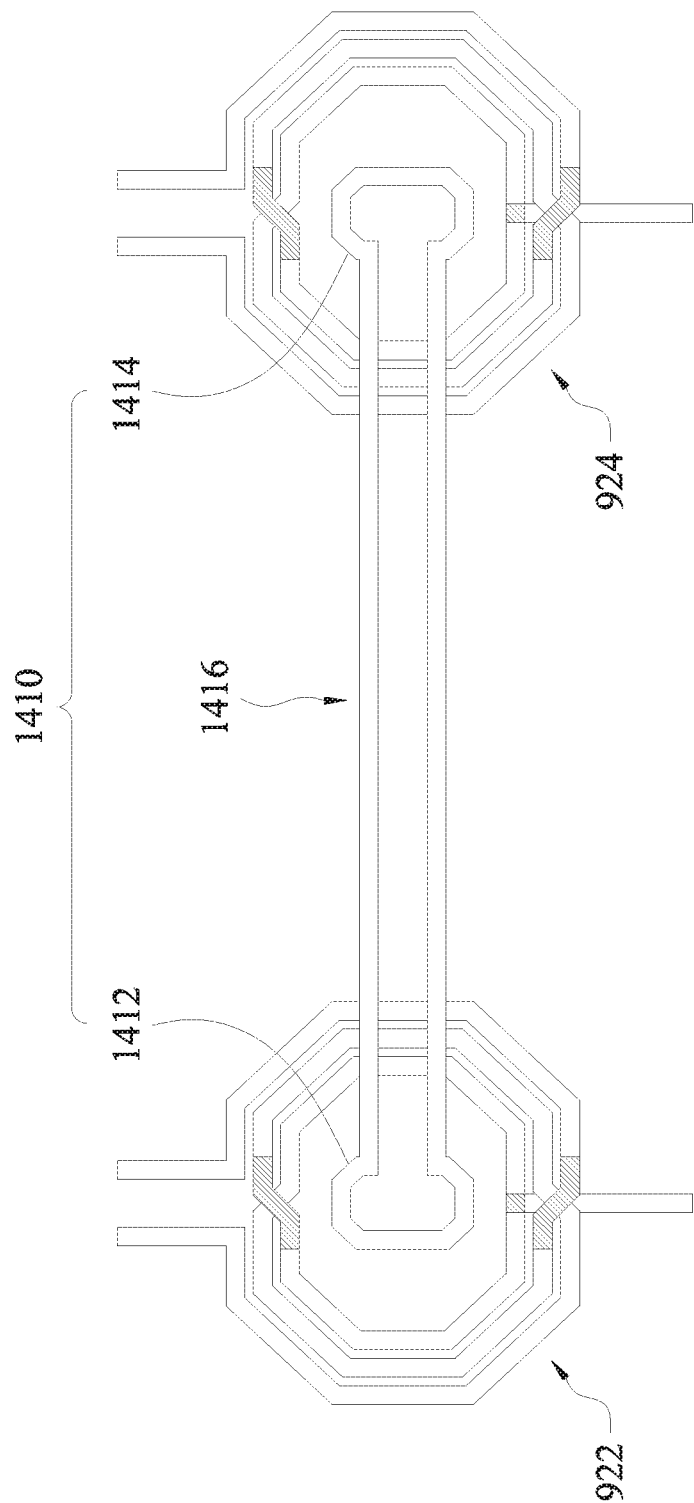
FIG. 14 is a top view of a coupling structure and corresponding inductive devices in accordance with one or more embodiments.

FIG. 14 is a top view of a coupling structure 1410 and corresponding inductive devices 922 and 924 in accordance with one or more embodiments. Components that are the same or similar to those in FIG. 9 are given the same reference numbers, and detailed description thereof is omitted. Coupling structure 1410 includes two conductive loops 1412 and 1414 electrically coupled together through a set of conductive paths 1416. Each one of conductive loops 1412 and 1416 is magnetically coupled with a corresponding one of inductive devices 922 and 924. Moreover, inductive device 922 surrounds conductive loop 1412 as observed from a top view perspective; and inductive device 924 surrounds conductive loop 1414 as observed from the top view perspective.

Figure 15:
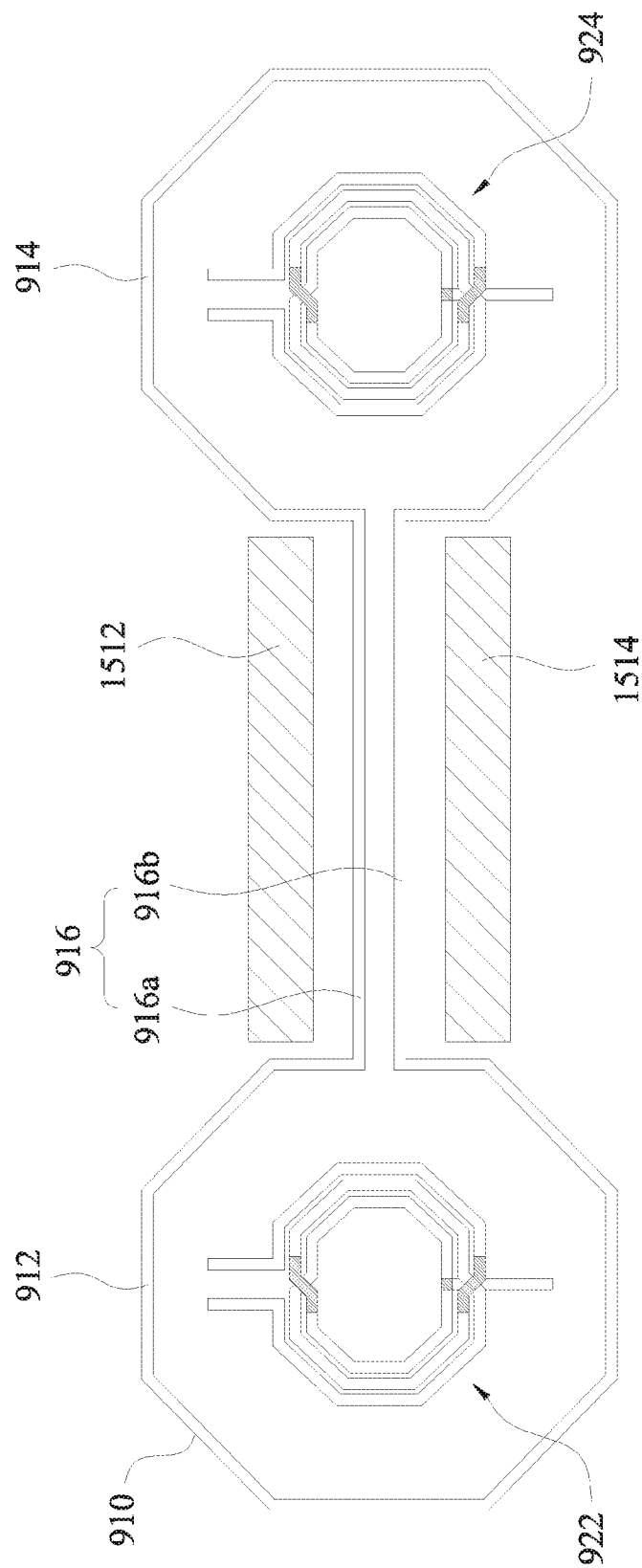
FIG. 15 is a top view of a coupling structure with shielding structures and corresponding inductive devices in accordance with one or more embodiments.

FIG. 15 is a top view of a coupling structure 910 with shielding structures 1512 and 1514 and corresponding inductive devices 922 and 924 in accordance with one or more embodiments. Components that are the same or similar to those in FIG. 9 are given the same reference numbers, and detailed description thereof is omitted. Compared with the circuit 900 in FIG. 9, the circuit depicted in FIG. 15 further includes a first shielding structure 1512 and a second shielding structure 1514. At least a portion of the set of conductive paths 916 is between first shielding structure 1512 and second shielding structure 1514 as observed from a top view perspective.

Figure 16:
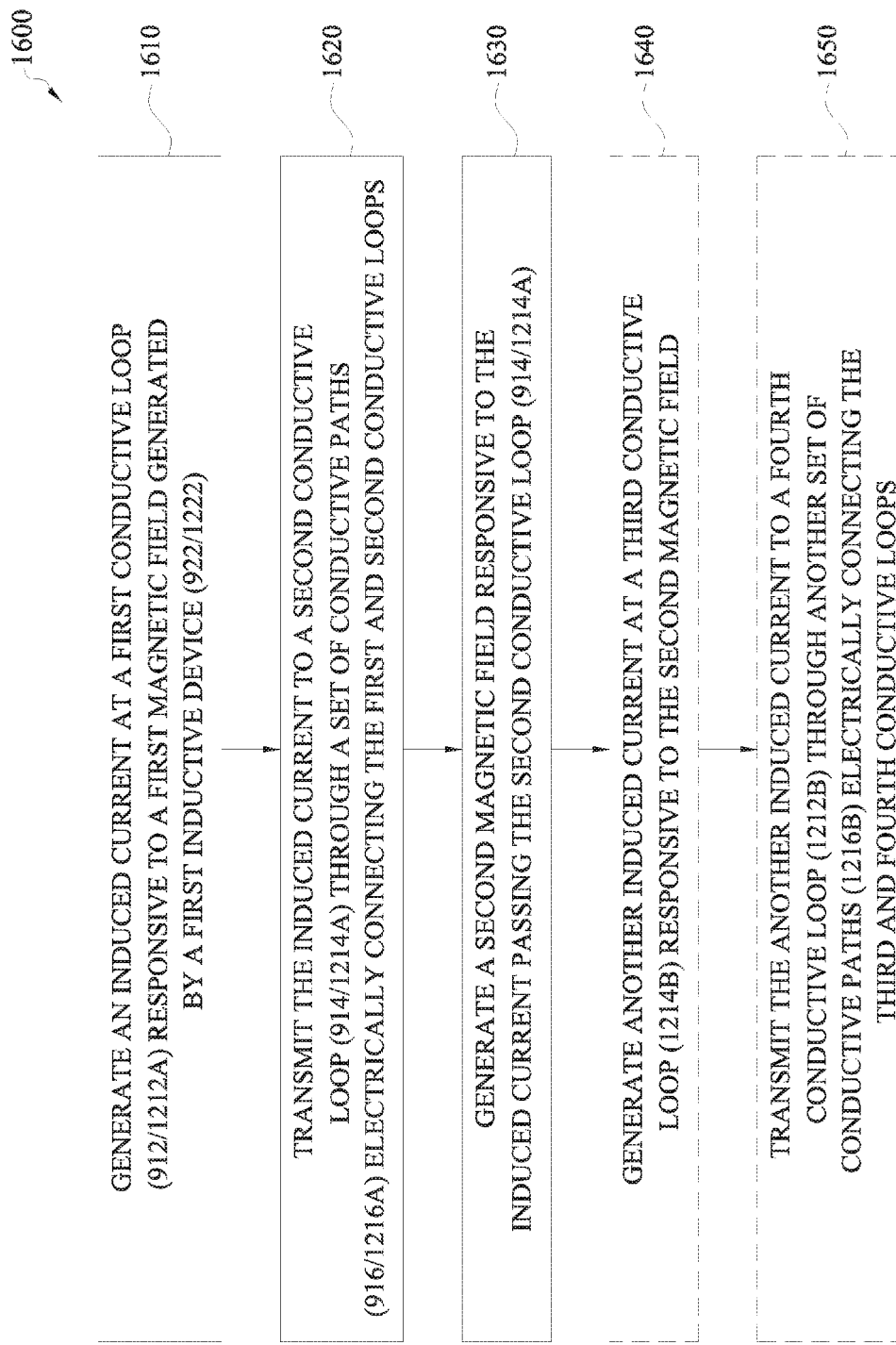
FIG. 16 is a flowchart of a method of magnetically coupling inductive devices in accordance with one or more embodiments.

FIG. 16 is a flowchart of a method 1600 of magnetically coupling inductive devices in accordance with one or more embodiments. In some embodiments, method 1600 is usable in conjunction with the circuit in FIG. 9 or FIG. 12A. In some embodiments, method 1600 is also usable in conjunction with the circuit in FIGS. 11A-11C, FIGS. 12B-12E, or FIGS. 13A-15. It is understood that additional operations may be performed before, during, and/or after the method 1600 depicted in FIG. 16, and that some other processes may only be briefly described herein.

The process begins with operation 1610, where an induced current is generated at a first conductive loop 912 or 1212A responsive to a first magnetic field of a first oscillator generated by a first inductive device 922 or 1222.

The process proceeds to operation 1620, where the induced current is transmitted to a second conductive loop 914 or 1214A through a set of conductive paths 916 or 1216A electrically connecting the first and second conductive loops.

The process proceeds to operation 1630, where a second magnetic field is generated responsive to the induced current passing the second conductive loop 914 or 1214A.

For a coupling structure having a configuration the same or similar to FIG. 12A or FIGS. 12B-E, the process proceeds to operation 1640, where another induced current is generated at a third conductive loop 1214B responsive to the second magnetic field.

The process proceeds to operation 1650, where the another induced current is transmitted to a fourth conductive loop 1212B through another set of conductive paths 1216B electrically connecting the third and fourth conductive loops.

As a result, a second inductive device 924 or 1224 of a second oscillator is magnetically coupled with the first inductive device 922 or 1222 of the first oscillator through the coupling structure 910 or 1210.

Figure 17:
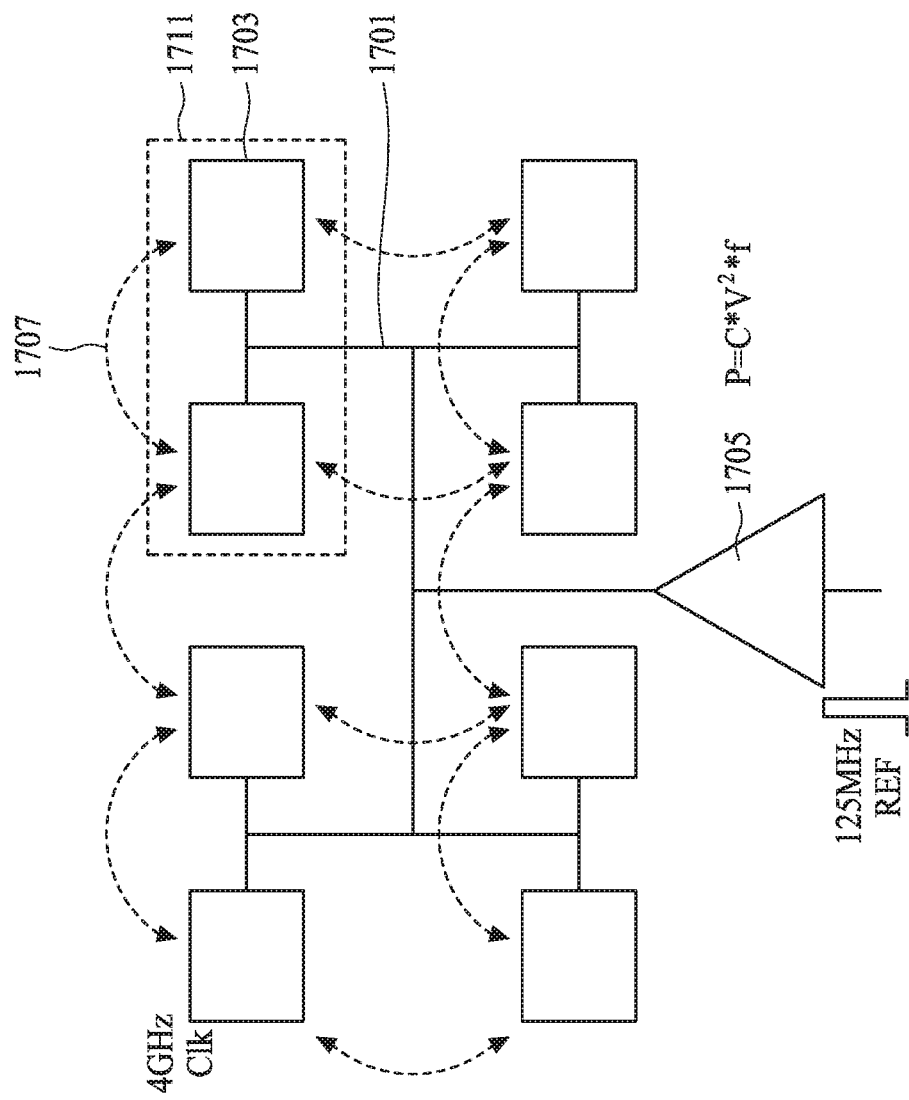
FIG. 17 is a clock distribution network in accordance with one or more embodiments.

FIG. 17 illustrates yet another embodiment in which coupled oscillators may be utilized in order to supply clock signals throughout a clock tree. In this embodiment, a clock distribution network 1701, instead of using a single high speed clock to drive the clock distribution network 1701, uses a low frequency reference clock that is propagated through the distributive paths in order to synchronize local digital controlled oscillators (DCOs) 1703. In an embodiment the clock distribution network 1701 may be similar to the pulse distribution network 500 described above with respect to FIG. 5, and certain embodiments include a clock pulse generator (not separately illustrated in FIG. 17), a clock driver 1705, and one or more conductive paths arranged to have an H-tree configuration and a power dissipation of $C*V^2*f$. However, any suitable configuration for the clock distribution network 1701 may be utilized.

At the endpoints of the clock distribution network 1701 (e.g., at the endpoints of the H-trees), the digital controlled oscillators 1703 are connected. In an embodiment the digital controlled oscillators 1703 receive the low frequency reference clock signal (from the clock driver 1705) and output a local high-frequency clock signal to the remaining circuitry. In a particular embodiment, the low frequency reference clock signal may be propagated throughout the clock distribution network 1701 at a frequency of between about 62.5 MHz and about 187.5 MHz, such as about 125 MHz. Additionally, the digital controlled oscillators 1703 receive the low frequency reference clock as an input and output the local high-frequency clock signal of between about 2 GHz and about 6 GHz, such as about 4 GHz. However, any suitable frequencies may be utilized.

Additionally, while the low frequency reference clock is used to injection lock the digital controlled oscillators 1703 to improve jitter performance, skew between the different local high-frequency clock signals that are output from different ones of the digital controlled oscillators 1703 (from, e.g., process, supply, and temperature variations) may be reduced by coupling the digital controlled oscillators 1703 together. In an embodiment the separate digital controlled oscillators 1703 are coupled together magnetically (as illustrated in FIG. 17 by the dashed lines labeled 1707). However, the digital controlled oscillators 1703 are not limited to being coupled only magnetically. Rather, any suitable method of coupling the oscillators, such as coupling the oscillators through transmission lines, may also be utilized, and all such coupling are fully intended to be included within the scope of the embodiments.

Figure 18A:
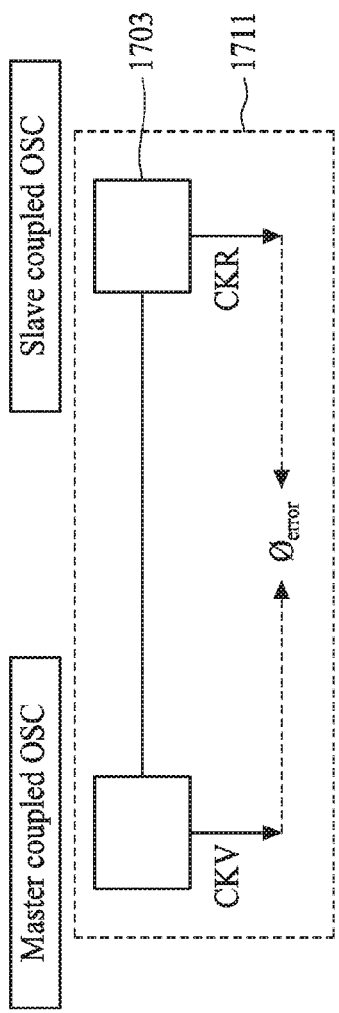
FIG. 18A-18B are views of coupled digital oscillators in accordance with one or more embodiments.
Figure 18B:
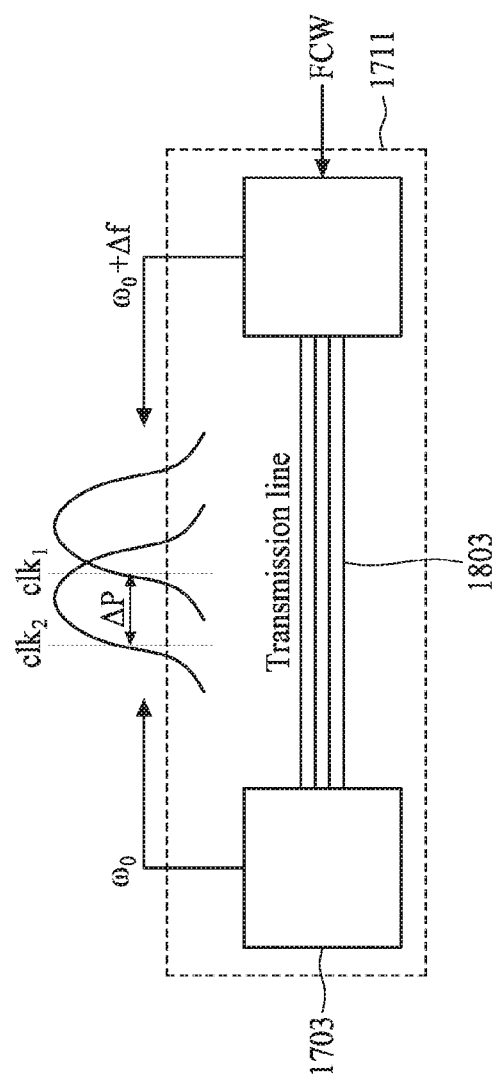

FIGS. 18A and 18B illustrate a close up view of two of the digital controlled oscillators 1703 within the dashed box 1711 in FIG. 17. In this embodiment a first one of the digital controlled oscillators 1703 is a master coupled oscillator which outputs a first high frequency signal CKV. Additionally, a second one of the digital controlled oscillators 1703 is a slave coupled oscillator which outputs a second high frequency signal CKR. Ideally, the first high frequency signal CKV and the second high frequency signal CKR are identical, but without some form of phase calibration, the first high frequency signal CKV and the second high frequency signal CKR will be out of phase, having a phase error $\Phi_{error}$ otherwise called skew.

FIG. 18B illustrates this phase error. In particular, when two of the digital controlled oscillators 1703 are coupled e.g., through a transmission line 1803 (made of, for example, polysilicon, a silicide, or a metal line) as illustrated or through a magnetic coupling, the output frequency $\omega_0$ of the digital controlled oscillators 1703 will be identical. However, there will also be a constant phase shift $\Delta P$ between the first high frequency signal CKV (e.g. $clk_2$) and the second high frequency signal CKR (e.g., $clk_1$. Additionally, this phase shift $\Delta P$ will be proportional to the difference in the natural frequencies $\Delta f$ between the first digital controlled oscillator 1703 and the second digital controlled oscillator 1703. In particular embodiments, the relationship between the difference in natural frequencies $\Delta f$ is close to being linear to the phase difference $\Delta P$ in the signals being output by the digital controlled oscillators 1703.

Figure 19:
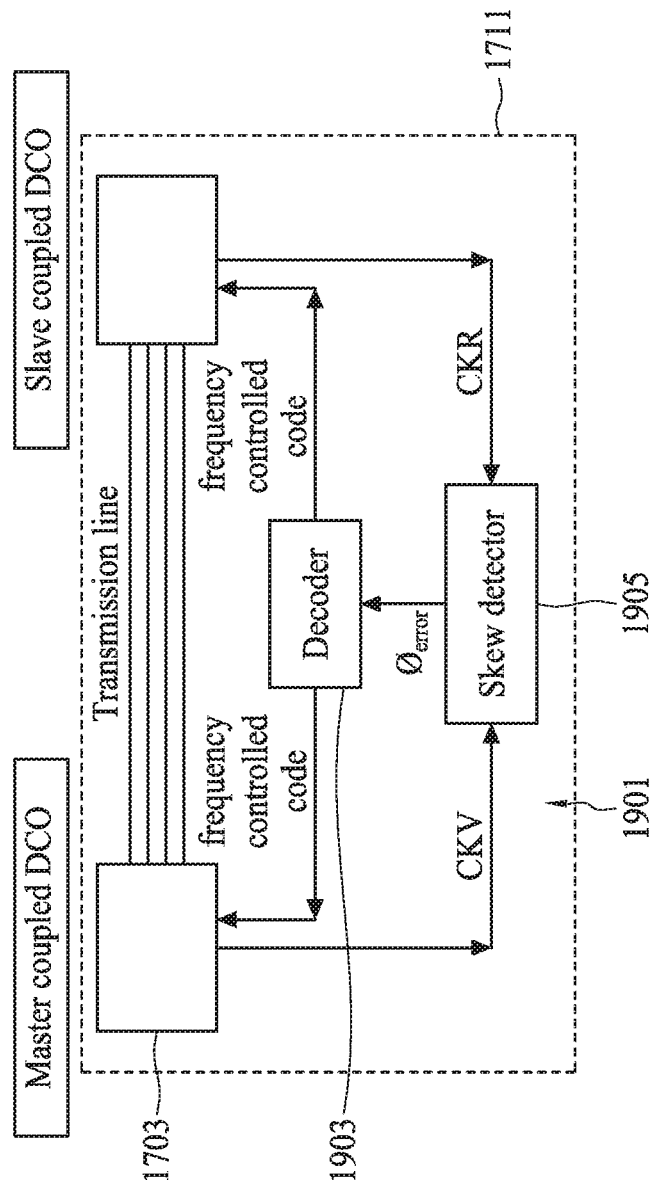
FIG. 19 is a calibration system in accordance with one or more embodiments.

FIG. 19 illustrates a calibration system 1901 which uses this relationship in the natural frequencies $\Delta f$ to control the phase shift $\Delta P$ and calibrate the clock skew. In an embodiment the calibration system 1901 comprises a skew detector 1905 and a decoder 1903 connected to the decoder 1903. In an embodiment the first high frequency signal CKV and the second high frequency signal CKR are both routed to a skew detector 101 as they are also sent to the remainder of the circuitry. The skew detector 1905 may be used to receive the first high frequency signal CKV and the second high frequency signal CKR and detect the phase error $\Phi_{error}$ between the two signals. In a particular embodiment the skew detector 1905 can be a time-digital converter (TDC), a sample and hold d-type flip flop, a single d-type flip flop, or the like. However, any suitable structure that can be used to detect the phase error $\Phi_{error}$ between the first high frequency signal CKV and the second high frequency signal CKR may be utilized.

Once the phase error $\Phi_{error}$ between the first high frequency signal CKV and the second high frequency signal CKR has been determined by the skew detector 1905, the result of the phase error $\Phi_{error}$ is then sent to a decoder 1903 where it can be used to help control the natural frequency of the coupled digital controlled oscillators 1703. For example, because the phase error $\Phi_{error}$ is proportional to the difference in the natural frequencies of the digital controlled oscillators 1703, the resolution of the skew calibration is dominated by the resolution of the digital controlled oscillators 1703. To help calibrate and minimize the skew, the resolution of the digital controlled oscillators 1703 may be made as high as practical.

To improve the resolution of the digital controlled oscillators 1703, the overall inductance (L) of one of the digital controlled oscillators 1703 is split into a plurality of individual inductances. For example, in one embodiment the overall inductance L of one of the digital controlled oscillators 1703 is split into a first inductance of $nL/2$ and a second inductance of $(1-n)L/2$. However, any suitable split in the overall inductance may be utilized.

Figure 20:
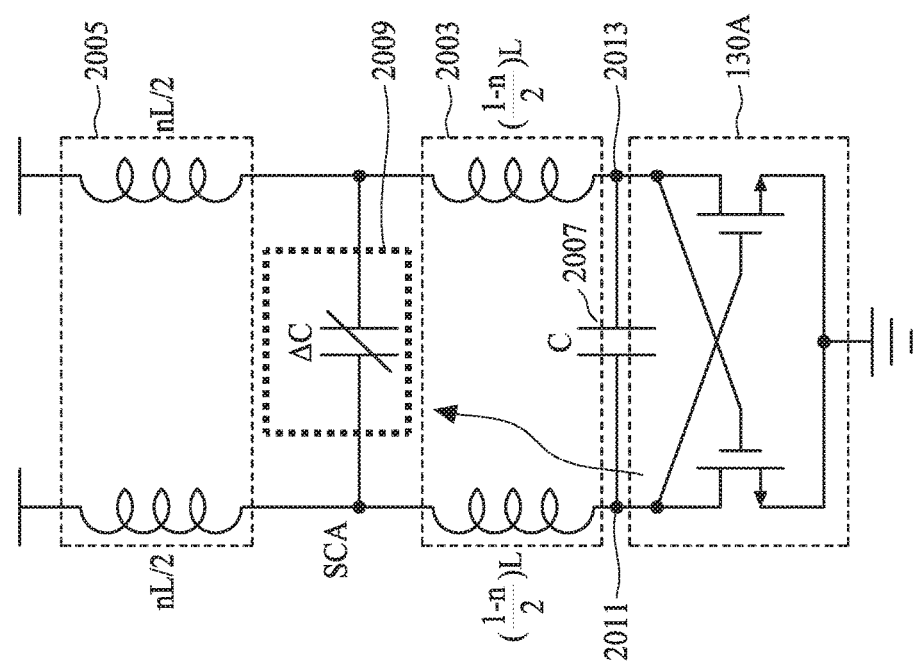
FIG. 20 is a digital controlled oscillator in accordance with one or more embodiments.

FIG. 20 illustrates an embodiment of an implementation of this split of the overall inductance into the digital controlled oscillators 1703. In one embodiment the digital controlled oscillator 1703 comprises the active feedback device 130A (described above with respect to FIG. 1), a first set of inductors 2003 (formed of, for example, polysilicon, silicide, or metal lines), a second set of inductors 2005 (formed of, for example, polysilicon, silicide, or metal lines), a first capacitor 2007, and a switched capacitor array 2009 set within the middle of the inductors. However, fewer structures or additional structures may also be utilized.

In an embodiment the first set of inductors 2003 are manufactured in order to provide (1−n)L/2 of the overall inductance for the digital controlled oscillators 1703. In an embodiment there may be two inductors of the first set of inductors 2003 provided in parallel with each other (but separated by the first capacitor 2007 and the switched capacitor array 2009), although any suitable number of individual inductors may be utilized.

The second set of inductors 2005 are manufactured in order to provide nL/2 of the overall inductance for the digital controlled oscillators 1703. In an embodiment there may be two inductors of the second set of inductors 2005 provided in parallel with each other (but separated by the switched capacitor array 2009). Additionally, individual ones of the second set of inductors 2005 are in series with individual ones of the first set of inductors 2003.

The first capacitor 2007 is connected between the second set of inductors 2005 and the active feedback device 130A. In an embodiment the first capacitor 2007 may have a capacitance of between about 0.1 pF and about 2 pF, such as about 1 pF. However, any suitable capacitance may be utilized. Additionally, the first capacitor 2007 is connected at a first node 2011 and a second node 2013 to the active feedback device 130A, and the first node and second node may also be connected to either the output transmission line or an output to another digital controlled oscillator.

The switched capacitor array 2009 is utilized to receive the signals from the decoder 1903 (in FIG. 19) and to modify the natural frequency of the digital controlled oscillator 1703 in which it is located. In an embodiment the switched capacitor array 2009 comprises a plurality of switch capacitors 2100 and is located in the middle of the first set of inductors 2003 and the second set of inductors 2005. However, any suitable location may be utilized.

Figure 21:
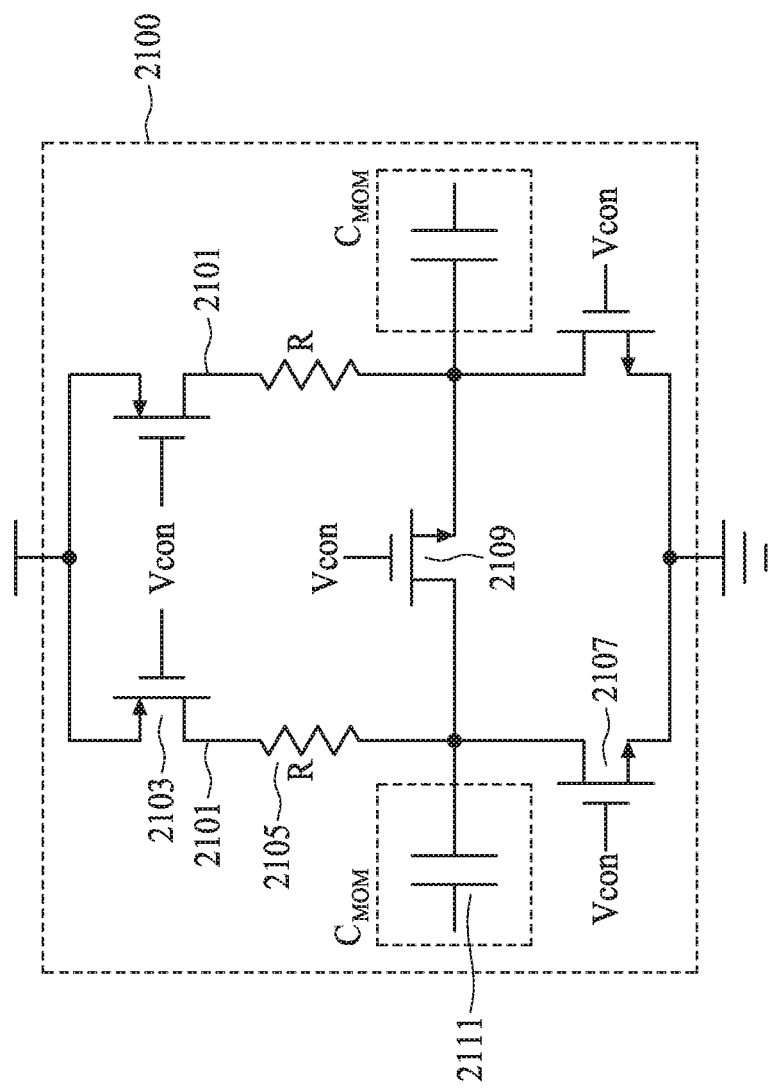
FIG. 21 is a switched capacitor in accordance with one or more embodiments.

FIG. 21 illustrates one embodiment of a structure formed using NMOS structures that may be utilized as one of the switch capacitors 2100 in the switched capacitor array 2009. In this embodiment two lines 2101 are connected between power and ground connectors, with each line 2101 comprises a first switch 2103, a resistor 2105 (with a resistance of between about 1 Kohm and about 100 Kohm), and a second switch 2107. A third switch 2109 is connected between the two lines 2101.

Also connected to each line is a second capacitor 2111. In an embodiment each of the second capacitors 2111 is a metal-oxide-metal capacitor, although any other suitable capacitor, such as a metal-insulator-metal capacitor, may also be used. The second capacitors 2111 may each have a capacitance between about 0.2 pF and about 4 pF, such as about 2 pF. However, any suitable capacitance may be utilized.

The second capacitors 2111 also act as the outputs from the switched capacitors 2100 to either other switched capacitors 2100 within the switched capacitor array 2009 or to the rest of the digital controlled oscillator 1703. For example, while one side of the second capacitors 2111 is connected to the lines 2101, the other side of the second capacitors 2111 is connected to external devices. However, any suitable connections may be utilized.

In operation, each of the first switch 2103, the second switch 2107, and the third switch 2109 are connected to the decoder 1903. In a particular embodiment, the decoder 1903 sends a control voltage ($V_{con}$) to the first switch 2103, the second switch 2107, and the third switch 2109 in order to turn on or turn off the individual switch capacitors 2100 within the switch capacitor array 2009. In an embodiment the control voltage $V_{con}$ may be less than about 1.8 V, such as about 0.8 V. However, any suitable voltage may be utilized.

Additionally, the switch capacitors 2100 illustrated in FIG. 21 is one of a plurality of switch capacitors 2100 within the switch capacitor array 2009 (see FIG. 20) of each of the digital controlled oscillators 1703. In an embodiment the switch capacitor array 2009 may comprise between 1 and 1000 switch capacitors 2100, such as about 100 switch capacitors 2100 within the switch capacitor array 2009. However, any suitable number of switch capacitors 2100 may be utilized. The decoder 1903 can turn individual ones of the switch capacitors 2100 within the switch capacitor array 2009 in order to tune the natural frequency and improve the frequency resolution of the individual digital controlled oscillators 1703.

Figure 22:
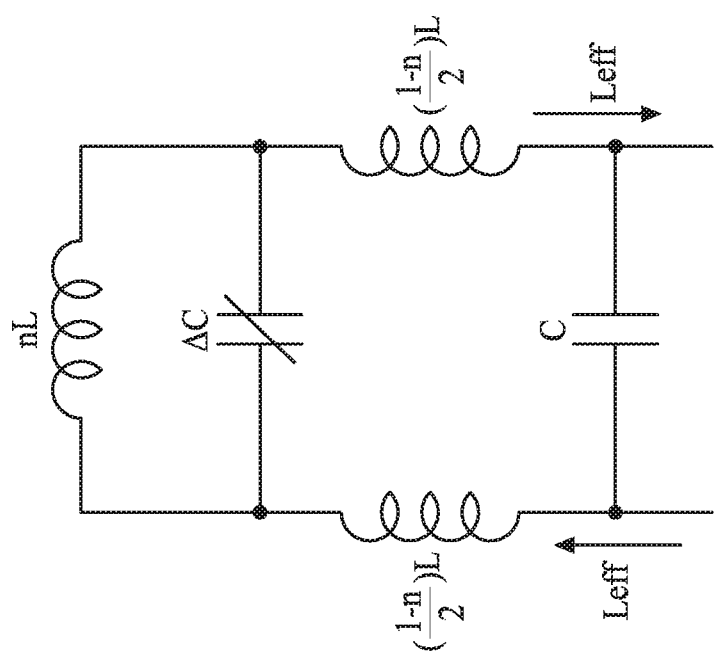
FIG. 22 is a model of the digital controlled oscillator in accordance with one or more embodiments.

FIG. 22 illustrates a model of the overall transformer including the digital controlled oscillators 1703 that may be utilized to illustrate the improvement in frequency resolution using embodiments. For example, a model of the digital controlled oscillator 1703 illustrated in FIG. 21 describes the equivalent inductance $L_{eq}$ approximated as illustrated in Equation 1:

$$L_{eq} = L + n^2 L \frac{C_{SC}}{C} \quad \text{Equation 1}$$

Where L is the total inductance, C is the total capacitance, n is the number of switched capacitors 2100 in the switched capacitor array 2009 and $C_{SC}$ is the capacitance of the switch capacitor array 2009. With this model, the oscillation frequency of the digital controlled oscillator 1703 will be given by Equation 2:

$$\omega_{eq} = \frac{1}{\sqrt{L_{eq} \cdot C}} = \frac{1}{\sqrt{LC\left(1 + n^2 \frac{C_{SC}}{C}\right)}} \quad \text{Equation 2}$$

As can be seen, the $C_{SC}$ is shrunk by $n^2$ times. For example, in an embodiment in which n=¼, the capacitor shrinking factor will be 16 and the frequency resolution is improved 16 times. The n in this equation may be between about 1/10 and about 1, such as about ¼.

By turning on or turning off individual ones of the switch capacitors 2100 within the switch capacitor array 2009, the decoder can modify and tune the natural frequency of individual ones of the digital controlled oscillators 1703 until the phase error $\Phi_{error}$ detected by the skew detector 1905 (see FIG. 19) between the first high frequency signal CKV and the second high frequency signal CKR is either eliminated or minimized. In particular, the equivalent capacitance of the switched capacitor array 2009 is modified as $V_{con}$ turns individual ones of the switch capacitors 2100 within the switch capacitor array 2009 on and off. This modification of the equivalent capacitance of the switched capacitor array 2009 can be used to control the frequency resolution of the overall digital controlled oscillator, with the resolution of the switch capacitor array 2009 being limited by the minimum value of the second capacitor 2111.

By modifying the equivalent capacitance of the switched capacitor array 2009, the natural frequency of the digital controlled oscillator 1703 may be modified. In particular, the decoder 1903 may control the digital controlled oscillator 1703 in order to modify the natural frequency in order to reduce or eliminate the phase error $\Phi_{error}$ between coupled ones of the digital controlled oscillators (see FIG. 19).

Figure 23:
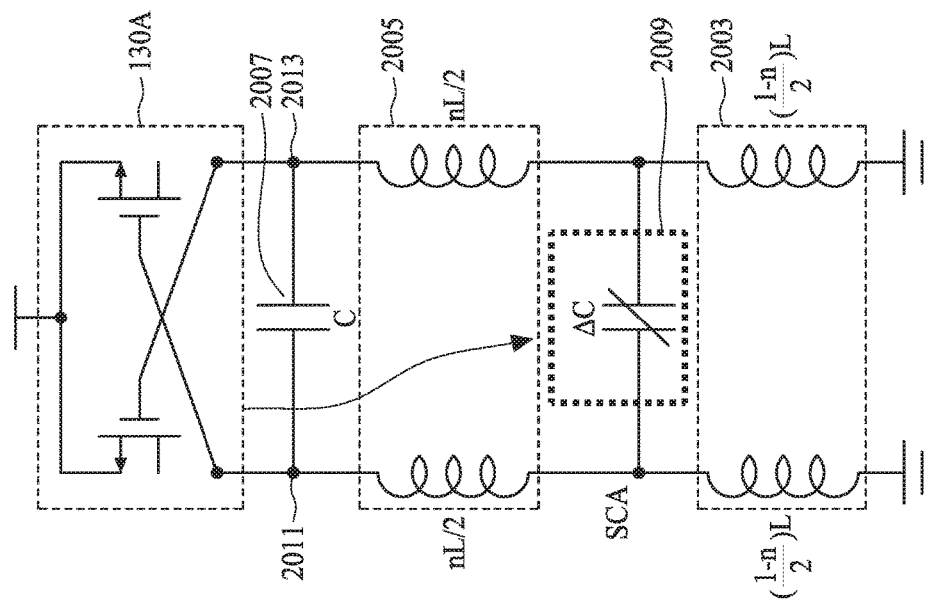
FIG. 23 is another digital controlled oscillator in accordance with one or more embodiments.

FIG. 23 illustrates another embodiment of a structure which may be used as the digital controlled oscillator 1703. In this embodiment the active feedback device 130A is connected to power, and the active feedback device may comprise a PMOS devices (instead of NMOS devices as described above with respect to FIG. 20). Additionally, the second set of inductors 2005 (with an inductance of nL/2) are connected to the active feedback device 130A, with the first set of inductors 2003 (with an inductance of (1−n)L/2) connecting the second set of inductors 2005 to ground. Additionally, the first capacitor 2007 is connected between the second set of inductors 2005 and the active feedback device 130A, while the switched capacitor array 2009 is connected between the first set of inductors 2003 and the second set of inductors 2005.

Figure 24:
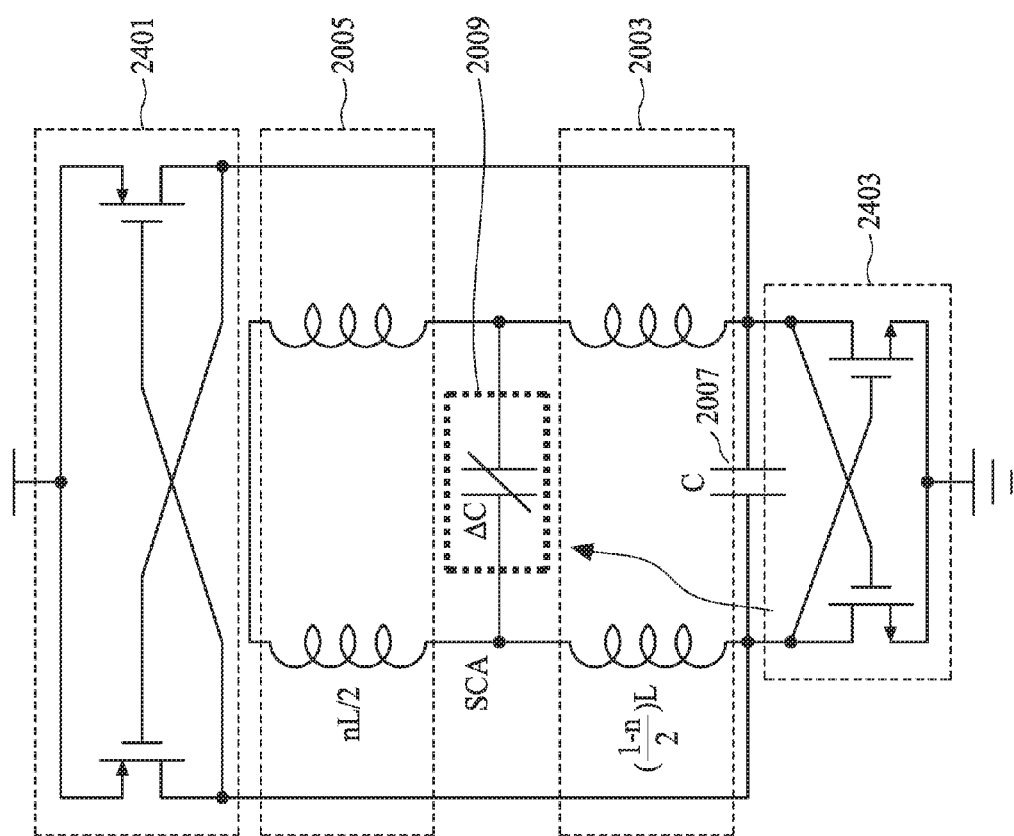
FIG. 24 is another digital controlled oscillator in accordance with one or more embodiments.

FIG. 24 illustrates yet another embodiment of a structure which may be used as the digital controlled oscillator 1703, but which uses both PMOS transistors and NMOS transistors. In this embodiment, a first active feedback device 2401 (comprising PMOS devices) is connected to power while a second active feedback device 2403 (comprising NMOS devices) is connected to ground. In an embodiment the first active feedback device 2401 and the second active feedback device 2403 may be similar to the active feedback device 130A described above with respect to FIG. 1, but with their respective devices as described herein.

Additionally in this embodiment, the first set of inductors 2003 (with an inductance of (1−n)L/2) is connected between the first active feedback device 2401 and the second active feedback device 2403. The second set of inductors 2005 is connected to the first set of inductors 2003, with individual ones of the second set of inductors 2005 being in series with individual ones of the first set of inductors 2003. Finally, the first capacitor 2007 is connected between the first set of inductors 2003 and the second active feedback device 2403 while the switch capacitor array 2009 is connected between the first set of inductors 2003 and the second set of inductors 2005. However, any suitable arrangement of structures may be utilized.

By having multiple configurations which may be used for different types of processes (CMOS, NMOS, PMOS), there is greater design flexibility. For example, the specific design of the digital controlled oscillator 1703 may be chosen for an easy incorporation into the overall design processes. Such flexibility makes the overall design easier to generate.

As described herein, in some embodiments a pulse injection signal may be injected into an oscillator. The pulse injection signal may cause the oscillator to "lock" to the frequency of the pulse injection signal and generate an oscillating signal having a predetermined frequency that is an integer multiple of the frequency of the pulse injection signal. In some devices, the predetermined frequency of the oscillator and the frequency of the pulse injection must be within a certain "locking range" for the frequency lock to occur.

The pulse injection signal may be configured to be injected to an oscillator using a "common mode" or a "differential mode." In a "common mode," for example as depicted in FIG. 1, a capacitive device (such as capacitive device 120A) may be connected in parallel to a switch device (such as switch device 140A) that is used to inject the pulse injection signal into the oscillator, and the switch device may connect or disconnect two complementary output nodes (such as nodes 152A and 154A) of the oscillator in accordance with a current value of the pulse injection signal. In a "differential mode," a positive signal injector may be used to inject a positive reference signal to a first output node of the oscillator device, and a negative pulse injector may be used to inject a negative reference signal to a second output node of the oscillator device, where the negative reference signal is the opposite of the positive reference signal. Compared to the common mode, the differential mode may improve the locking range between the frequency of the oscillating signals produced by the oscillator device and the frequency of the injected pulse signals. In some devices, compared to the common mode, the differential mode may improve the locking range by six times or more. The frequency lock between the oscillator device and the pulse injection signal may be improved. For example, if the oscillator experiences frequency drift due to process variations, temperature variations, or supply variations, the probability that the frequency drift will cause the oscillator device to drift out of the locking range, and thereby unlock from the frequency of the pulse injection signal, may be minimized.

Figure 25:
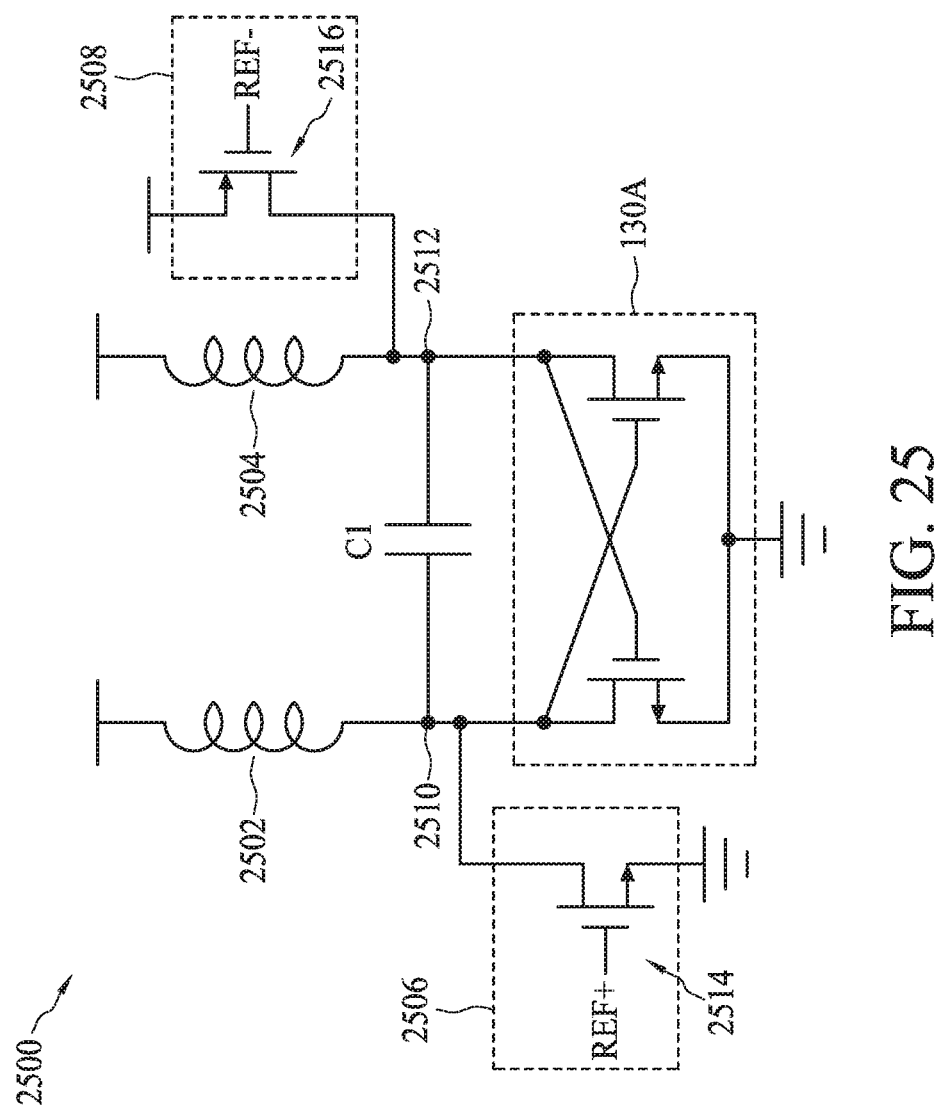
FIG. 25 is an oscillator in accordance with one or more embodiments.

FIG. 25 is an embodiment of an oscillator circuit 2500 with differential pulse injection. The circuit 2500 may have a first inductor 2502, a second inductor 2504, a capacitor C1, an active feedback device 130A, a positive pulse injector 2506, and a negative pulse injector 2508.

First inductor 2502 may have a first terminal connected to a supply voltage and a second terminal connected to an output node 2510. Second inductor 2504 may have a first terminal connected to a supply voltage and a second terminal connected to complementary output node 2512. Capacitor C1 may have a first terminal connected to output node 2510 and a second terminal connected to complementary output node 2512. Active feedback device 130A may have a first terminal connected to output node 2510, a second terminal connected to complementary output node 2512, and a third terminal connected to a ground node. In some embodiments, active feedback device 130A is the same as or similar to the active feedback device described earlier in connection with FIG. 1.

A positive pulse injector 2506 may also be connected to node 2510. In some embodiments, positive pulse injector 2506 may comprise a transistor 2514. Transistor 2514 is a NMOS transistor in some embodiments. A source terminal of transistor 2514 may be connected to a ground node. A gate terminal of transistor 2514 may be connected to a positive reference signal REF+. A drain terminal of transistor 2514 may be connected to output node 2510.

A negative pulse injector 2508 may be connected to output node 2512. In some embodiments, a negative pulse injector 2508 may comprises a transistor 2516. Transistor 2516 is a PMOS transistor in some embodiments. A source terminal of transistor 2516 may be connected to a supply voltage. A drain terminal of transistor 2516 may be connected to node 2512. A gate terminal of transistor 2516 may be connected to a negative reference signal REF−. The negative reference signal REF− is the inverse of the positive reference signal REF+ in some embodiments. For example, when REF+ is high, REF− is low, and when REF+ is low, REF− is high.

In operation, a frequency of oscillating signals produced by oscillator circuit 2500 at output node 2510 and complementary output node 2512 may lock to an integer multiple of the frequency of the positive injection pulse REF+ and the negative pulse REF−. In some embodiments, oscillator circuit 2500 with the positive injection pulse REF+ and the negative pulse REF− may reject certain harmonics, such as even-order harmonics, thereby improving the locking range. Compared to the common mode, the locking range between the frequency of the oscillating signals produced by oscillator circuit 2500 and the frequency of the reference pulse signals REF+ and REF− may increase by six times or more. For example, in some embodiments the locking range may increase by 6.7 times compared to the common mode.

Figure 26:
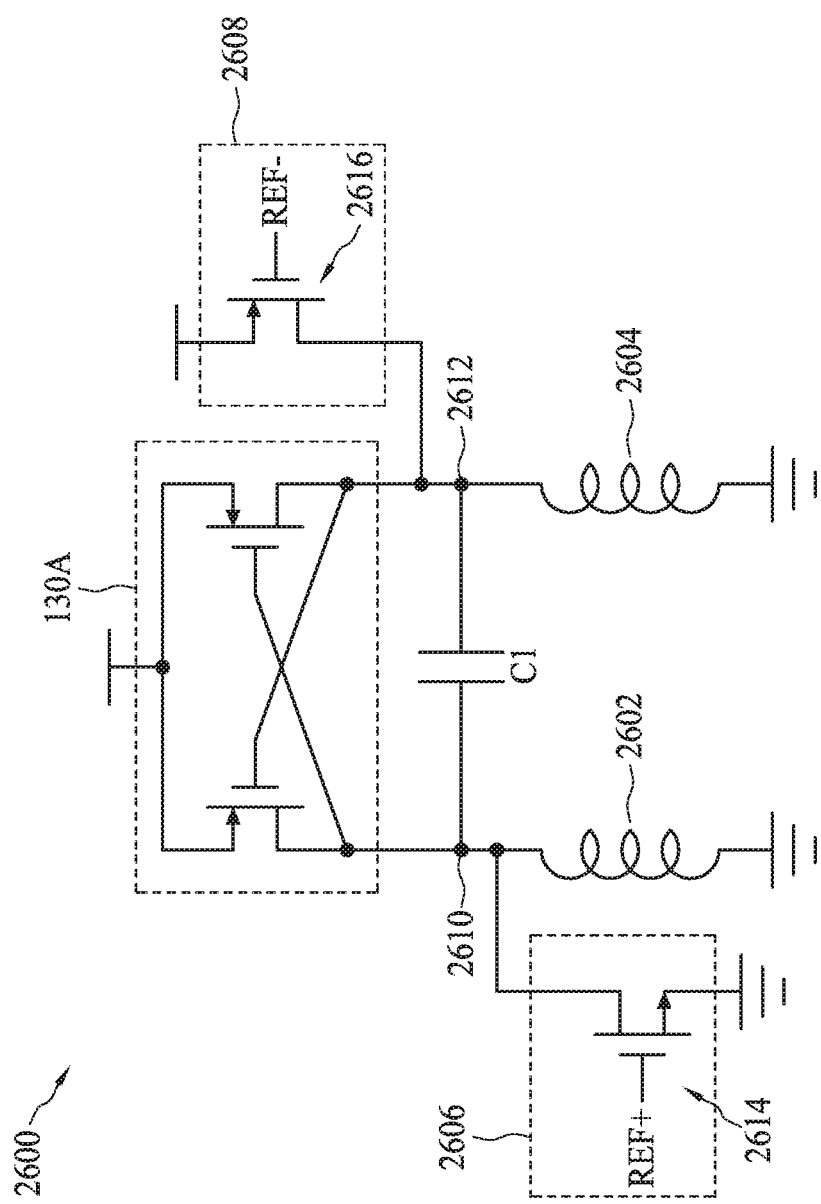
FIG. 26 is an oscillator in accordance with one or more embodiments.

FIG. 26 is an embodiment of an oscillator circuit 2600 with differential pulse injection. The circuit 2600 may have a first inductor 2602, a second inductor 2604, a capacitor C1, an active feedback device 130A, a positive pulse injector 2606, and a negative pulse injector 2608. Compared to the oscillator circuit 2500 depicted in FIG. 25, the positions of the first inductor and the second inductor, and the position of the active feedback device 130A, have been switched.

Active feedback device 130A may have a first terminal connected to a supply voltage, a second terminal connected to node 2610, and a third terminal connected to node 2612. In some embodiments, active feedback device 130A is the same as or similar to the active feedback device described earlier in connection with FIG. 1. Capacitor C1 may have a first terminal connected to node 2610 and a second terminal connected to node 2612. A first inductor 2602 may have a first terminal connected to node 2610 and a second terminal that is grounded. A second inductor 2604 may have a first terminal connected to node 2612 and a second terminal that is grounded.

A positive pulse injector 2606 may also be connected to node 2610. In some embodiments, positive pulse injector 2606 may comprise a transistor 2614. Transistor 2614 is a NMOS transistor in some embodiments. A source terminal of transistor 2614 may be connected to a ground node. A gate terminal of transistor 2614 may be connected to a positive reference signal REF+. A drain terminal of transistor 2614 may be connected to node 2610.

A negative pulse injector 2608 may be connected to node 2612. In some embodiments, a negative pulse injector 2608 may comprises a transistor 2616. Transistor 2616 is a PMOS transistor in some embodiments. A source terminal of transistor 2616 may be connected to a supply voltage. A drain terminal of transistor 2616 may be connected to node 2612. A gate terminal of transistor 2616 may be connected to a negative reference signal REF−. The negative reference signal REF− is the inverse of the positive reference signal REF+ in some embodiments. For example, when REF+ is high, REF− is low, and when REF+ is low, REF− is high.

In operation, a frequency of oscillating signals produced by oscillator circuit 2600 may lock to an integer multiple of the frequency of the positive injection pulse REF+ and the negative pulse REF−. In some embodiments, oscillator circuit 2600 with the positive injection pulse REF+ and the negative pulse REF− may reject certain harmonics, such as even-order harmonics, thereby improving the locking range.

Compared to the common mode, the locking range between the oscillating signals produced by oscillator circuit 2600 and the frequency of the reference pulse signals REF+ and REF− may increase by six times or more. For example, in some embodiments the locking range may increase by 6.7 times compared to the common mode.

Figure 27:
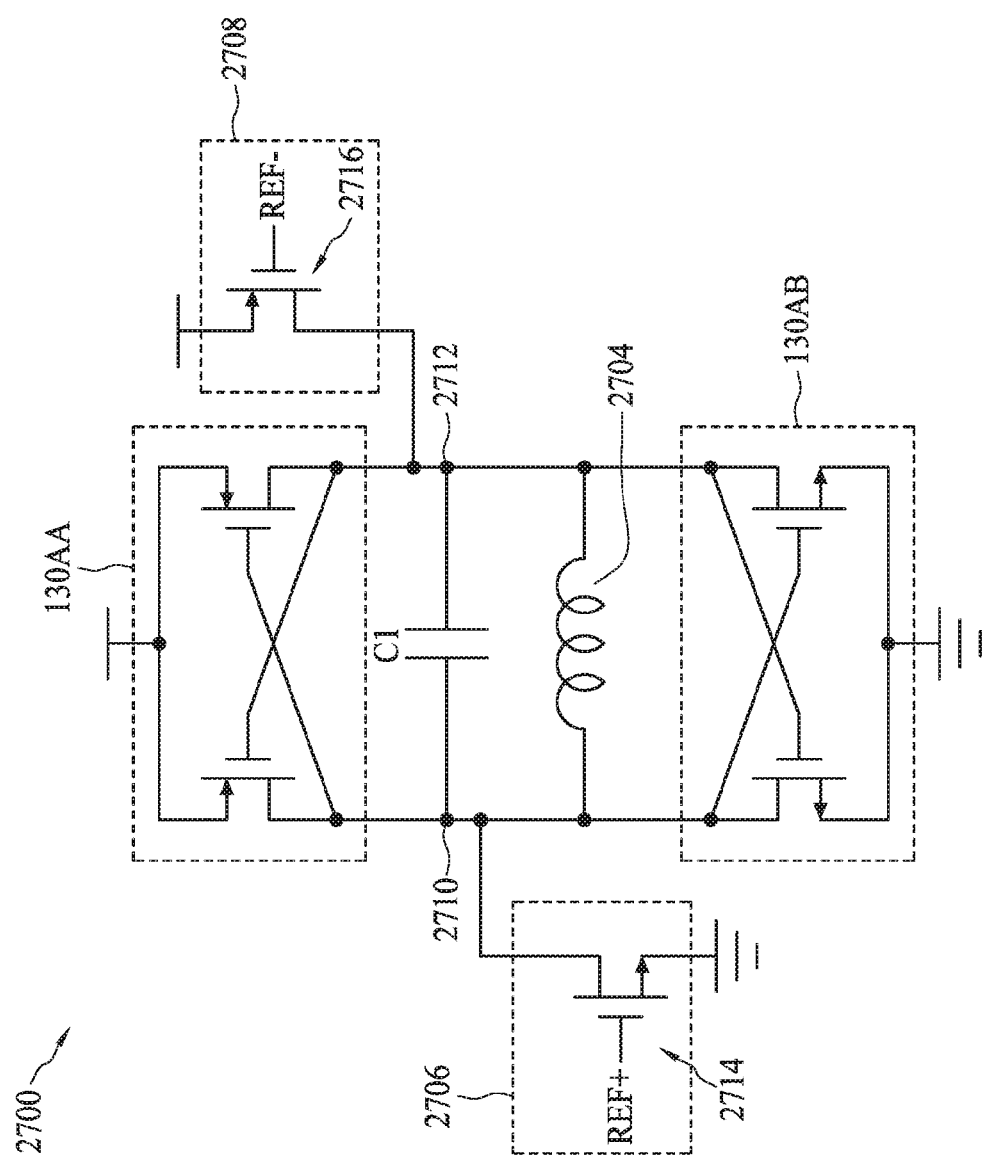
FIG. 27 is an oscillator in accordance with one or more embodiments.

FIG. 27 is an example of an oscillator circuit 2700 with differential pulse injection. The circuit 2700 may have a first inductor 2704, a capacitor C1, a first active feedback device 130AA, a second active feedback device 130AB, a positive pulse injector 2706, and a negative pulse injector 2708. Compared to the oscillator circuit 2500 depicted in FIG. 25 and the oscillator circuit 2600 depicted in FIG. 26, oscillator circuit 2700 includes only a first inductor 2704 but includes both a first active feedback device 130AA and a second active feedback device 130AB.

Active feedback device 130AA may have a first terminal connected to a supply voltage, a second terminal connected to node 2710, and a third terminal connected to node 2712. Capacitor C1 may have a first terminal connected to node 2710 and a second terminal connected to node 2712. First inductor 2704 may be connected in parallel to capacitor C1. A first terminal of first inductor 2704 may be connected to node 2710 and a second terminal of first inductor 2704 may be connected to node 2712. Second active feedback device 130AB may have a first terminal that is connected to node 2710, a second terminal that is connected to node 2712, and a third node that is grounded.

A positive pulse injector 2706 may also be connected to node 2710. In some embodiments, positive pulse injector 2706 may comprise a transistor 2714. Transistor 2714 is a NMOS transistor in some embodiments. A source terminal of transistor 2714 may be connected to a ground node. A gate terminal of transistor 2714 may be connected to a positive reference signal REF+. A drain terminal of transistor 2714 may be connected to node 2710.

A negative pulse injector 2708 may be connected to node 2712. In some embodiments, negative pulse injector 2708 may comprise a transistor 2716. Transistor 2716 is a PMOS transistor in some embodiments. A source terminal of transistor 2716 may be connected to a supply voltage. A drain terminal of transistor 2716 may be connected to node 2712. A gate terminal of transistor 2716 may be connected to a negative reference signal REF−. The negative reference signal REF− is the inverse of the positive reference signal REF+ in some embodiments. For example, when REF+ is high, REF− is low, and when REF+ is low, REF− is high.

In operation, a predetermined frequency of oscillating signals produced by oscillator circuit 2700 may lock to an integer multiple of the frequency of the positive injection pulse REF+ and the negative pulse REF−. In some embodiments, oscillator circuit 2700 with the positive injection pulse REF+ and the negative pulse REF− may reject certain harmonics, such as even-order harmonics, thereby improving the locking range. Compared to the common mode, the locking range between the oscillating signals generated by oscillator circuit 2700 and the frequency of the reference pulse signals REF+ and REF− may increase by six times or more. For example, in some embodiments the locking range may increase by 6.7 times compared to the common mode.

Figure 28:
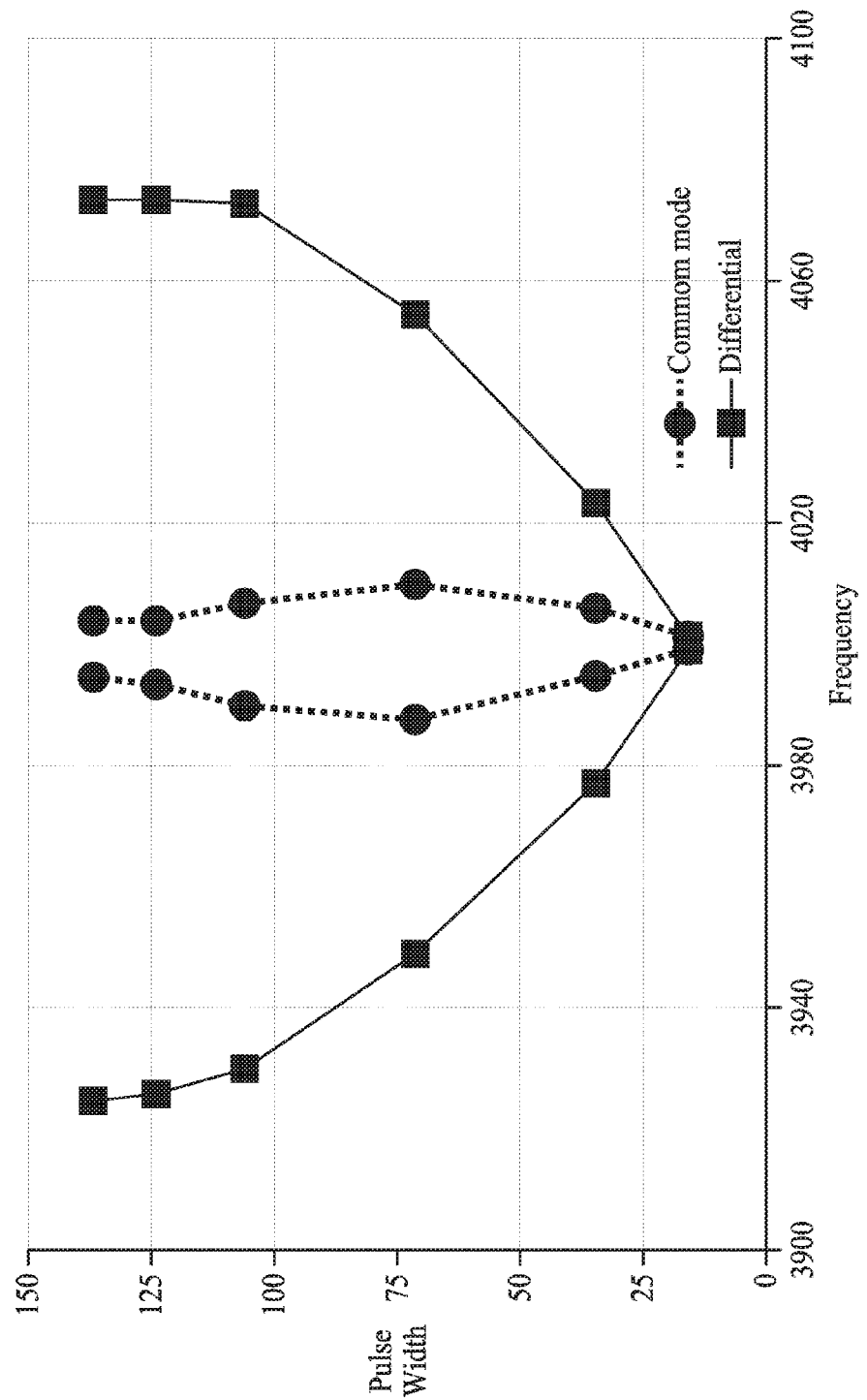
FIG. 28 is a graph depicting pulse width vs frequency for an oscillator in a common mode and a differential mode in accordance with one or more embodiments.

FIG. 28 depicts a graph showing pulse width of the injected signal versus the frequency of the signals produced by an oscillator for both the common mode and the differential mode in accordance with some embodiments. As shown in FIG. 28, as compared to the common mode, the differential mode has a locking range that is much larger. For example, when the oscillator produces oscillating signals having a frequency of 4 GHz, the locking range of the differential mode may be 6.7 times the size of the common mode.

As described herein, in some embodiments a pulse injection signal may be injected to an oscillator to cause the oscillator to create an oscillating signal having a predetermined frequency that is an integer multiple of the frequency of the pulse injected signal. In a "common mode," a capacitive device may be connected in parallel to a switch device that is used to inject the pulse injection signal into the oscillator. In a "differential mode," a positive signal injector may be used to inject to a positive reference signal to a first output node of the oscillator device, and a negative pulse injector may be used to inject a negative reference signal to a second output node of the oscillator device, where the negative reference signal is the opposite of the positive reference signal. Compared to the common mode, the differential mode may improve the locking range between the frequency of the oscillating signals produced by the oscillator and the frequency of the injected pulse signal. In some devices, compared to the common mode, the differential mode may improve the locking range by 6 times or more. The frequency lock between the oscillator device and the pulse injection signal may be improved. For example, if the oscillator device experiences frequency drift due to process variations, temperature variations, or supply variations, the probability that the frequency drift will cause the oscillator device to drift out of the locking range, and thereby unlock from the frequency of the pulse injection signal, may be minimized.

As described above, in some embodiments a pulse injection signal may be injected to an oscillator. In some devices, a delay cell circuit may be used to generate a pulse injection signal. For example, a pulse injection signal may be generated by comparing a first signal to a second signal, where one of the first and the second signals is delayed with respect to the other signal. However, common delay cell circuits may create undesirable noise in the pulse injection signal. For example, common delay cell circuits may degrade the slew rate of the rising and falling edge of the pulse signal and create undesirable noise.

Figure 29:
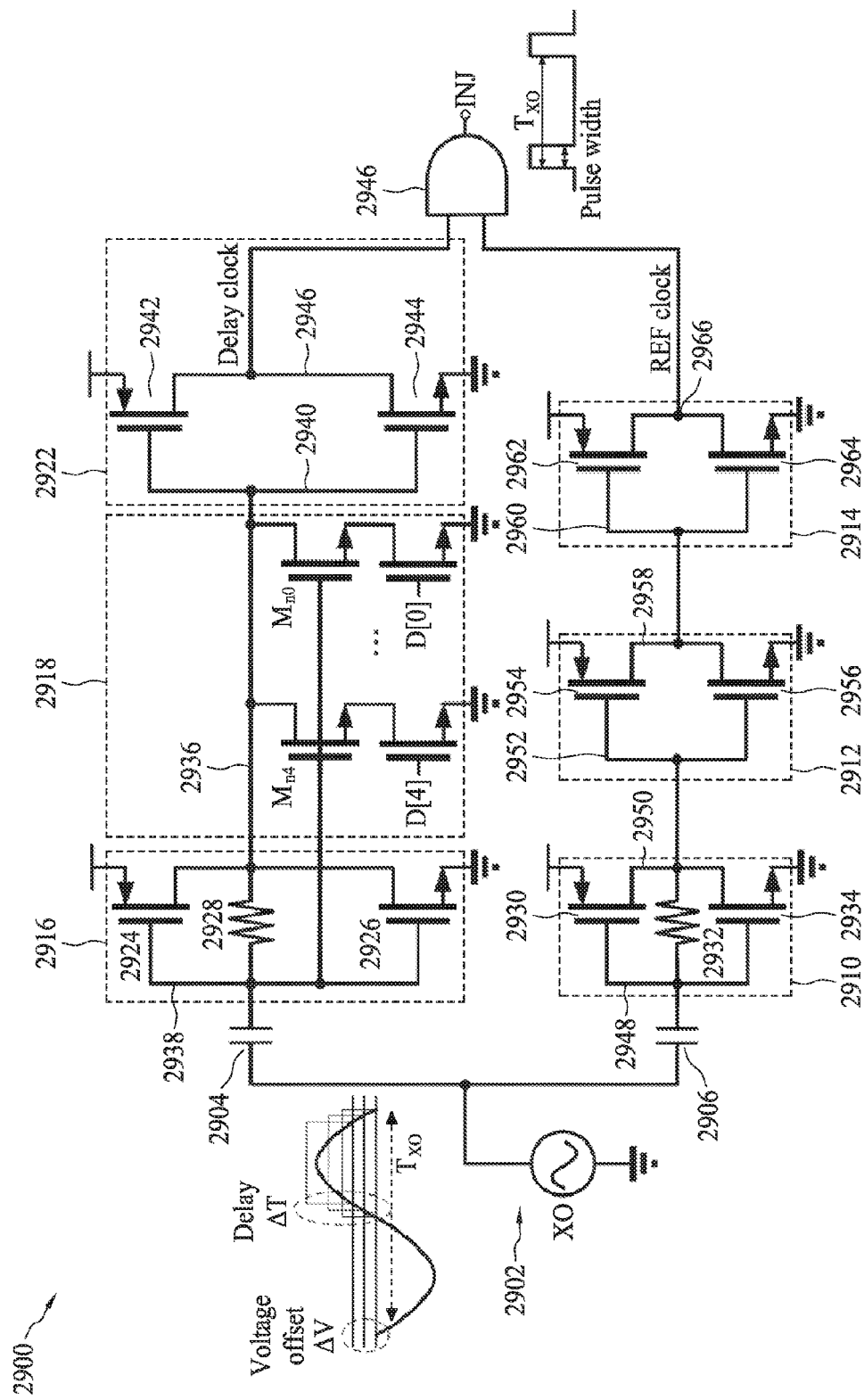
FIG. 29 is a pulse signal generator in accordance with one or more embodiments.

FIG. 29 depicts an embodiment of a circuit 2900 that may generate a pulse signal using a first signal having a programmable delay. By using a first signal with a programmable delay, the circuit 2900 avoids the use of common delay cell circuits to generate a pulse signal. As such, the pulse signal produced by the circuit 2900 may have less noise.

As shown in FIG. 29, a crystal oscillator 2902 generates a sinusoidal signal. An output of the crystal oscillator 2902 is connected to an input of a first coupling capacitor 2904 and a second coupling capacitor 2906.

An output of the first coupling capacitor 2904 is connected to inverter 2916. In some embodiments, inverter 2916 may include a transistor 2924 and a transistor 2926. In some embodiments, transistor 2924 is a PMOS transistor and transistor 2926 is an NMOS transistor. The output of first coupling capacitor 2904 may be connected to input node 2938. A gate terminal of transistor 2924 and a gate terminal of transistor 2926 may also be connected to input node 2938. A source terminal of the transistor 2924 may be connected to a supply voltage and a drain terminal of the transistor 2924 may be connected to output node 2936. A drain terminal of the transistor 2926 may also be connected to output node 2936. A source transistor of the transistor 2926 may be grounded. A resistor 2928 may be connected between input node 2938 and output node 2936.

The inverter 2916 may be connected to pull down block 2918. Pull down block 2918 includes one or more pull down branches $M_{ni}$, each of which comprises a first transistor and a second transistor. The first transistor and the second transistor are NMOS transistors in some embodiments. Two pull down branches $M_{ni}$ are depicted in FIG. 29. In some embodiments, up to five pull down branches $M_{ni}$ may be used. For example, i may be an integer from 0 to 4 inclusive. In each pull down branch, the first transistor may have a drain terminal connected to output node 2936 of the inverter 2916, a gate terminal connected to the input node 2938 of the inverter 2916, and a source terminal connected to a drain terminal of the second NMOS transistor. The second transistor may have a gate terminal connected to a programmable input signal D[i], where i may be an integer from 0 to 4. A source terminal of the second transistor may be grounded.

Pull down block 2918 and inverter 2916 may each be connected to inverter 2922. For example, an input node 2940 of inverter 2922 may be connected to output node 2936 of inverter 2916 and to a respective drain terminal of each first transistor of each pull down branch $M_{ni}$. Inverter 2922 may include a PMOS transistor 2942 and an NMOS transistor 2944. A source terminal of PMOS transistor 2942 is connected to a supply voltage, a gate terminal of transistor 2942 is connected to input node 2940, and a drain terminal of transistor 2942 is connected to inverter output node 2946. A drain terminal of transistor 2944 is connected to inverter output node 2946, a gate terminal of transistor 2944 is connected to input node 2940, and a source terminal of transistor 2944 is grounded.

A comparator 2946 has an input terminal that is connected to output node 2946. In some embodiments, comparator 2946 comprises an AND gate.

As discussed above, the output of crystal oscillator 2902 may be connected to a first terminal of second coupling capacitor 2906. A second terminal of second coupling capacitor 2906 may be connected to input node 2948 of inverter 2910. Inverter 2910 may include a transistor 2930, a resistor 2932, and a transistor 2934. In some embodiments, transistor 2930 is a PMOS transistor and transistor 2934 is an NMOS transistor. A source terminal of transistor 2930 may be connected to a supply voltage. A gate terminal of transistor 2930 may be connected to input node 2948. A drain terminal of transistor 2930 may be connected to output node 2950. Resistor 2932 may have a first terminal connected to input node 2948 and a second terminal connected to output node 2950. Transistor 2934 may have a drain terminal connected to output node 2950, a gate terminal connected to input node 2948, and a source terminal that is grounded.

Inverter 2910 may be connected to inverter 2912. For example, output node 2950 of inverter 2910 may be connected to input node 2952 of inverter 2912. Inverter 2912 may include a transistor 2954 and a transistor 2956. In some embodiments, transistor 2954 is a PMOS transistor and transistor 2956 is an NMOS transistor. A source terminal of transistor 2954 may be connected to a supply voltage, a gate terminal of transistor 2954 may be connected to input node 2952, and a drain terminal of transistor 2954 may be connected to output node 2958. A drain terminal of transistor 2956 may be connected to output node 2958, a gate terminal of transistor 2956 may be connected to input node 2952, and a source terminal of transistor 2956 may be grounded.

Inverter 2912 may be connected to inverter 2914. For example, output node 2958 of inverter 2912 may be connected to input node 2960 of inverter 2914. Inverter 2914 may include a transistor 2962 and a transistor 2964. In some embodiments, transistor 2962 is a PMOS transistor and transistor 2964 is an NMOS transistor. A source terminal of transistor 2962 may be connected to a supply voltage, a gate terminal of transistor 2962 may be connected to input node 2960, and a drain terminal of transistor 2962 may be connected to output node 2966. A drain terminal of transistor 2964 may be connected to output node 2966, a gate terminal of transistor 2964 may be connected to input node 2960, and a source terminal of transistor 2964 may be grounded.

Output node 2966 of inverter 2914 may be connected to a second terminal of comparator 2946. An output of the comparator 2946 may be connected to an oscillator. For example, the output of the comparator 2946 may be connected to switch devices 140A and/or 140B of FIG. 1 using buses 170A and/or 170B. As another example, the output of comparator 2946 may be connected to driver 520 of FIG. 5.

Circuit 2900 may generate a pulse signal INJ. While the pulse signal is designated as INJ in connection with FIGS. 29-31, the pulse injection signal is labeled with other designations in other Figures, such as REF+ or REF− in FIGS. 25-27. Further, for avoidance of doubt it is noted that the REF clock signal in FIGS. 25-27 may be a different signal than the REF, REF+, and/or REF− signals discussed in connection with previous Figures.

Figure 31:
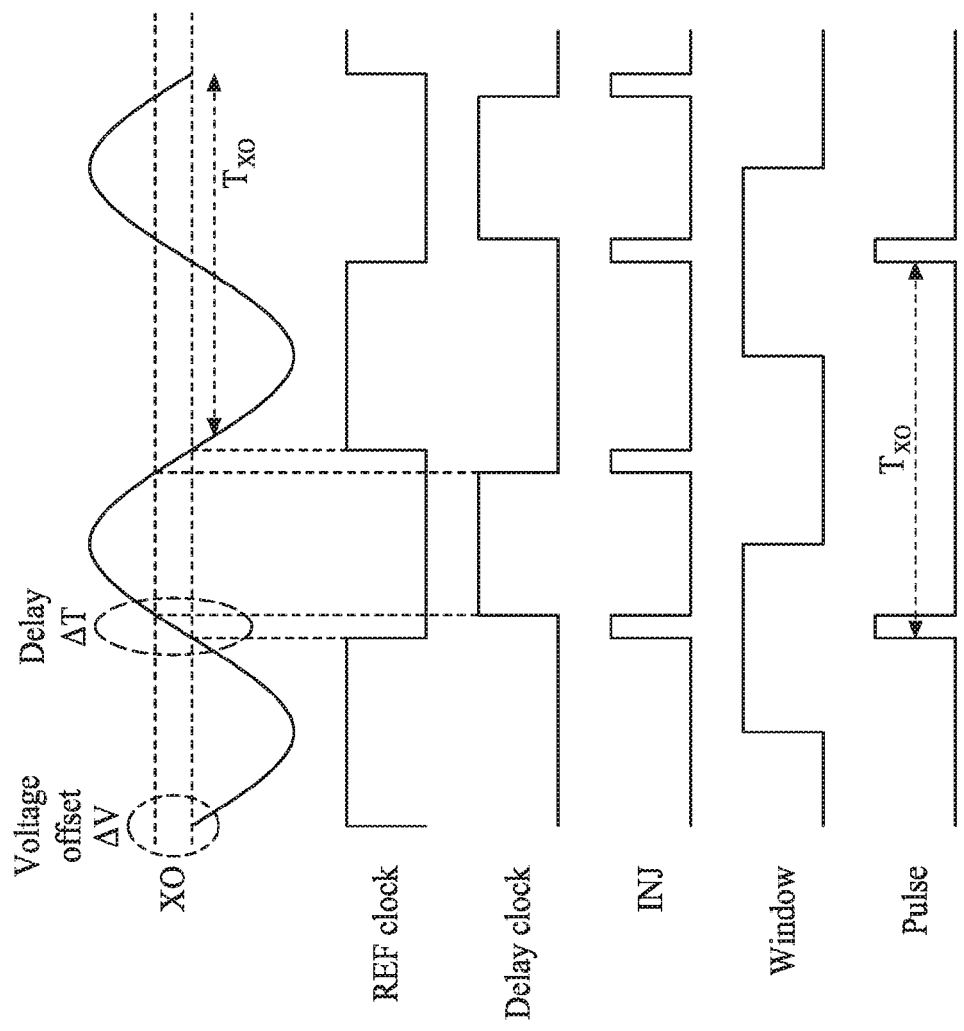
FIG. 31 is a timing diagram for a pulse signal generator in accordance with one or more embodiments.

During operation, crystal oscillator 2902 may generate a sinusoidal signal. In the top half of the circuit, first coupling capacitor 2904, inverter 2916, pull down block 2918, and inverter 2922 generate a delay clock signal. In the bottom half of the circuit, second coupling capacitor 2906, inverter 2910, inverter 2912, and inverter 2914 generate a REF clock signal. Comparator 2946 compares the delay clock signal to the REF clock signal, and generates pulse signal INJ according to the results of the comparison. A timing diagram of the sinusoidal signal generated by crystal oscillator 2902, the delay clock signal, the REF clock signal, and the pulse signal INJ, is shown in FIG. 31.

As discussed above, the delay clock signal is generated by first coupling capacitor 2904, inverter 2916, pull down block 2918, and inverter 2922. A sinusoidal signal output from crystal oscillator 2902 is input into input node 2938 of inverter 2916. Inverter 2916 converts the sinusoidal signal into a square wave signal having an opposite polarity from the input sinusoidal signal, where the square wave signal has a high value or a low value. Whether the square wave signal has a high value or a low value depends on the value of the sinusoidal signal at a current instance and on a threshold voltage of the inverter. For example, when the voltage of the sinusoidal signal is below the threshold voltage of the inverter, the square wave signal that is output from inverter 2916 is a high value. When the sinusoidal signal has a voltage level that is above the threshold voltage of the inverter, the square wave signal that is output from inverter 2916 is a low value.

Inverter 2922 inverts the value of the input square wave that is received from inverter 2916 and outputs a square wave (the delay clock signal) that is the substantial inverse of the input square wave. For example, when the signal at input node 2940 has a low value, the delay clock signal has a high value. When the signal an input node 2940 has a high value, the delay clock signal has a low value.

As discussed above, in some embodiments it may be desirable to generate a first signal having a programmable delay, which may in turn be used to generate a pulse signal having a desired pulse width. In some embodiments, one or more of control signals D[0]-D[i] may be used to produce a square wave having a programmable edge delay, which may control a pulse width of the INJ signal produced by circuit 2900.

In each pull down branch, the first transistor $M_{ni}$ is activated when the value of the sinusoidal signal that is passed through the first coupling capacitor 2904 has a sufficient voltage to turn on the first transistor $M_{ni}$. The second transistor of each pull down branch may be activated when the respective control signal D[0]-D[i] is activated, As such, each respective pull down branch is activated when the value of the sinusoidal signal that is passed through the first coupling capacitor 2904 has a sufficient voltage to turn on the first transistor $M_{ni}$ and when the respective control signal D[0]-D[i] is activated.

When one or more of the pull down branches is activated, the effect of the activation is to effectively increase the strength of transistor 2926, and adjust the voltage threshold of inverter 2916 so that a higher voltage is required for the inverter 2916 to output a square wave having a low value instead of a high value. The higher the number of pull down branches that are active, the higher the voltage threshold of inverter 2916 is adjusted.

The increase in the threshold voltage of inverter 2916 results in a shorter period of time in which the sinusoidal signal that is passed through first coupling capacitor 2904 has a voltage that is high enough to cause the inverter 2916 to output a low signal. In effect, the time instance in which the output of inverter 2916 changes from a high output value to a low output value is delayed with respect to when the output signal from inverter 2916 would have changed without the pull down branches being active, because it takes longer for the input sinusoidal signal to reach the higher threshold voltage. Further, the time instance in which the output of inverter 2916 changes from a low output value to a high output value is earlier with respect to when the change would have occurred without one or more pull down branches being active. The magnitude of the time changes depends on how many of the one or more pull down branches are active, with a greater number of pull down branches causing a greater change of time. The modified pulse width of the square wave is input to inverter 2922. Inverter 2922 inverts the modified pulse width signal and outputs the delay clock signal.

Referring to FIG. 31, a timing diagram is depicted indicating the modification of the pulse width of the delay clock signal. Compared to the input sinusoidal wave, when one or more pull down branches is turned on, the delay clock signal changes from a low value to a high value at a time that corresponds to the input sinusoidal signal having a higher voltage than would otherwise have occurred, and the delay clock signal changes from high to low at a time that corresponds to the input sinusoidal signal having a higher voltage than would otherwise have prompted the change in the signal value.

FIG. 31 also shows that, compared to the REF clock signal, the delay clock signal is substantially the inverse of the REF clock signal, but that edges of the delay clock signal are offset from the edges of the REF clock signal. The time offset between the edges of the REF clock signal and the edges of the delay clock signal correspond to the change in the voltage threshold of inverter 2916 that are caused by pull down branches $M_{ni}$. As such, when comparator 2946 compares the REF clock signal and the delay clock signal, pulse injection signal INJ is generated, as shown in FIG. 31. The pulse width of the signal pulses of pulse injection signal INJ may correspond to the time delay that is caused by the change in the voltage threshold of inverter 2916 that is caused by activated pull down branches $M_{ni}$.

Circuit 2900 of FIG. 29 may generate a pulse signal that has two pulses per cycle of the sinusoidal signal generated by crystal oscillator 2902. For example, as shown in FIG. 31, circuit 2900 of FIG. 29 may generate a pulse signal INJ that has a high value pulse in each half cycle of the sinusoidal signal generated by crystal oscillator 2902. In some embodiments it may be preferred to generate a pulse signal that has only one pulse per cycle.

Figure 30:
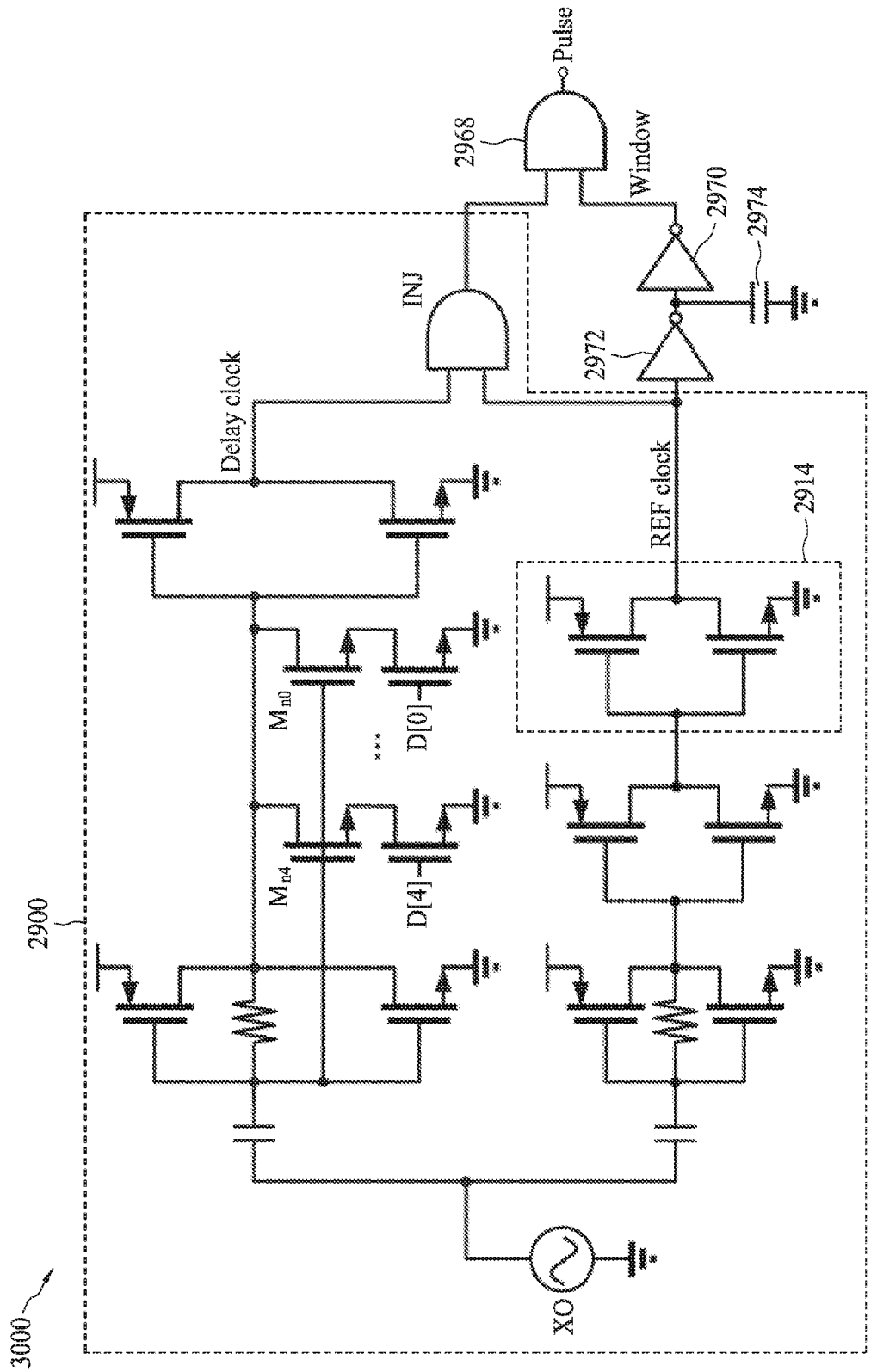
FIG. 30 is a pulse signal generator in accordance with one or more embodiments.

FIG. 30 depicts a circuit 3000 in which a comparator 2968 is used to modify circuit 2900 to generate a pulse signal that has only one pulse per cycle of the sinusoidal signal generated by crystal oscillator 2902. As shown in FIG. 30, the output of circuit 2900, pulse signal INJ, is connected to an input of comparator 2968. In some embodiments, comparator 2968 comprises an AND gate. The REF clock signal generated by inverter 2914 of circuit 2900 is connected to an input of buffer 2972. An output of buffer 2972 is connected to an input of buffer 2970. A capacitor 2974 is connected between the output of buffer 2972 and a ground node. An output of buffer 2970 is connected to an input of comparator 2968. The output buffer 2970 generates the window signal depicted in the timing diagram of FIG. 31.

As shown in FIG. 31, for every cycle of the sinusoidal signal, the window signal has a high value for a first pulse of the INJ signal and has a low value for a second pulse of the INJ signal. As such, when the window signal is compared to the INJ signal by comparator 2968, the first pulse of the INJ signal is passed through comparator 2968 and the second pulse is eliminated.

Figure 32:
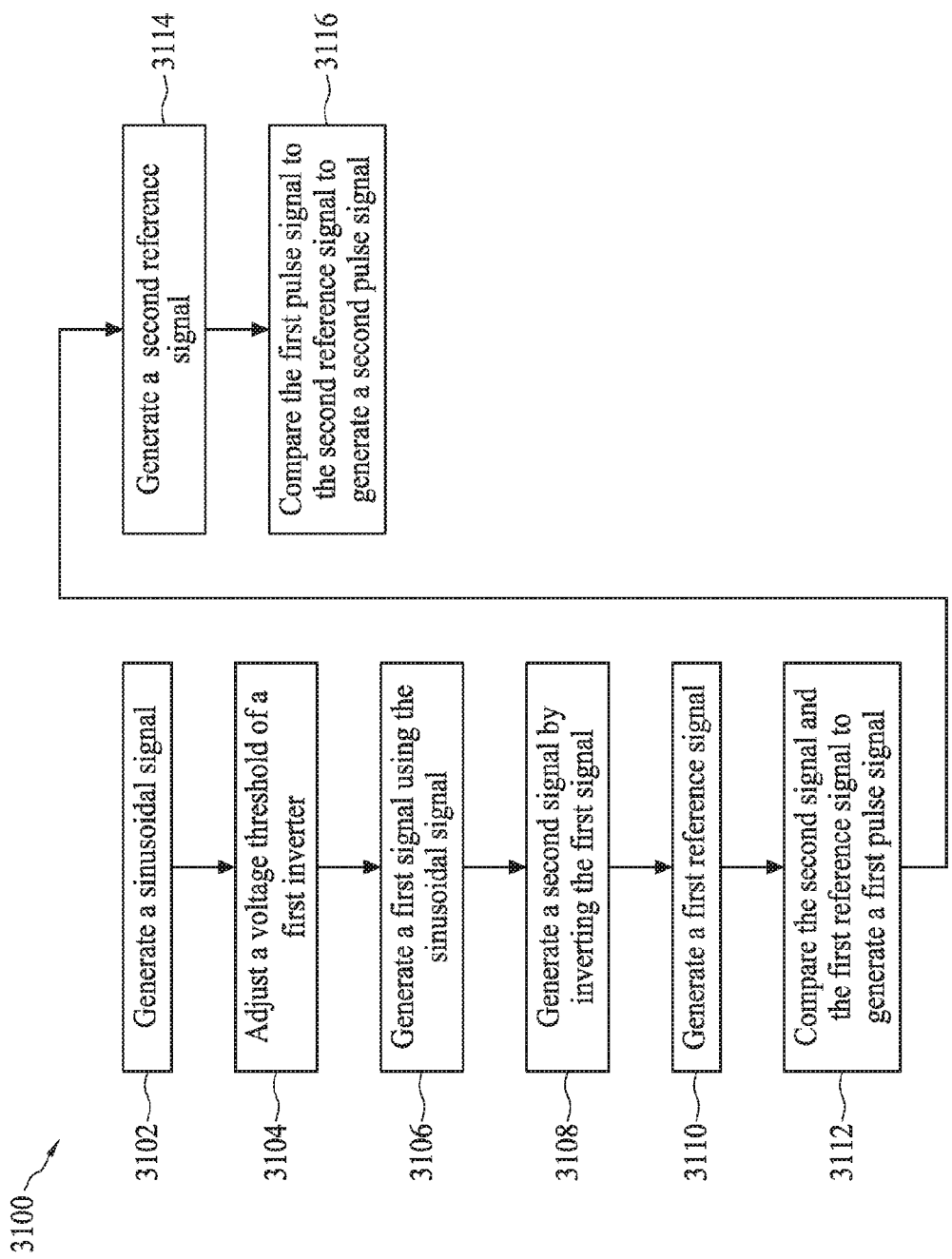
FIG. 32 is a flow chart of a method in accordance with one or more embodiments.

A method of operating circuit 2900 of FIG. 29 and/or circuit 3000 of FIG. 30 is depicted in FIG. 32. In step 3102, a sinusoidal signal is generated. For example, crystal oscillator 2902 of FIG. 29 may generate a sinusoidal signal. In step 3104, a voltage threshold of a first inverter is adjusted. For example, a voltage threshold of inverter 2916 of FIG. 29 may be adjusted by activating one or more pull down branches $M_{ni}$ using control signals D[0]-D[i]. In step 3106, a first signal is generated using the sinusoidal signal. For example, inverter 2916 may generate a first signal using the sinusoidal signal. In step 3108, a second signal is generated by inverting the first signal. For example, inverter 2922 of FIG. 29 may generate a second signal by inverting the second signal. In step 3110 a first reference signal is generated. For example, in FIG. 29 crystal oscillator 2902, second coupling capacitor 2906, and/or inverters 2910, 2912, and 2914 may generate a first reference signal. In step 3112 the second signal is compared to the first reference signal to generate a first pulse signal. For example, in FIG. 29 comparator 2946 may compare the second signal to the first reference signal to generate a first pulse signal. In step 3114 a second reference signal is generated. For example, in FIG. 30 a second reference signal is generated by buffers 2972 and 2970 and capacitor 2974. In step 3116 the first pulse signal is compared to the second reference signal to generate a second pulse signal. For example, in FIG. 30 comparator 2968 compares the first pulse signal to the second reference signal to generate a second pulse signal.

As described above, circuit 2900 generates a pulse injection signal INJ using a first signal having a programmable edge delay. Because of the first signal, circuit 2900 generates a pulse injection signal having a programmable pulse width that does not use any delay cell circuits. As such, noise may be reduced or eliminated.

In accordance with one embodiment, a circuit includes a coupling structure and a first inductive device. The coupling structure includes two or more conductive loops and a set of conductive paths electrically connecting the two or more conductive loops. The first inductive device is magnetically coupled with a first conductive loop of the two or more conductive loops.

In accordance with another embodiment, a circuit includes a first oscillator comprising an inductive device, a second oscillator comprising an inductive device, and a coupling structure. The coupling structure includes a first conductive loop magnetically coupled with the inductive device of the first oscillator, a second conductive loop magnetically coupled with the inductive device of the second oscillator, and a set of conductive paths electrically connecting the first conductive loop and the second conductive loop.

In accordance with another embodiment, a method includes generating an induced current at a first conductive loop of a coupling structure responsive to a first magnetic field generated by a first inductive device of a first oscillator. The induced current is transmitted to a second conductive loop of the coupling structure through a set of conductive paths of the coupling structure electrically connecting the first and second conductive loops. A second inductive device of a second oscillator is magnetically coupled with the first inductive device of the first oscillator through the coupling structure.

In accordance with yet another embodiment, a integrated circuit device comprising a first digital controlled oscillator and a second digital controlled oscillator coupled to the first digital controlled oscillator is provided. A skew detector is connected to outputs of both the first digital controlled oscillator and the second digital controlled oscillator, and a decoder connected to an output of the skew detector, wherein an output from the decoder is connected to a switch capacitor array within the first digital controlled oscillator.

In accordance with another embodiment, a integrated circuit device comprising a first digital controlled oscillator is provided. The first digital controlled oscillator comprises a first set of inductors, each one of the first set of inductors having a first inductance, and a second set of inductors, each one of the second set of inductors having a second inductance different from the first inductance, wherein individual ones of the first set of inductors are in series with individual ones of the second set of inductors. A switched capacitor array is connected between the first set of inductors and the second set of inductors, and an active feedback device is connected to one of the first set of inductors or the second set of inductors. A second digital controlled oscillator is coupled to the first digital controlled oscillator.

In accordance with yet another embodiment, a method comprising determining a first skew between a first clock signal and a second clock signal, the first clock signal originating from a first digital controlled oscillator, the second clock signal originating from a second digital controlled oscillator coupled to the first digital controlled oscillator is provided. A natural frequency of the first digital controlled oscillator is modified by sending a signal to a switched capacitor array within the first digital controlled oscillator, the signal being based on the first skew.

In accordance with another embodiment, an integrated circuit is provided. The integrated circuit includes an LC tank oscillator circuit. The integrated circuit also includes a positive pulse injector connected to a first output node of the LC tank oscillator circuit, the positive pulse injector configured to inject a positive reference signal into the LC tank oscillator circuit. The integrated circuit also includes a negative pulse injector connected to a second output node of the LC tank oscillator circuit, the negative pulse injector configured to inject a negative reference signal into the LC tank oscillator circuit. The negative reference signal is an inverse of the positive reference signal. In an embodiment the LC tank oscillator circuit comprises: a first inductor; a second inductor; a capacitor; and an active feedback device. In an embodiment the first inductor is connected to the first output node, the second inductor is connected to the second output node, and the capacitor is connected between the first output node and the second output node. In an embodiment the active feedback device is connected to a supply voltage. In an embodiment the active feedback device is connected to a ground node. In an embodiment the positive pulse injector comprises a Negative Metal Oxide Semiconductor (NMOS) transistor and the negative pulse injector comprises a Positive Metal Oxide Semiconductor (PMOS) transistor. In an embodiment he NMOS transistor comprises a drain terminal connected to the first output node, a gate terminal connected to the positive reference signal, and a source terminal connected to a ground node; and the PMOS transistor comprises a source terminal connected to a supply voltage, a gate terminal connected to the negative reference signal, and a drain terminal connected to the second output node. In an embodiment he LC tank oscillator circuit comprises: an inductor and a capacitor connected in parallel; a first active feedback device connected to a supply voltage; and a second active feedback device connected to a ground node.

In accordance with another embodiment, an integrated circuit is provided. The integrated circuit includes a signal generator and a first inverter connected to the signal generator through a first coupling capacitor. A reference signal generating circuit is connected to the signal generator through a second coupling capacitor, the reference signal generating signal being configured to generate a reference signal. The integrated circuit also includes a pull down block, comprising one or more pull down branches, where each pull down branch of the one or more pull down branches is connected to an output of the first inverter and to one or more programmable input signals, and where each pull down branch is configured to adjust a voltage threshold of the first inverter in response to the one or more programmable input signals to which the respective pull down branch is connected being activated. The integrated circuit also includes a second inverter, where an input of the second inverter is connected to the output of the first inverter. The integrated circuit also includes a first comparator configured to compare an output of the second inverter to the reference signal to generate a pulse signal. In an embodiment, the signal generator is configured to generate a sinusoidal signal, and wherein the first inverter outputs a square wave signal. In an embodiment the reference signal generating circuit comprises a plurality of inverters. In an embodiment the width of the pulses of the pulse signal correspond to the voltage threshold of the first inverter. In an embodiment the circuit further includes a second comparator, wherein the pulse nal is connected to an input of the second comparator. In an embodiment ch pull down branch of the one or more pull down branches comprises: a first transistor; and a second transistor; where the first transistor has a control terminal connected to an input of the first inverter; and where the second transistor has a control terminal connected to one of the one or more programmable input signals. In an embodiment the first comparator is an AND gate. In an embodiment the first inverter comprises a resistor connected between an input of the inverter and the output of the inverter.

In accordance with another embodiment a method is provided. The method includes generating, by a signal generator, a sinusoidal signal. The method also includes adjusting, by one or more programmable pull down branches, a voltage threshold of a first inverter. The method also includes generating, by the first inverter, a first signal using the sinusoidal signal, where the first signal is a square wave signal alternating between a low value and a high value, and where a time duration of the low values of the first signal depend at least in part on the adjusted voltage threshold of the first inverter. The method also includes generating a second signal by inverting the first signal. The method also includes generating a first reference signal. The method also includes generating a first pulse signal by comparing the second and the first reference signal. In an embodiment adjusting the voltage threshold of the first inverter comprises: activating, by one or more control signals, a set of the one or more programmable pull down branches, the set comprising a quantity of the one or more programmable pull down branches, the quantity being in a range of 1 to 5; wherein a magnitude of the adjustment of the voltage threshold of the first inverter is determined according the quantity of the one or more programmable pull down branches. In an embodiment generating the first reference signal comprises: inverting the sinusoidal signal to generate a third signal; inverting the third signal to obtain a fourth signal; and inverting the fourth signal to obtain the first reference signal. In an embodiment the method also includes generating a second reference signal using the first reference signal; and comparing the first pulse signal to the second reference signal to generate a second pulse signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
   a signal generator;
   a first inverter connected to the signal generator through a first coupling capacitor;
   a reference signal generating circuit connected to the signal generator through a second coupling capacitor, the reference signal generating signal being configured to generate a reference signal;
   a pull down block, comprising one or more pull down branches, wherein each pull down branch of the one or more pull down branches is connected to an output of the first inverter and to one or more programmable input signals, and wherein each pull down branch is configured to adjust a voltage threshold of the first inverter in response to the one or more programmable input signals to which the respective pull down branch is connected being activated;
   a second inverter, wherein an input of the second inverter is connected to the output of the first inverter;
   a first comparator, configured to compare an output of the second inverter to the reference signal to generate a pulse signal.

2. The integrated circuit according to claim 1, wherein the signal generator is configured to generate a sinusoidal signal, and wherein the first inverter outputs a square wave signal.

3. The integrated circuit according to claim 1, wherein the reference signal generating circuit comprises a plurality of inverters.

4. The integrated circuit according to claim 1, wherein a width of the pulses of the pulse signal correspond to the voltage threshold of the first inverter.

5. The integrated circuit according to claim 1, further comprising:
   a second comparator, wherein the pulse signal is connected to an input of the second comparator.

6. The integrated circuit according to claim 1, wherein each pull down branch of the one or more pull down branches comprises:
a first transistor; and
a second transistor;
wherein the first transistor has a control terminal connected to an input of the first inverter; and
wherein the second transistor has a control terminal connected to one of the one or more programmable input signals.

7. The integrated circuit according to claim 1, wherein the first inverter comprises a resistor connected between an input of the first inverter and the output of the first inverter.

8. The integrated circuit according to claim 1, wherein the output of the first comparator is connected to an input of a positive pulse injection circuit, and an output of the positive pulse injection circuit is connected to a first node of an LC tank oscillator circuit.

9. A method, comprising:
generating, by a signal generator, a sinusoidal signal;
adjusting, by one or more programmable pull down branches, a voltage threshold of a first inverter;
generating, by the first inverter, a first signal using the sinusoidal signal, wherein the first signal is a square wave signal alternating between a low value and a high value, and wherein a time duration of the low values of the first signal depend at least in part on the adjusted voltage threshold of the first inverter;
generating a second signal by inverting the first signal;
generating a first reference signal; and
generating a first pulse signal by comparing the second signal and the first reference signal.

10. The method according to claim 9, wherein adjusting the voltage threshold of the first inverter comprises:
activating, by one or more control signals, a set of the one or more programmable pull down branches, the set comprising a quantity of the one or more programmable pull down branches, the quantity being in a range of 1 to 5;
wherein a magnitude of the adjustment of the voltage threshold of the first inverter is determined according the quantity of the one or more programmable pull down branches.

11. The method according to claim 9, wherein generating the first reference signal comprises:
inverting the sinusoidal signal to generate a third signal;
inverting the third signal to obtain a fourth signal; and
inverting the fourth signal to obtain the first reference signal.

12. The method according to claim 9, further comprising:
generating a second reference signal using the first reference signal; and
comparing the first pulse signal to the second reference signal to generate a second pulse signal.

13. An integrated circuit, comprising:
a reference signal generator, configured to generate a reference signal;
a first inverter;
a pull down block, comprising one or more pull down branches, wherein each pull down branch of the one or more pull down branches is connected to an output of the first inverter and to one or more programmable input signals, and wherein each pull down branch of the one or more pull down branches is configured to adjust a voltage threshold of the first inverter in response to the one or more programmable input signals to which the respective pull down branch is connected being activated;
a second inverter, wherein an input of the second inverter is connected to the output of the first inverter and to each of the one or more pull down branches;
a comparator, configured to compare an output of the second inverter to the reference signal to generate a positive reference pulse signal;
an LC tank oscillator circuit;
a positive pulse injection circuit, wherein an output of the comparator is connected to an input of the positive pulse injection circuit, and an output of the positive pulse injection circuit is connected to a first node of the LC tank oscillator circuit; and
a negative pulse injection circuit, wherein an output of the negative pulse injection circuit is connected to a second node of the LC tank oscillator circuit, and wherein an input of the negative pulse injection circuit is configured to receive a negative reference signal, wherein the negative reference signal is an inverse of the positive reference pulse signal.

14. The integrated circuit according to claim 13, wherein the LC tank oscillator circuit comprises:
a first inductor;
a second inductor;
a capacitor; and
an active feedback device.

15. The integrated circuit according to claim 14, wherein the first inductor is connected to the first node, the second inductor is connected to the second node, and the capacitor is connected between the first node and the second node.

16. The integrated circuit according to claim 14, wherein the active feedback device is connected to a ground node.

17. The integrated circuit according to claim 13, wherein the comparator is an AND gate.

18. The integrated circuit according to claim 13, wherein the positive pulse injection circuit comprises a Negative Metal Oxide Semiconductor (NMOS) transistor and the negative pulse injection circuit comprises a Positive Metal Oxide Semiconductor (PMOS) transistor.

19. The integrated circuit according to claim 13, wherein the reference signal generator comprises a plurality of inverters.

20. The integrated circuit according to claim 13, wherein the LC tank oscillator circuit comprises:
an inductor and a capacitor connected in parallel;
a first active feedback device connected to a supply voltage; and
a second active feedback device connected to a ground node.

* * * * *